United States Patent
Koike et al.

(10) Patent No.: US 9,513,409 B2
(45) Date of Patent: Dec. 6, 2016

(54) FINE-STRUCTURE LAYERED PRODUCT, PREPARATION METHOD OF THE FINE-STRUCTURE LAYERED PRODUCT AND MANUFACTURING METHOD OF A FINE-STRUCTURE PRODUCT

(75) Inventors: Jun Koike, Tokyo (JP); Ryuichi Ito, Tokyo (JP); Fujito Yamaguchi, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 736 days.

(21) Appl. No.: 13/992,581

(22) PCT Filed: Dec. 8, 2011

(86) PCT No.: PCT/JP2011/078374
§ 371 (c)(1),
(2), (4) Date: Aug. 27, 2013

(87) PCT Pub. No.: WO2012/077738
PCT Pub. Date: Jun. 14, 2012

(65) Prior Publication Data
US 2013/0319522 A1    Dec. 5, 2013

(30) Foreign Application Priority Data

Dec. 9, 2010 (JP) .................. 2010-274605
Dec. 9, 2010 (JP) .................. 2010-274606
Dec. 9, 2010 (JP) .................. 2010-274935
Dec. 17, 2010 (JP) .................. 2010-282061
Jan. 13, 2011 (JP) .................. 2011-004869

(51) Int. Cl.
*G02B 1/10*    (2015.01)
*H01L 31/0236*    (2006.01)
*C23C 18/12*    (2006.01)

(52) U.S. Cl.
CPC ............. *G02B 1/105* (2013.01); *C23C 18/122* (2013.01); *C23C 18/1216* (2013.01);
(Continued)

(58) Field of Classification Search
CPC ............ H01L 31/02366; G02B 1/105; Y10T 428/24537; C23C 18/122; C23C 18/1233; C23C 18/1245; C23C 18/1216
See application file for complete search history.

(56) References Cited

U.S. PATENT DOCUMENTS 4,310,370 A * 1/1982 Arai .................... B32B 3/28
                                       156/219
5,614,287 A * 3/1997 Sekiya ................ G11B 7/0938
                                       369/13.35

(Continued)

FOREIGN PATENT DOCUMENTS

EP    2 116 350 A1    11/2009
EP    2172433 A1    4/2010
(Continued)

OTHER PUBLICATIONS

Supplementary European Search Report for European Application No. 11846133.4 dated Apr. 2, 2014.
(Continued)

*Primary Examiner* — Golam Mowla
(74) *Attorney, Agent, or Firm* — Birch, Stewart, Kolasch & Birch, LLP

(57) ABSTRACT

To provide a fine-structure layered product, and a preparation method of a fine-structure layered product using the fine-structure layered product for enabling a fine concavo-convex structure excellent in environmental resistance, weather resistance and long-term stability to be formed with a large area and high productivity, and provide a manufacturing method of a fine-structure product for enabling a large area to be made with high productivity, a fine-structure layered product of the invention is provided with a substrate, a resin layer that is formed on one main surface of the substrate and that has a fine concavo-convex structure on its surface, and an inorganic layer that is provided on the fine concavo-convex structure of the resin layer and that contains a sol-gel material having a fine concavo-convex structure in a shape associated with the fine concavo-convex structure of the resin layer, where a fluorine element concentration (Es) in a region on the inorganic layer side of the resin layer is higher than an average fluorine concentration (Eb) in the resin layer.

23 Claims, 14 Drawing Sheets

(52) U.S. Cl.
CPC ...... *C23C 18/1233* (2013.01); *C23C 18/1245* (2013.01); *H01L 31/02366* (2013.01); *Y02E 10/50* (2013.01); *Y10T 428/24537* (2015.01)

(56) References Cited

U.S. PATENT DOCUMENTS

| | | | |
|---|---|---|---|
| 6,280,861 B1 * | 8/2001 | Hosokawa | H01L 51/5206 257/91 |
| 6,446,933 B1 * | 9/2002 | Westmoreland | B29C 33/56 106/38.27 |
| 7,006,291 B2 * | 2/2006 | Hori | G02B 1/041 359/580 |
| 7,143,609 B2 | 12/2006 | Aitken et al. | |
| 7,589,897 B2 * | 9/2009 | Kameshima | G02B 1/105 359/599 |
| 8,081,385 B2 * | 12/2011 | Matsumura | G02B 1/105 359/599 |
| 8,586,181 B2 * | 11/2013 | Takanashi | H01L 31/048 428/347 |
| 2002/0050287 A1 * | 5/2002 | Yamada | B32B 17/10 136/251 |
| 2003/0011315 A1 | 1/2003 | Ito et al. | |
| 2005/0023433 A1 | 2/2005 | Ishitaka et al. | |
| 2005/0258570 A1 | 11/2005 | Kong et al. | |
| 2010/0092727 A1 | 4/2010 | Uchida | |

FOREIGN PATENT DOCUMENTS

| | | |
|---|---|---|
| EP | 2 546 041 A1 | 1/2013 |
| JP | 2005-47080 A | 2/2005 |
| JP | 2005-339884 A | 12/2005 |
| JP | 2006-504609 A | 2/2006 |
| JP | 2008-503364 A | 2/2008 |
| JP | 2008-162190 A | 7/2008 |
| JP | 2009-45925 A | 3/2009 |
| JP | 2010-52408 A | 3/2010 |

OTHER PUBLICATIONS

International Search Report issued in PCT/JP2011/078374, mailed on Mar. 27, 2012.

* cited by examiner

FINE-STRUCTURE LAYERED PRODUCT, PREPARATION METHOD OF THE FINE-STRUCTURE LAYERED PRODUCT AND MANUFACTURING METHOD OF A FINE-STRUCTURE PRODUCT

TECHNICAL FIELD

The present invention relates to a fine-structure layered product used in formation of a fine concavo-convex structure, and a preparation method of a fine-structure layered product using the fine-structure layered product.

BACKGROUND ART

Conventionally, as fine pattern processing techniques in LSI manufacturing, photolithography techniques have been used frequently. However, in photolithography techniques, there is a problem that it is difficult to perform processing on a pattern less than or equal to a wavelength of light used in exposure. As other fine pattern processing techniques, there are mask pattern lithography techniques (EB method) with electron beam lithography apparatuses. However, in the EB method, since a mask pattern is directly drawn using an electron beam, there is a problem that the drawing time increases as the drawing patterns increase, and that throughput up to pattern formation extremely decreases. Further, due to high-precision control of a mask position in an exposure apparatus for photolithography, increases in the size of the electron beam lithography apparatus in an exposure apparatus for the EB method, and the like, there is also a problem that using these methods makes the apparatus cost high.

As fine pattern (concavo-convex structure) processing techniques capable of solving the problems, the nanoimprint technique is known. The nanoimprint technique is a technique of pressing a mold with a fine concavo-convex structure formed against a resist film formed on a surface of a transfer-target substrate, and thereby transfering the fine concavo-convex structure formed on the mold to the surface of the transfer-target substrate (Patent Document 1). The mold used in the nanoimprint technique is obtained by processing a quartz substrate by a method such as the electron beam lithography method. In the nanoimprint technique, it is possible to form the fine structure of the nano-level repeatedly with ease once the mold is prepared, and it is thereby possible to actualize high throughput. Further, the technique eliminates the need of expensive apparatuses such as the exposure apparatus for photolithography and the EB exposure apparatus, and is economical. From such reasons, it has been considered application of the nanoimprint technique to various fields.

Further, by using the nanoimprint technique, proposed is a method of forming a fine concavo-convex structure made of an inorganic material on a surface of an inorganic substrate such as glass excellent in environmental resistance and weather resistance (Patent Document 1). In the method as described in Patent Document 1, for example, glass is heated to near the softening point, and is pressed against a die at a pressure of several-hundred N/cm$^2$ or more in a vacuum, and the fine concavo-convex structure is thereby formed on the glass surface. However, such a method requires a die enduring high-temperature pressurization conditions and the nanoimprint process including the heat cool process. Therefore, a large facility is required, and such a problem occurs that the cycle time is long.

Therefore, proposed is a method of forming a ceramic fine-particle slurry layer on a substrate, pressing a mold to transfer a concavo-convex structure, and then, separating the mold (Patent Document 2, Patent Document 3). However, in this method, since the mold is pressed against the ceramic fine-particle slurry and baked, many asperities derived from fine particles are formed on the surface subjected to baking. Therefore, in the method, it is difficult to form a fine concavo-convex structure accurately reflecting the fine concavo-convex structure of the mold. Further, since it is necessary to use a rigid body such as a silicone mold as the mold, there is also the problem with uniform transfer characteristics to a larger area.

Further, proposed is a method of forming a layer of an inorganic hardened product on a surface of a fluorine-containing polymer mold having a fine concavo-convex structure, separating the mold from the inorganic hardened product in a hardening precursor state, then hardening the inorganic hardened product in the hardening precursor state, and obtaining the fine concavo-convex structure (Patent Document 4). However, in this method, since it is necessary to use a large amount of fluorine-containing resin that is expensive to enhance release properties between the inorganic hardened product and the mold, there is a problem of being poor in economy. Further, thermal transfer should be used in formation of the fine concavo-convex structure to the fluorine-containing polymer mold due to properties of the material, and large thermal shrinkage becomes a problem in transferring to a large area. Furthermore, transfer to the inorganic hardened product is of a batch type, and the method is also inferior in production efficiency.

PRIOR ART DOCUMENT

Patent Document

[Patent Document 1] Japanese Unexamined Translated Patent Publication No. 2006-504609
[Patent Document 2] Japanese Unexamined Patent Publication No. 2005-339884
[Patent Document 3] Japanese Unexamined Patent Publication No. 2010-52408
[Patent Document 4] Japanese Unexamined Patent Publication No. 2008-162190

DISCLOSURE OF INVENTION

Problems to be Solved by the Invention

Thus, in the conventional techniques, it is difficult to provide an inorganic fine-structure product excellent in environmental resistance, weather resistance and long-term stability with a large area and high productivity. The present invention was made in view of the respect, and it is an object of the invention to provide a fine-structure layered product, and a preparation method of a fine-structure layered product using the fine-structure layered product for enabling a fine concavo-convex structure excellent in environmental resistance, weather resistance and long-term stability to be formed with a large area and high productivity. Further, it is another object to provide a manufacturing method of a fine-structure product for enabling a large area to be made with high productivity.

Means for Solving the Problem

A fine-structure layered product of the invention is characterized by comprising a substrate, a resin layer that is formed on one main surface of the substrate and that has a fine concavo-convex structure on a surface thereof, and an inorganic layer that is provided on the fine concavo-convex structure of the resin layer and that contains a sol-gel material having a fine concavo-convex structure in a shape associated with the fine concavo-convex structure of the resin layer, where a fluorine element concentration (Es) in a region on the inorganic layer side of the resin layer is higher than an average fluorine concentration (Eb) in the resin layer.

A preparation method a fine-structure layered product of the invention is a preparation method of a fine-structure layered product using the above-mentioned fine-structure layered product, and is characterized by having the steps of placing an inorganic substrate on a surface on the side opposite to a fine concavo-convex structure of the inorganic layer via an adhesion layer including a sol-gel material to heat, removing the resin layer and the substrate, and hardening the adhesion layer including the sol-gel material.

A manufacturing method of a fine-structure layered product of the invention is a manufacturing method of a fine-structure product provided with an inorganic material layer, and an inorganic layer that is layered on the inorganic material layer, that contains a sol-gel material and that has a fine concavo-convex structure on a surface thereof, and is characterized by having a mold preparation step of preparing a reel-shaped mold provided with a light transmissive substrate and a light cross-linkable resin layer that is provided on the substrate and that has a fine concavo-convex structure on a surface thereof, an inorganic layer formation step of applying a sol-gel material onto the light cross-linkable resin layer of the reel-shaped resin mold to form an inorganic layer, a preliminary hardening step of preliminarily hardening the inorganic layer, a layering step of providing the inorganic material layer on the inorganic layer to form a layered product for a fine-structure product, a transfer step of peeling off the layered product from the reel-shaped resin mold and transferring the fine concavo-convex structure to the inorganic layer, and a complete hardening step of completely hardening the inorganic layer of the peeled layered product to obtain a fine-structure product.

Advantageous Effect of the Invention

According to the invention, it is an object to provide a fine-structure layered product, and a preparation method of a fine-structure layered product using the fine-structure layered product for enabling a fine concavo-convex structure excellent in environmental resistance, weather resistance and long-term stability to be formed with a large area and high productivity. Further, it is another object to provide a manufacturing method of a fine-structure product for enabling a large area to be made with high productivity.

DESCRIPTION OF EMBODIMENTS

Figure 1A:
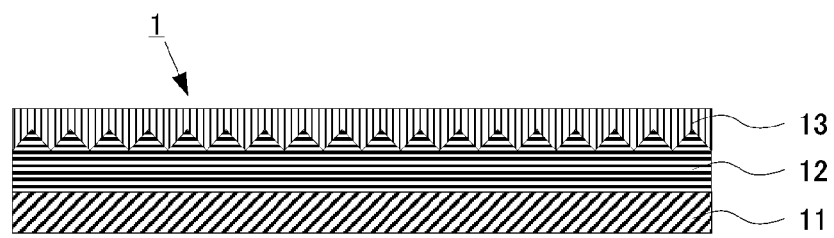
FIG. 1 contains a section schematic view showing an example of a fine-structure layered product according to a first aspect.

The inventors of the present invention conceived providing a concavo-convex structure on the surface of an inorganic layer containing a sol-gel material in forming a fine concavo-convex structure by the nanoimprint technique. Then, the inventors of the invention found out that it is possible to form a fine-structure layered product and fine-structure product provided with the fine concavo-convex structure mainly formed of an inorganic material excellent in environmental resistance, weather resistance and long-term stability with a large area and high productivity, and arrived at completion of the invention.

Herein, in the invention, the fine-structure layered product and fine-structure product have an inorganic layer that contains a sol-gel material and that is provided on its surface with a fine concavo-convex structure. The fine-structure layered product is provided with at least one inorganic layer described above and another layer layered on the inorganic layer. Further, for example, the fine-structure product is obtained by transferring a fine concavo-convex structure to the inorganic layer containing the sol-gel material with a mold having the fine concavo-convex structure on its surface. A first aspect and second aspect of the invention will specifically be described below with reference to accompanying drawings.

<First Aspect>

The inventors of the invention found out it is possible to achieve a fine-structure layered product that is excellent in environmental resistance, weather resistance and long-term stability and that enables a large area to be made by providing a concavo-convex structure on the surface of an inorganic layer containing a sol-gel material in a fine-structure layered product provided with a resin layer and an inorganic material layer that is provided on the resin layer and that has a fine concavo-convex structure on its surface. Further, the inventors found out that it is possible to make separation between the resin layer and the inorganic layer ease and thereby enhance productivity of the fine-structure layered product, by increasing the fluorine element concentration in a region on the inorganic layer side in the resin layer.

Namely, the gist of the first aspect of the invention is a fine-structure layered product provided with a substrate, a resin layer that is formed on one main surface of the substrate and that has a fine concavo-convex structure on its surface, and an inorganic layer that is provided on the fine concavo-convex structure of the resin layer, that contains a sol-gel material and that having a fine concavo-convex structure in a shape associated with the fine concavo-convex structure of the resin layer, where a fluorine element concentration ($Es$) in a region on the inorganic layer side of the resin layer is higher than an average fluorine concentration ($Eb$) in the resin layer.

According to this configuration, by separating the resin layer and the inorganic layer containing the sol-gel material, it is possible to form a fine concavo-convex structure mainly formed of an inorganic material excellent in environmental resistance, weather resistance and long-term stability. Further, since the inorganic layer is formed by a sol-gel method, it is possible to form the fine concavo-convex structure of a large area with high productivity. Furthermore, since the fluorine element concentration is increased in the region on the inorganic side of the resin layer, separation between the resin layer and the inorganic layer is made ease, and it is possible to enhance productivity of the fine concavo-convex structure. In other words, by using this configuration, it is made possible to form the concavo-convex structure excellent in environmental resistance, weather resistance and long-term stability with a large area and high productivity.

Figure 1B:
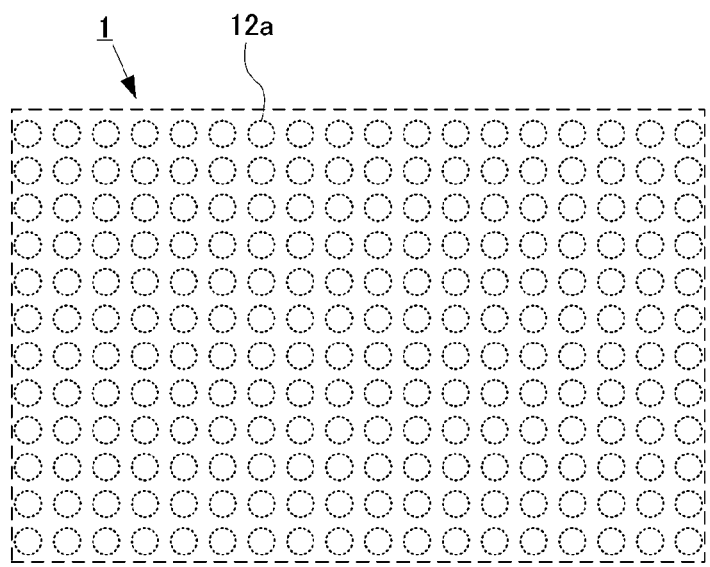
Figure 1C:
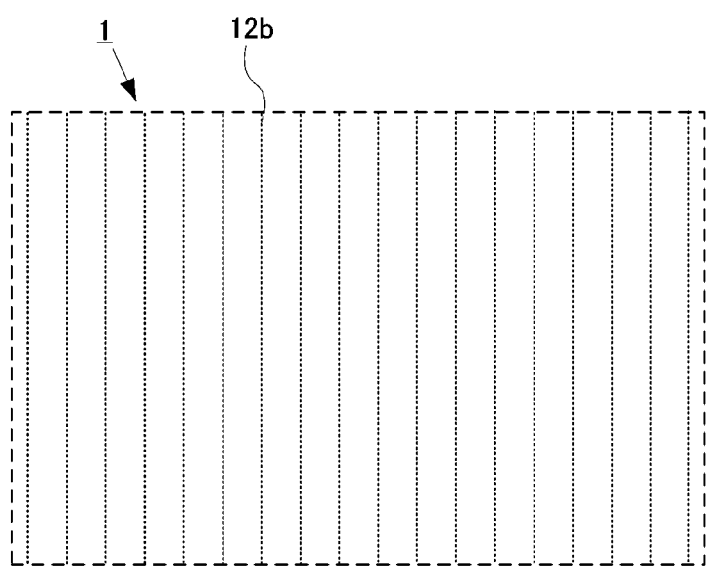

The first aspect of the invention will specifically be described below. FIG. 1 contains schematic views showing a plane structure and section structure of a fine-structure layered product 1 according to the first aspect of the invention. FIG. 1A shows an example of the section structure of the fine-structure layered product 1 according to this Embodiment. FIG. 1B shows an example of the plane structure of the fine-structure layered product 1 according to this Embodiment. Further, FIG. 1C shows another example of the plane structure of the fine-structure layered product 1.

As shown in FIG. 1A, the fine-structure layered product 1 according to this Embodiment is provided with a substrate 11, a resin layer 12 that is provided on main surface of the substrate 11 and that has a fine concavo-convex structure, and an inorganic layer 13 provided on the resin layer 12. On the surface on the resin layer 12 side of the inorganic layer 13 is formed a fine concavo-convex structure associated with the fine concavo-convex structure of the resin layer 12. Although the inorganic layer 13 will specifically be described later, it is possible to use the layer containing one of a hardened sol-gel material layer (hardened material layer of the sol-gel material), semi-hardened sol-gel material layer, inorganic fine-particle layer and inorganic material layer. When the hardened sol-gel material layer is used as the inorganic layer 13, the upper surface (on the surface on the side opposite to the resin layer 12) of the inorganic layer 13 is flattened.

Further, as shown in FIG. 1B, a plurality of regions 12a (regions corresponding to concave portions of the inorganic layer 13) corresponding to convex portions exist in the resin layer 12. In addition, the plane structure of the fine-structure layered product 1 is not limited thereto. For example, as shown in FIG. 1C, the structure may be a configuration such that vertexes 12b of the convex portions of the resin layer 12 (bottoms of the concave portions of the inorganic layer 13) extend in parallel with one another.

In addition, FIG. 1A shows the fine-structure layered product 1 in the shape of a plate, but the fine-structure layered product 1 according to this Embodiment is not limited to the shape of a plate. For example, the product may be in the shape (hereinafter, referred to as the shape of a reel, the shape of a roll, or the like) in which the product is wound in the shape of a cylinder.

[Substrate]

As the substrate 11, it is possible to use various kinds of substrates capable of being used in UV nanoimprint uses. Herein, the nanoimprint or nanoimprint process is assumed to mean a technique for using a mold having a fine concavo-convex structure of the size ranging from several nanometers to tens of micrometers, and transferring the fine concavo-convex structure of the mold to the resist layer. Particularly, the UV nanoimprint is assumed to mean a technique for using an active energy beam such as visible light and UV light in hardening the resist layer among nanoimprint.

As the substrate 11, it is possible to use, for example, inorganic substrates such as quartz, glass, metal, silicon and ceramic and resin substrates. Examples of materials used in the resin substrates are amorphous thermoplastic resins such as polyvinyl alcohol resin, polyacrylonitrile resin, polymethacrylate methyl resin, polycarbonate resin, polystyrene resin, cycloolefin resin (COP), crosslinked polyethylene resin, polyvinyl chloride resin, polyvinyl chloride copolymer resin, polyvinylidene chloride resin, polyvinylidene chloride copolymer resin, polyallylate resin, polyphenylene ether resin, modified polyphenylene ether resin, polyether imide resin, polyether sulfone resin, polysulfone resin, and polyether ketone resin, crystalline thermoplastic resins such as polyethylene terephthalate (PET) resin, polyethylene naphthalate resin, polyethylene resin, polypropylene resin, polybutylene terephthalate resin, aromatic polyester resin, polyacetal resin, polyamide resin, and polyimide resin, and acrylic, epoxy and urethane ultraviolet (UV)-curable resins and thermosetting resins. Further, as the substrate 11, complex substrates may be used which are obtained by combining the UV-curable resin or thermosetting resin with inorganic substrate such as glass, the above-mentioned thermoplastic resin, triacetate resin, and the like.

The shape of the substrate 11 is not particularly limited. It is possible to use substrates 11 in various kinds of shapes such as the shape of a plate, the shape of a roll and the shape of a reel. In addition, with consideration given to application to roll-to-roll production, the shape of the substrate 11 is preferably the shape of a roll or the shape of a reel.

[Resin Layer]

The fine concavo-convex structure is formed on the upper surface (surface on the side opposite to the substrate 11) of the resin layer 12. The fine concavo-convex structure is in a correspondence with the fine concavo-convex structure of the inorganic layer 13. Convex portions of the fine concavo-convex structure of the resin layer 12 correspond to concave portions of the fine concavo-convex structure of the inorganic layer 13, and concave portions of the fine concavo-convex structure of the resin layer 12 correspond to convex portions of the fine concavo-convex structure of the inorganic layer 13. The reason why such a correspondence is obtained is that the inorganic layer 13 is obtained by hardening a sol-gel material layer after forming the sol-gel material layer to come into contact with the resin layer 12. Therefore, the almost complete correspondence exists between the fine concavo-convex structure of the resin layer 12 and the fine concavo-convex structure of the inorganic layer 13. Herein, the almost complete correspondence refers to a range in which the volume of the fine concavo-convex structure of the inorganic layer 13 ranges from 0% to 20% of the volume of the fine concavo-convex structure of the resin layer 12.

Further, in the resin layer 12, the fluorine element concentration (Es) in the region on the inorganic layer 13 side is higher than the average fluorine concentration (Eb) in the resin forming the resin layer 12. Herein, for example, the region on the inorganic layer 13 side of the resin layer 12 means a portion coming in the thickness direction by approximately 1% to 10% or portion coming in the thickness direction by 2 nm to 20 nm, from the surface on the inorganic layer 13 side of the resin layer 12 toward the substrate 11. In addition, it is possible to quantify the fluorine element concentration (Es) in the region on the inorganic layer 13 side of the resin layer 12 by the XPS method. The penetration length of X-ray in the XPS method is several nanometers, is thus shallow, and therefore, is suitable for quantification of the Es value. As another analysis technique, it is also possible to calculate Es/Eb using the energy dispersive X-ray spectroscopy using a transmission electron microscope (TEM-EDX). Further, it is possible to calculate the average fluorine concentration (Eb) in the resin forming the resin layer 12 based on charge-in quantity. Furthermore, it is possible to measure the average fluorine concentration (Eb) by gas chromatography-mass spectrometer (GC/MS). For example, by peeling off the resin layer 12 physically to apply to gas chromatography-mass spectroscopy, it is possible to identify the average fluorine element concentration.

In addition, also by decomposing a slice obtained by physically peeling off the resin layer 12 by the flask combustion method, and subsequently applying to ion chromatography analysis, it is possible to identify the average fluorine element concentration (Eb) in the resin forming the resin layer 12.

In order to make separation between the resin layer 12 and the inorganic layer 13 ease while enhancing accuracy of transfer of the fine concavo-convex structure to the inorganic layer 13, it is preferable to increase strength of adhesion between the resin layer 12 and the substrate 11, while decreasing strength of adhesion between the resin layer 12 and the inorganic layer 13.

By making the fluorine concentration in the region on the inorganic layer 13 side of the resin layer 12 higher than the average fluorine concentration (Eb) of the resin layer 12, free energy in the interface on the inorganic layer 13 side of the resin layer 12 becomes low. Therefore, the release properties between the resin layer 12 and the inorganic layer 13 are improved. Further, since free energy does not become low near the substrate 11, adhesion between the substrate 11 and the resin layer 12 is improved, as a result the release properties between the resin layer 12 and the inorganic layer 13 are improved to make transfer ease with high accuracy, and it is thereby possible to obtain the inorganic layer 13 provided with the fine concavo-convex structure.

From the viewpoint of ensuring sufficient release properties, it is preferable that the ratio between the fluorine element concentration (Es) in the region on the inorganic layer 13 side and the average fluorine concentration (Eb) in the resin forming the resin layer 12 meets following equation (1).

$$1 < Es/Eb \leq 30{,}000 \qquad (1)$$

Further, when the ratio is in the range of $1 < Es/Eb \leq 20{,}000$, since it is possible to reduce the usage amount of fluorine components, the range is more preferable. The range of $3 \leq Es/Eb \leq 10{,}000$ is further preferable. Further, since the release properties are improved, the range of $5 \leq Es/Eb \leq 10{,}000$ is more preferable, and the range of $10 \leq Es/Eb \leq 10{,}000$ is further preferable. Furthermore, since it is possible to form a region with the high content of fluorine on the surface while decreasing the usage amount of fluorine, the range of $10 \leq Es/Eb \leq 8{,}000$ is more preferable, and the range of $20 \leq Es/Eb \leq 8{,}000$ is further preferable. When the ratio is in the range of $20 \leq Es/Eb \leq 1{,}000$, since transfer accuracy is further improved, the range is preferable. When the ratio is in the range of $20 \leq Es/Eb \leq 500$, since stability of the resin layer 12 and hardened sol-gel material layer 13 is further improved, the range is preferable. Further, when the ratio is in the range of $20 \leq Es/Eb \leq 240$, since it is possible to achieve high adhesion between the resin layer and the substrate and low adhesion between the resin layer and the inorganic layer at the same, the range is particularly preferable.

The fine concavo-convex structure formed in the resin layer 12 of the present invention is preferably in the shape of pillars including a plurality of convex portions in the shape of a cone, the shape of a pyramid or the shape of an elliptic cone, or in the shape of holes including a plurality of concave portions in the shape of a cone, the shape of a pyramid or the shape of an elliptic cone. Herein, "the shape of pillars" is "the shape in which a plurality of pillar-shaped bodies (cone state) is disposed", and "the shape of holes" is "the shape in which a plurality of pillar-shaped (cone state) holes is formed". Further, in the concavo-convex structure, it is preferable that the distance between convex portions ranges from 1 nm to 2,000 nm, and that the height of the convex portion ranges from 1 nm to 5,000 nm. In such a structure, it is possible to suppress reflectance and increase transmittance in the visible-light region (400 nm to 780 nm) or near-infrared region (700 nm to 1,000 nm), and therefore, the structure is preferable.

Materials for the resin layer 12 are not particularly limited, as long as the materials enable the fine concavo-convex structure to be achieved suitably, and for example, it is possible to use photopolymerizable materials, thermoplastic resins and the like.

<Photopolymerizable Mixture>

As photopolymerizable materials to be materials of the resin layer 12, it is preferable to use a mixture of (meth)acrylate, fluorine-containing (meth)acrylate and a photoinitiator that is a photopolymerizable mixture. Herein, (meth)acrylate means acrylate or methacrylate. Further, a silane coupling agent and silsesquioxane may be added to the photopolymerizable mixture. This is because durability of the resin layer 12 is improved by adding the silane coupling agent and silsesquioxane. Further, the resin layer 12 preferably contains a hardened material of the photopolymerizable mixture formed by UV nanoimprint.

In addition, the photopolymerizable mixture may contain a photosensitizer. Specific examples of the photosensitizer are amines such as n-butylamine, di-n-butylamine, tri-n-butylphosphine, allylthiourea, s-benzyl isothiuronium-p-toluenesulfinate, triethylamine, diethylaminoethyl methacrylate, triethylenetetramine, 4,4'-bis(dialkylamino)benzophenone, N,N-dimethylamino benzoic acid ethyl ester, N,N-dimethylamino benzoic acid isoamyl ester, pentyl-4-dimethylamino benzoate, triethylamine, and triethanolamine. Further, it is possible to use such photosensitizers alone or in combination of two kinds or more.

Further, in the photopolymerizable mixture, when the content of fluorine-containing (meth)acrylate ranges from 0.01 part by mass to 50 parts by mass relative to 100 parts by mass of (meth)acrylate, the release properties are excellent, and the content is preferable. The content ranging from 0.1 part by mass to 20 parts by mass enables the release properties and adhesion to the substrate to be achieved at the same, and is more preferable. The content ranging from 0.1 part by mass to 15 parts by mass is further preferable. The content ranging from 0.1 part by mass to 5 parts by mass provides excellent dispersion properties of fluorine-containing (meth)acrylate and is preferable, and the content ranging from 0.5 part by mass to 5 parts by mass provides improvements in durability to repetitive transfer and is more preferable. Further, in the photoinitiator, the content of 0.01 part by mass or more relative to 100 parts by mass of (meth) acrylate provides excellent polymerizability, the content of 10 parts by mass or less enables bleedout of an unreacted initiator and decomposed substance to the resin surface after hardening to be reduced, and particularly, the content ranging from 0.5 part by mass to 5 parts by mass provides excellent resin transmittance after hardening.

When the photopolymerizable mixture contains a solvent, the content ranging from 0.1 part by mass to 40 parts by mass relative to 100 parts by mass of (meth)acrylate provides improvements in the dispersion properties of fluorine-containing (meth)acrylate, and is preferable. The content ranging from 0.5 part by mass to 20 parts by mass provides good hardening properties of the photopolymerizable mixture, and is preferable. Further, the content ranging from 1 part by mass to 15 parts by mass provides excellent repetitive transfer properties, and is more preferable.

<(Meth)acrylate>

The (meth)acrylate used in the photopolymerizable mixture is not limited as long as the (meth)acrylate is polymerizable monomers, and the monomers are preferably monomers having an acryloyl group or a methacryloyl group, monomers having a vinyl group, and monomers having an allyl group. The monomers having an acryloyl group or a methacryloyl group are more preferable. Further, polymerizable monomers are preferably polyfunctional monomers provided with a plurality of polymerizable groups, and the number of polymerizable groups is preferably an integer of from 1 to 4 in terms of excellent polymerizable properties. Furthermore, in the case of mixing two kinds of polymerizable monomers or more to use, the average number of polymerizable groups is preferably 1 to 3. In the case of using a single kind of monomers, to increase the crosslinking points after polymerization reaction to obtain physical stability (strength, heat resistance, etc.) of the hardened material, the monomers are preferably monomers with the number of polymerizable groups being 3 or more. Still furthermore, in the case of monomers with the number of polymerizable groups being 1 or 2, it is preferable to use the monomers together with monomers with the different number of polymerizable groups.

Examples of monomers having an acryloyl group or a methacryloyl group are (meth)acrylic acids, aromatic (meth) acrylates [phenoxyethyl acrylate, benzyl acrylate, etc.], hydrocarbon (meth)acrylates [stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, etc.], ethereal oxygen atom-containing hydrocarbon (meth)acrylates [ethoxyethyl acrylate, methoxyethyl acrylate, glycidyl acrylate, tetrahydrofurfuryl acrylate, diethylene glycol diacrylate, neopentylglycol diacrylate, polyoxyethylene glycol diacrylate, tripropylene glycol diacrylate, etc.], functional group-containing hydrocarbon (meth)acrylates [2-hydroxyethyl acrylate, 2-hydroxypropyl acrylate, 4-hydroxybutyl vinyl ether, N,N-diethylamino ethyl acrylate, N,N-dimethylamino ethyl acrylate, N-vinyl pyrolidone, (dimethylamino)ethyl methacrylate, etc.], and silicone acrylates. Further, other samples are EO-modified glycerol tri(meth)acrylate, ECH-modified glycerol tri(meth)acrylate, PO-modified glycerol tri(meth) acrylate, pentaerythritol triacrylate, EO-modified phosphoric acid triacrylate, trimethylolpropane tri(meth)acrylate, caprolactone-modified trimethylolpropane tri(meth)acrylate, PO-modified trimethylolpropane tri(meth)acrylate, tris (acryloxyethyl)isocyanurate, EO-modified trimethylolpropane tri(meth)acrylate, dipentaerythritol hexa(meth) acrylate, caprolactone-modified dipentaerythritol hexa (meth)acrylate, dipentaerythritol hydroxy penta(meth) acrylate, alkyl-modified dipentaerythritol penta(meth) acrylate, dipentaerythritol poly(meth)acrylate, ditrimethylol propane tetra(meth)acrylate, alkyl-modified dipentaerythritol tri(meth)acrylate, pentaerythritol ethoxy tetra(meth)acrylate, pentaerythritol tetra(meth)acrylate, di(ethylene glycol) monoethyl ether (meth)acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, acryloxy polyethylene glycol acrylate, 1,9-nonanediol di(meth)acrylate, EO-modified bisphenol A di(meth)acrylate, PO-modified bisphenol A di(meth)acrylate, modified-bisphenol A di(meth)acrylate, EO-modified bisphenol F di(meth)acrylate, ECH-modified hexahydrophthalic acid diacrylate, neopentyl glycol di(meth)acrylate, hydroxy pivalic acid neopentyl glycol di(meth)acrylate, EO-modified neopentyl glycol diacrylate, PO-modified neopentyl glycol diacrylate, caprolactone-modified hydroxy pivalic acid ester neopentyl glycol, stearic acid-modified pentaerythritol di(meth)acrylate, ECH-modified propylene glycol di(meth)acrylate, ECH-modified phthalic acid di(meth)acrylate, polyethylene glycol-tetramethylene glycol) di(meth)acrylate, poly(propylene glycol-tetramethylene glycol) di(meth)acrylate, polypropylene glycol di(meth)acrylate, silicone di(meth) acrylate, tetraethylene glycol di(meth)acrylate, triethylene glycol di(meth)acrylate, polyester (di)acrylate, polyethylene glycol di(meth)acrylate, dimethylol tricyclodecane di(meth) acrylate, neopentyl glycol-modified trimethylol propane di(meth)acrylate, dipropylene glycol di(meth)acrylate, tripropylene glycol di(meth)acrylate, triglycerol di(meth) acrylate, EO-modified tripropylene glycol di(meth)acrylate, divinyl ethylene urea, divinyl propylene urea, 2-ethyl-2-butyl propanediol acrylate, 2-ethylhexyl (meth)acrylate, 2-ethylhexyl carbitol (meth)acrylate, 2-hydroxyethyl (meth) acrylate, 2-hydroxypropyl (meth)acrylate, 2-hydroxybutyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, butanediol mono(meth) acrylate, butoxyethyl (meth)acrylate, butyl (meth)acrylate, cetyl (meth)acrylate, EO-modified cresol (meth)acrylate, ethoxyed phenyl (meth)acrylate, ethyl (meth)acrylate, dipropylene glycol (meth)acrylate, isoamyl (meth)acrylate, isobutyl (meth)acrylate, iso-octyl (meth)acrylate, cyclohexyl (meth)acrylate, dicyclo pentanyl (meth)acrylate, isobornyl (meth)acrylate, dicyclo pentanyl oxyethyl (meth)acrylate, iso myristyl (meth)acrylate, lauryl (meth)acrylate, methoxy dipropylene glycol (meth)acrylate, methoxy polyethylene glycol (meth)acrylate, methoxy triethylene glycol (meth)acrylate, methyl (meth)acrylate, methoxy tripropylene glycol (meth)acrylate, neopentyl glycol benzoate (meth)acrylate, nonylphenoxy polyethylene glycol (meth)acrylate, nonylphenoxy polypropylene glycol (meth)acrylate, octyl (meth)acrylate, paracumyl phenoxy ethylene glycol (meth)acrylate, ECH-modified phenoxy acrylate, phenoxy diethylene glycol (meth)acrylate, phenoxy hexaethylene glycol (meth)acrylate, phenoxy tetraethylene glycol (meth)acrylate, phenoxy ethyl (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromo phenyl (meth)acrylate, EO-modified tribromo phenyl (meth)acrylate, and tridodecyl (meth)acrylate. In addition, EO-modified means ethylene oxide-modified, ECH-modified means epichlorohydrin-modified, and PO-modified means propylene oxide-modified.

Examples of monomers having an ally group include p-isopropenyl phenol. Examples of monomers having a vinyl group include styrene, α-methyl styrene, acrylonitrile, and vinylcarbazole.

<Fluorine-Containing (Meth)Acrylate>

As the fluorine-containing meth(acrylate) used in the photopolymerizable mixture, the meth(acrylate) is not particularly limited as long as the meth(acrylate) contains fluorine, and preferably has a polyfluoroalkylene chain and/or perfluoro (polyoxyalkylene) chain and polymerizable group, and further preferable is a linear perfluoro alkylene group or perfluoro oxyalkylene group having a trifluoromethyl group in the side chain and an ethereal oxygen atom inserted in between carbon atoms. Further, particularly preferable is a linear polyfluoroalkylene chain and/or linear perfluoro (polyoxyalkylene) chain having a trifluoromethyl group in the molecular side chain or molecular structure terminal.

The polyfluoroalkylene chain is preferably a polyfluoroalkylene group with the carbon number of from 2 to 24. Further, the polyfluoroalkylene group may have a functional group.

The perfluoro (polyoxyalkylene) chain is preferably comprised of at least one kind of perfluoro (oxyalkylene) units or more selected from the group consisting of a $(CF_2CF_2O)$ unit, $(CF_2CF(CF_3)O)$ unit, $(CF_2CF_2CF_2O)$ unit and $(CF_2O)$ unit, and is more preferably comprised of $(CF_2CF_2O)$ units, $(CF_2CF(CF_3)O)$ units or $(CF_2CF_2CF_2O)$ units. The perfluoro (polyoxyalkylene) chain is particularly preferably comprised of $(CF_2CF_2O)$ units, because physical properties (heat resistance, acid resistance, etc.) of the fluorine-containing polymer are excellent. In terms of high release properties and hardness of the fluorine-containing polymer, the number of perfluoro (oxyalkylene) units is preferably an integer of from 2 to 200, and more preferably an integer of from 2 to 50.

As the polymerizable group, among preferable groups are a vinyl group, ally group, acryloyl group, methacryloyl group, epoxy group, dioxetane group, cyano group, and isocyanate group, and a vinyl group, acryloyl group, or methacryloyl group is more preferable. An acryloyl group or methacryloyl group is most preferable.

As the number of polymerizable groups, in terms of excellence in polymerizable properties, integers of from 1 to 4 are preferable, and integers of from 1 to 3 are more preferable. When two kinds of compounds or more are used, the average number of polymerizable groups preferably ranges from 1 to 3.

The fluorine-containing (meth)acrylate is excellent in adhesion to film substrates when the (meth)acrylate has functional groups. Examples of the functional groups are a carboxyl group, sulfone group, functional groups having an ester bond, functional groups having an amide bond, hydroxyl group, amino group, cyano group, urethane group, isocyanate group and functional groups having derivatives of isocyanuric acid. Particularly, it is preferable to contain at least one functional group of a carboxyl group, urethane group, and functional groups having derivatives of isocyanuric acid. In addition, the derivatives of isocyanuric acid include structures having the backbone of isocyanuric acid with at least one of hydrogen atoms bound to a nitrogen atom substituted by another group.

Specific examples of the fluorine-containing (meth) acrylate are fluoro(meth)acrylates such as $CH_2=CHCOO(CH_2)_2(CF_2)_{10}F$, $CH_2CHCOO(CH_2)_2(CF_2)_8F$, $CH_2=CHCOO(CH_2)_2(CF_2)_8F$, $CH_2=C(CH_8)COO(CH_2)_2(CF_2)_{10}F$, $CH_2=C(CH_3)COO(CH_2)_2(CF_2)_8F$, $CH_2=C(CH_3)COO(CH_2)_2(CF_2)_8F$, $CH_2=CHCOOCH_2(CF_2)_8F$, $CH_2=C(CH_3)COOCH_2(CF_2)_8F$, $CH_2=CHCOOCH_2(CF_2)_7F$, $CH_2=C(CH_3)COOCH_2(CF_2)_7F$, $CH_2=CHCOOCH_2CF_2CF_2H$, $CH_2=CHCOOCH_2(CF_2CF_2)_2H$, $CH_2=CHCOOCH_2(CF_2CF_2)_4H$, $CH_2=C(CH_3)COOCH_2(CF_2CF_2)H$, $CH_2=C(CH_3)COOCH_2(CF_2CF_2)_2H$, $CH_2=C(CH_3)COOCH_2(CF_2CF_2)_4H$, $CH_2=CHCOOCH_2CF_2OCF_2CF_2OCF_3$, $CH_2=CHCOOCH_2CF_2O(CF_2CF_2O)_3CF_3$, $CH_2=C(CH_3)COOCH_2CF_2OCF_2CF_2OCF_3$, $CH_2=C(CH_3)COOCH_2CF_2O(CF_2CF_2O)_3CF_3$, $CH_2=CHCOOCH_2CF(CF_3)OCF_2CF(CF_3)O(CF_2)_3F$, $CH_2=CHCOOCH_2CF(CF_3)O(CF_2CF(CF_3)O)_2(CF_2)_3F$, $CH_2=C(CF_3)COOCH_2CF(CF_3)OCF_2CF(CF_3)O(CF_2)_3F$, $CH_2=C(CH_3)COOCH_2CF(CF_3)O(CF_2CF(CF_3)O)_2(CF_2)_3F$, $CH_2=CFCOOCH_2CH(OH)CH_2(CF_2)_6CF(CF_3)_2$, $CH_2=CFCOOCH_2CH(CH_2OH)CH_2(CF_2)_6CF(CF_3)_2$, $CH_2=CFCOOCH_2CH(OH)CH_2(CF_2)_{10}F$, $CH_2=CFCOOCH_2CH(OH)CH_2(CF_2)_{10}F$, $CH_2=CHCOOCH_2CH(CF_2CF_2)_3CH_2CH_2OCOCH=CH_2$, $CH_2=C(CH_3)COOCH_2CH_2(CF_2CF_2)_3CH_2CH_2OCOC(CH_3)=CH_2$, $CH_2=CHCOOCH_2CyFCH_2OCOCH=CH_2$, and $CH_2=C(CH_3)COOCH_2CyFCH_2OCOC(CH_3)=CH_2$ (in addition, CyF represents a perfluoro(1,4-cyclohexylene group).) Further, the examples are fluorodienes such as $CF_2=CFCF_2CF=CF_2$, $CF_2=CFOCF_2CF=CF_2$, $CF_2=CFOCF_2CF_2CF=CF_2$, $CF_2=CFOCF(CF_3)CF_2CF=CF_2$, $CF_2=CFOCF(CF_3)CF=CF_2$, $CF_2=CFOCF_2OCF=CF_2$, $CF_2=CFOCF_2CF(CF_3)OCF_2CF=CF_2$, $CF_2=CFCF_2C(OH)(CF_3)CH_2CH=CH_2$, $CF_2=CFCF_2C(OH)(CF_3)CH=CH_2$, $CF_2=CFCF_2C(CF_3)(OCH_2OCH_3)CH_2CH=CH_2$, and $CF_2=CFCH_2C(C(CF_3)_2OH)(CF_3)CH_2CH=CH_2$.

In addition, when the fluorine-containing (meth)acrylate is fluorine-containing urethane (meth)acrylate expressed by following general formula (1), since it is possible to exhibit adhesion to the substrate and release properties more effectively, the urethane (meth)acrylate is more preferable.

[Chemistry 1]

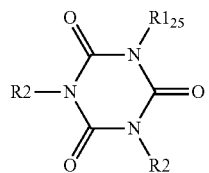

Formula (1)

[In formula (1), R1 represents following general formula (2):

[Chemistry 2]

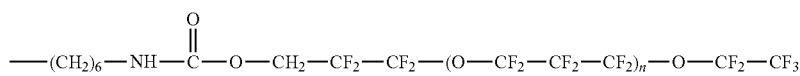

Formula (2)

(In formula (2), n is an integer of from 1 to 6), and R2 represents following general formula (3):

[Chemistry 3]

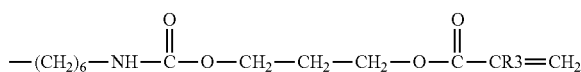

Formula (3)

(In formula (3), R3 is H or $CH_3$.)]

The group represented by general formula (2) has a perfluoro polyether structure unit at the terminal, and in the perfluoro polyether structure unit, n is an integer of from 1 to 6. Further, R2 in general formula (1) has an acrylate group represented by general formula (3). As commercially available products of urethane (meth)acrylates, for example, there is "OPTOOL DAC" made by Daikin Industries, Ltd.

In addition, as the fluorine-containing meth(acrylate), one kind may be used only, or two kinds or more may be used together. Further, it is possible to use a surface modifier(s) for abrasion resistance, scratch resistance, fingerprint adhesion prevention, antifouling property, leveling properties, water repellency, oil repellency and the like together. Examples of commercially available surface modifiers are "FTERGENT" made by NEOS Company Limited (for example, M series: FTERGENT 251, FTERGENT 215M, FTERGENT 250, FTR1-245M, FTR1-290M; S series: FTR1-207S, FTR1-211S, FTR1-220S, FTR1-230S; F series: FTR1-209F, FTR1-213F, FTERGENT 222F, FTR1-233F, FTERGENT 245F; G series: FTERGENT 208G, FTR1-218G, FTR1-230G, FTS-240G; Oligomer series: FTERGENT 730FM, FTERGENT 730LM, FTERGENT P series: FTERGENT 710FL; FTR1-710HL, etc.), "MEGAFAC" made by DIC Corporation (for example, F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, etc.), "OPTOOL (Registered Trademark)" (for example, DSX, DAC, AES), "EFTONE (Registered Trademark)" (for example, AT-100), "ZEFFLE (Registered Trademark)" (for example, GH-701), "UNIDYNE (Registered Trademark)", "DAIFREE (Registered Trademark)" and "OPTOACE (Registered Trademark)" made by Daikin Industries, Ltd., "Novec EGC-1720" made by Sumitomo 3M Limited, and "Fluoro Surf (Registered Trademark)" made by Fluoro Technology.

In the fluoro-containing (meth)acrylate, the molecular weight Mw preferably ranges from 50 to 50,000, preferably ranges from 50 to 5,000 from the viewpoint of compatibility, and more preferably ranges from 100 to 5,000. In using high molecular weights with low compatibility, a diluent solvent may be used. As the diluent solvent, preferable are diluent solvents in which the boiling point of a single solvent ranges from 40° C. to 180° C., the range of 60° C. to 180° C. is more preferable, and the range of 60° C. to 140° C. is further preferable. Two kinds of diluent solvents or more may be used. When the solvent is contained, the content ranging from 0.1 part by mass to 40 parts by mass relative to 100 parts by mass of (meth)acrylate provides improvements in dispersion properties of fluorine-containing (meth)acrylate and is preferable. The content ranging from 0.5 part by mass to 20 parts by mass provides excellent hardening properties of the photopolymerizable mixture and is preferable. The content ranging from 1 part by mass to 15 parts by mass provides excellent repetitive transfer properties and is more preferable.

<Photoinitiator>

The photoinitiator used in the photopolymerizable mixture causes a radical reaction or ion reaction by light, and is preferably photoinitiators that cause the radical reaction. As the photoinitiators, for example, there are photoinitiators as described below.

Among acetophenone-series photoinitiators are acetophenone, p-tert-butyltrichloro acetophenone, chloro acetophenone, 2-2-diethoxy acetophenone, hydroxy acetophenone, 2,2-dimethoxy-2'-phenyl acetophenone, 2-amino acetophenone, dialkylamino acetophenone, etc. Among benzoin-series photoinitiators are benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropane-1-one, 1-(4-isopropylphenyl)-2-hydroxy-2-methylpropane-1-one, benzyl dimethyl ketal, etc. Among benzophenone-series photoinitiators are benzophenone, benzoylbenzoic acid, methyl benzoyl benzoate, methyl-o-benzoyl benzoate, 4-phenyl benzophenone, hydroxy benzophenone, hydroxypropyl benzophenone, acrylic benzophenone, 4-4'-bis(dimethylamino)benzophenone, perfluoro benzophenone, etc. Among thioxanthone-series photoinitiators are thioxanthone, 2-chloro thioxanthone, 2-methyl thioxanthone, diethyl thioxanthone, dimethyl thioxanthone, etc. Among anthraquinone-series photoinitiators are 2-methyl anthraquinone, 2-ethyl anthraquinone, 2-tert-butyl anthraquinone, 1-chloro anthraquinone, 2-amyl anthraquinone, etc. Among ketal-series photoinitiators are acetophenone dimethyl ketal, benzyl dimethyl ketal, etc. Further, among other photoinitiators are α-acyl oxime ester, benzyl-(o-ethoxycarbonyl)-α-monoxime, acyl phosphine oxide, glyoxy ester, 3-keto coumarin, 2-ethyl anthraquinone, camphor quinone, tetramethylthiuram sulfide, azo bis isobutyl nitrile, benzoyl peroxide, dialkyl peroxide, tert-butyl peroxy pivalate, etc. Among photoinitiators having fluorine atoms are perfluoro tert-butyl peroxide, perfluoro benzoyl peroxide, etc. Further, it is possible to use these photoinitiators alone or in combination of two kinds or more.

Examples of commercially available photoinitiators are "IRGACURE" (for example, IRGACURE 651, 184, 500, 2959, 127, 754, 907, 369, 379, 379EG, 819, 1800, 784, OXE01, OXE02) and "DAROCUR" (for example, DAROCUR 1173, MBF, TPO, 4265) made by Ciba.

As the photoinitiator, one kind may be used alone, or two kinds or more may be used together. When two kinds or more are used together, it is preferable to select from the viewpoints of dispersion properties of the fluorine-containing meth(acrylate), and hardening properties of the fine concavo-convex structure surface and the inside. For example, an α-hydroxy ketone-series photoinitiator and α-amino ketone-series photoinitiator may be used together. Further, as combinations in the case of using two kinds together, examples of the combinations of two kinds of "Irgacure", and "Irgacure" and "Darocur" are Darocur 1173 and Irgacure 819, Irgacure 379 and Irgacure 127, Irgacure 819 and Irgacure 127, Irgacure 250 and Irgacure 127, Irgacure 184 and Irgacure 369, Irgacure 184 and Irgacure 379EG, Irgacure 184 and Irgacure 907, Irgacure 127 and Irgacure 379EG, Irgacure 819 and Irgacure 184, and Darocur TPO and Irgacure 184.

<Silane Coupling Agent>

Silane coupling agents used in the photopolymerizable mixture are not particularly limited, as long as the agents are compounds having groups to cause a coupling reaction and hydrolyzable groups. As the molecular weight of the silane coupling agents, the molecular weight preferably ranges from 100 to 1,500 from the viewpoint of compatibility, and more preferably ranges from 100 to 600 from the viewpoints of effectively introducing siloxane bonds in the resin layer 12, while suppressing penetration of the resin from the resin layer 12 to improve release properties.

As the groups to cause the coupling reaction that the silane coupling agents have, among preferable examples are a vinyl group, epoxy group, acryloyl group, methacryloyl group, acryloxy group, methacryloxy group, amino group, ureide group, chloropropyl group, mercapto group, sulfide group, isocyanate group, allyl group, and oxetanyl group, an allyl group, vinyl group, acryloyl group, methacryloyl, acryloxy group, and methacryloxy group are more preferable from the viewpoint of compatibility, and an acryloxy group and methacryloxy group are most preferable from the viewpoint of physical stability of the resin layer 12.

Further, the silane coupling agents may be fluorine-containing silane coupling agents. As the fluorine-containing silane coupling agents, for example, the agents can be compounds represented by a general formula $(F_3C-(CF_2)a-(CH_2)b-Si(O-R4)_3$ (in addition, a is an integer of from 1 to 11, b is an integer of from 1 to 4, and R4 represents an alkyl group with the carbon number of from 1 to 3), and may contain a polyfluoroalkylene chain and/or perfluoro (polyoxyalkylene) chain. Further preferable is a linear perfluoro alkylene group or perfluoro oxyalkylene group having a trifluoromethyl group in the side chain and an ethereal oxygen atom inserted in between carbon atoms. Further, particularly preferable is a linear polyfluoroalkylene chain and/or linear perfluoro (polyoxyalkylene) chain having a trifluoromethyl group in the molecular side chain or molecular structure terminal. The polyfluoroalkylene chain is preferably a polyfluoroalkylene group with the carbon number of from 2 to 24. Further, the polyfluoroalkylene group may have a functional group. The perfluoro (polyoxyalkylene) chain is preferably comprised of at least one kind of perfluoro (oxyalkylene) units or more selected from the group consisting of a $(CF_2CF_2O)$ unit, $(CF_2CF(CF_3)O)$ unit, $(CF_2CF_2CF_2O)$ unit and $(CF_2O)$ unit, and is more preferably comprised of $(CF_2CF_2O)$ units, $(CF_2CF(CF_3)O)$ units or $(CF_2CF_2CF_2O)$ units. The perfluoro (polyoxyalkylene) chain is particularly preferably comprised of $(CF_2CF_2O)$ units, because physical properties (heat resistance, acid resistance, etc.) of the fluorine-containing polymer are excellent. In terms of high release properties and hardness of the fluorine-containing polymer, the number of perfluoro (oxyalkylene) units is preferably an integer of from 2 to 200, and more preferably an integer of from 2 to 50.

Further, the silane coupling agent may have a photopolymerizable group. By having the photopolymerizable group, it is possible to obtain excellent hardened film properties in light cross-linking. Examples of the photopolymerizable group are an acryloyl group, methacryloyl group, acryloxy group, methacryloxy group, vinyl group, epoxy group, allyl group, and oxetanyl group. An acryloyl group, methacryloyl group, acryloxy group, methacryloxy group and vinyl group are preferable from the viewpoint of compatibility, an acryloyl group, methacryloyl group, acryloxy group, methacryloxy group and vinyl group are more preferable from the viewpoint of physical stability of the resin layer 12, and an acryloyl group and methacryloyl group are further preferable from the viewpoint of improvements in releasability of the resin layer 12.

Examples of the silane coupling agents are vinyl trichlorosilane, vinyl trimethoxysilane, vinyl triethoxysilane, 2-(3,4-epoxy cyclohexyl)ethyl trimethoxysilane, 3-glycidooxy-propyl-trimethoxysilane, 3-glycidooxy-propyl-methyl-diethoxysilane, 3-glycidooxy-propyl-triethoxysilane, p-styryl trimethoxysilane, 3-methacryloxy-propylmethyl-dimethoxysilane, 3-methacryloxy-propyl-trimethoxysilane, 3-methacryloxy-propylmethyl-diethoxysilane, 3-methacryloxy-propyl-triethoxysilane, 3-acryloxy-propyl-trimethoxysilane, N-2-(aminoethyl)-3-aminopropylmethyl-dimethoxysilane, N-2-(aminoethyl)-3-aminopropyl-trimethoxysilane, N-2-(aminoethyl)-3-aminopropyl-triethoxysilane, 3-aminopropyl-trimethoxysilane, 3-aminopropyl-triethoxysilane, 3-triethoxysilyl-N-(1,3-dimethyl-butylidene)-propylamine, N-phenyl-3-aminopropyl-trimethoxysilane, hydrochloride of N-(vinylbenzyl)-2-aminoethyl-3-aminopropyl-trimethoxysilane, 3-ureidepropyl-triethoxysilane, 3-chloropropyl trimethoxysilane, 3-mercapto-propylmethyl-dimethoxysilane, 3-mercapto-propyl-trimethoxysilane, bis(triethoxy-silylpropyl)tetrasulfide, 3-isocyante-propyl-triethoxysilane, and perfluoro alkyl alkylene alkoxy silane compounds such as triethoxy-1H,1H,2H,2H-tridecafluoro-octylsilane, hepta-decafluorodecyl-trimethoxysilane, $CF_3(CF_2)_4CH_2CH_2Si(OC_2H_5)_3$, $CF_3(CF_2)_4CH_2CH_2SiCH_3(OC_2H_5)_2$, $CF_3(CF_2)_7CH_2CH_2Si(OC_2H_7)_3$, $CF_3CF_2CH_2CH_2Si(OC_3H_7)_3$, $CF_3(CF_2)_2CH_2CH_2Si(OC_3H_7)_3$, $CF_3(CF_2)_4CH_2CH_2SiCH_3(OC_3H_7)_2$, $CF_3(CF_2)_5CH_2CH_2SiCH_3(OC_3H_7)_2$, and $CF_3(CF_2)_7CH_2CH_2SiCH_3(OC_3H_7)_2$. As the silane coupling agent, one kind may be used only, or two kinds or more may be used. Further, the agent may be used together with silsesquioxane.

<Silsesquioxane>

Silsesquioxane used in the photopolymerizable mixture is not particularly limited, as long as the silsesquioxane is represented by the composition formula $(R5SiO_{3/2})c$. Silsesquioxane having a structure of any one of basket type, latter type, random type and the like may be used. Among the compounds, silsesquioxane having the structure of basket type or ladder type is more preferable. Since physical stability of the resin layer 12 improves and mold release becomes excellent, the basket type is more preferable. Further, in the composition formula (R5SiO$_{3/2}$)c, R5 may be a siloxane group with or without substitute, or another arbitrary substituent group. c preferably ranges from 8 to 12, and since polymerizability is excellent in obtaining the resin layer 12, more preferably ranges from 8 to 10. From the viewpoints of suppressing penetration of the resin from the resin layer 12 and improving mold release, c is further preferably 8. A number of R5 of which the number is c may be the same or different.

Further, silsesquioxane may contain a photopolymerizable group. When the photopolymerizable group is contained, since polymerization proceeds excellently, it is possible to obtain excellent hardened film properties. Examples of the polymerizable group are an acryloyl group, methacryloyl group, acryloxy group, methacryloxy group, vinyl group, epoxy group, allyl group, and oxetanyl group. Among the groups, an acryloyl group, methacryloyl group, acryloxy group, methacryloxy group and vinyl group are more preferable, because excellent hardened film properties are obtained. Further, an acryloyl group or methacryloyl group is more preferable, because it is possible to suppress penetration of the resin from the resin layer 12, and mold release is improved.

Further, silsesquioxane may be fluoro-silsesquioxane. Herein, fluoro-silsesquioxane means that R5 in the composition formula is independently comprised of at least one kind of fluoroalkyl, fluoroaryl and fluoroaryl alkyl, and that at least one or more these substituent groups are in a number of R5 of which the number is c. Since mold release is further improved, more preferable is a linear perfluoro alkylene group or perfluoro oxyalkylene group having a trifluoromethyl group in the side chain and an ethereal oxygen atom inserted in between carbon atoms. Further, particularly preferable is a linear polyfluoroalkylene chain and/or linear perfluoro (polyoxyalkylene) chain having a trifluoromethyl group in the molecular side chain or molecular structure terminal. The polyfluoroalkylene chain is preferably a polyfluoroalkylene group with the carbon number of from 2 to 24. Further, the polyfluoroalkylene group may have a functional group. The perfluoro (polyoxyalkylene) chain is preferably comprised of at least one kind of perfluoro (oxyalkylene) units or more selected from the group consisting of a (CF$_2$CF$_2$O) unit, (CF$_2$CF(CF$_3$)O) unit, (CF$_2$CF$_2$CF$_2$O) unit and (CF$_2$O) unit, and is more preferably comprised of (CF$_2$CF$_2$O) units, (CF$_2$CF(CF$_3$)O) units or (CF$_2$CF$_2$CF$_2$O) units. The perfluoro (polyoxyalkylene) chain is particularly preferably comprised of (CF$_2$CF$_2$O) units, because physical properties (heat resistance, acid resistance, etc.) of the fluorine-containing polymer are excellent. In terms of high release properties and hardness of the fluorine-containing polymer, the number of perfluoro (oxyalkylene) units is preferably an integer of from 2 to 200, and more preferably an integer of from 2 to 50.

Further, as silsesquioxane, one kind may be used only, or two kinds or more may be used. Further, silsesquioxane may be used together with a silane coupling agent.

Examples of silsesquioxane are poly-hydrogenated silsesquioxane, polymethylsilsesquioxane, polyethylsilsesquioxane, polypropylsilsesquioxane, polyisopropylsilsesquioxane, polybutylsilsesquioxane, poly-sec-butylsilsesquioxane, poly-tert-butylsilsesquioxane, polyphenylsilsesquioxane, polynaphtylsilsesquioxane, polystyrylsilsesquioxane, and polyadamantylsilsesquioxane. Further, in these kinds of silsesquioxane, at least one of c R5s may be replaced with substituent groups exemplified below. Examples of the substituent groups are trifluoromethyl, 2,2,2-trifluoroethyl, 3,3, 3-trifluoropropyl, 2,2,3,3-tetrafluoropropyl, 2,2,3,3,3-pentafluoropropyl, 2,2,2-trifluoro-1-trifluoromethylethyl, 2,2,3,4, 4,4-hexafluorobutyl, 2,2,3,3,4,4,5,5-octafluoropentyl, 2,2,2-trifluoroethyl, 2,2,3,3-tetrafluoropropyl, 2,2,3,3,3-pentafluoropropyl, 2,2,3,3,4,4,5,5-octafluoropentyl, 3,3,3-trifluoropropyl, nonafluoro-1,1,2,2-tetrahydrohexyl, tridecafluoro-1,1,2,2-tetrahydrooctyl, heptadecafluoro-1,1, 2,2-tetrahydrodecyl, perfluoro-1H, 1H, 2H, 2H-dodecyl, perfluoro-1H,1H, 2H, 2H-tetradecyl, 3,3,4,4,5,5,6,6,6-nonafluorohexyl, acryloyl group, methacryloyl group, acryloxy group, methacryloxy group, vinyl group, epoxy group, allyl group, and oxetanyl group.

<Thermoplastic Resin>

As thermoplastic resins that are materials for the resin layer 12, examples of the resins are polyethylene, polypropylene, polystyrene, acrylonitrile/styrene-series polymers, acrylonitrile/butadiene/styrene-series polymers, polyvinyl chloride, polyvinylidene chloride, poly(meth)acrylate, polyarylate, polyethylene terephthalate, polybutylene terephthalate, polyamide, polyimide, polyacetal, polycarbonate, polyphenylene ether, polyether ether ketone, polysulfone, polyether sulfone, polyphenylene sulfide, polyvinylidene fluoride, tetrafluoroethylene/perfluoro(alkyl vinyl ether)-series copolymers, tetrafluoroethylene/ethylene-series copolymers, vinylidene fluoride/tetrafluoroethylene/hexafluoropropylene-series copolymers, tetrafluoroethylene/propylene-series copolymers, polyfluoro(meth)acrylate-series polymers, fluorine-containing polymers having fluorine-containing aliphatic cyclic structure in the main chain, polyvinyl fluoride, polytetrafluoroethylene, polychlorotrifluoroethylene, chlorotrifluoroethylene/ethylene-series copolymers, chlorotrifluoroethylene/hydrocarbon-series alkenyl ether-series copolymers, tetrafluoroethylene/hexafluoropropylene-series copolymers, and vinylidene fluoride/hexafluoropropylene-series copolymers.

[Inorganic Layer]

As the inorganic layer 13, it is possible to use a hardened sol-gel material layer that is a hardened material of the sol-gel material, semi-hardened sol-gel material layer that is a partial hardened material of the sol-gel material, hardened material of the sol-gel material, further an inorganic material layer that is a layer in which an unhardened sol-gel material is contained, and an inorganic fine-particle layer containing a mixture of inorganic fine particles, binder polymer and sol-gel material. The inorganic layer 13 will specifically be described below with reference to Embodiments 1 to 4.

Embodiment 1

In Embodiment 1, as the inorganic layer 13, used is a hardened sol-gel material layer (hardened material layer of the sol-gel material) that is a hardened material of the sol-gel material. The sol-gel material is a compound group such that hydrolytic polycondensation proceeds by action of heat and catalyst and that the material is hardened. Examples thereof are metal alkoxide (metal alcoholate), metal chelate compounds, metal halide, silane halide, liquid glass, spin-on glass or reactants thereof, or these compounds or reactants with a catalyst to promote hardening contained. Corresponding to required physical properties, the compounds or reactants may be used alone, or in combination of a plurality of kinds. Further, siloxane materials including silicone, reaction inhibitor and the like may be contained in the sol-gel material. Furthermore, as the sol-gel material, it is possible to use not only an unhardened material but also a partially hardened material. Herein, the partially hardened material of the sol-gel material refers to a material in which polymerization reaction of the sol-gel material partially proceeds and unreacted functional groups remain. When heat, light or the like is further applied to the partially hardened material, the unreacted functional groups react, and hardening further proceeds.

Metal alkoxide is a compound group obtained by an arbitrary metal species reacting with water or organic solvent by a hydrolysis catalyst or the like, and is the compound group such that the arbitrary metal species binds to functional groups such as a hydroxy group, methoxy group, ethoxy group, propyl group, and isopropyl group. Examples of the metal species of metal alkoxide are silicon, titanium, aluminium, germanium, boron, zirconium, tungsten, sodium, potassium, lithium, magnesium, and tin.

Examples of metal alkoxide with silicon as a metal species are dimethyl diethoxysilane, diphenyl diethoxysilane, phenyl triethoxysilane, methyl triethoxysilane, vinyl triethoxy silane, p-styryl triethoxysilane, methyl phenyl diethoxysilane, 2-(3,4-epoxy cyclohexyl)ethyl triethoxysilane, 3-glycidooxy-propyl-triethoxysilane, 3-glycidooxy-propyl-methyl-diethoxysilane, 3-methacryloxy-propylmethyl-diethoxysilane, 3-methacryloxy-propyl-triethoxysilane, 3-acryloxy-propyl-triethoxysilane, N-2-(aminoethyl)-3-aminopropyl-diethoxysilane, N-2-(aminoethyl)-3-aminopropyl-triethoxysilane, 3-aminopropyl-triethoxysilane 3-ureide-propyl-triethoxysilane, 3-mercapto-propylmethyl-diethoxysilane, 3-mercapto-propyl-triethoxysilane, tetraethoxysilane, triethoxysilane and compound groups such that the ethoxy groups of these chemical groups are replaced with methoxy groups, propyl groups, isopropyl groups and the like. Further, it is possible to use diphenyl silane diol, dimethyl silane diol and the like. Corresponding to required physical properties, these compounds may be used alone or in combination of a plurality of kinds.

Further, as metal alkoxide, it is also possible to use silsesquioxane compounds. Silsesquioxane is a generic name of compound groups represented by $(RSiO_{3/2})n$, and compounds such that one silicon atom binds with one organic group and three oxygen atoms. More specifically, it is possible to use silsesquioxane described in the above-mentioned photopolymerizable mixture.

Halogenated metal refers to a compound group such that in the above-mentioned metal alkoxide, the functional group to cause hydrolytic polycondensation is replaced with a halogen atom. In addition, it is possible to vary the metal species as appropriate. In halogenated metal, the case where the metal species is silicon is sometimes referred to as halogenated silane.

Examples of metal chelate compounds are titanium diisopropoxy bis(acetylacetonate), titanium tetrakis(acetylacetonate), titanium dibutoxy bisoctylene glycolate, zirconium tetrakis(acetylacetonate), zirconium dibutoxy bis(acetylacetonate), aluminum tris(acetylacetonate), aluminum dibutoxy mono(acetylacetonate), zinc bis(acetylacetonate), indium tris(acetylacetonate) and polytitanium acetylacetonate.

As liquid glass, for example, there are a TGA series made by APOLLORINK Inc., etc., and corresponding to required physical properties, it is possible to add other sol-gel compounds. As spin-on glass, for example, it is possible to use an OCD series made by TOKYO OHKA CO., LTD., ACCUGLASS series made by Honeywell International Inc., etc.

As the catalyst to cause hardening to proceed, it is possible to use various kinds of acids and bases. Various kinds of acids include not only inorganic acids such as hydrochloric acid, sulfuric acid and nitric acid, but also organic acids such as various carboxylic acids, unsaturated carboxylic acids and anhydrides. Further, when hardening is light cross-linking, it is possible to use a photoinitiator, photosensitizer, photoacid generator, and the like that are used in the resin layer 12 and the like. As the photoinitiator and photosensitizer, it is possible to apply the compounds used in the resin layer 12.

The sol-gel material may contain a solvent to use. Among preferable solvents are water, N,N-dimethylformamide, N-methyl-2-pyrrolidone, N-ethyl-2-pyrrolidone, N-vinyl-2-pyrrolidone, N,N-di methylacetamide, dimethyl sulfoxide, hexamethyl phosphoramide, pyridine, cyclopentanone, γ-butyrolactone, α-acetyl-γ-butyrolactone, tetramethyl urea, 1,3-dimethyl-2-imidazolinone, N-cyclohexyl-2-pyrrolidone, propylene glycol monomethyl ether, propylene glycol monomethyl ether acetate, acetone, methyl ethyl ketone, methyl isobutyl ketone, anisole, methyl acetate, ethyl acetate, ethyl lactate, butyl lactate, morpholine, methanol, ethanol, isopropyl alcohol, butanol, and 2-butanol. It is possible to use these solvents alone or in combination of two kinds or more. Among the solvents, solvents of ketone series and alcohol series are preferable. It is possible to add these solvents as appropriate corresponding to adhesion, storage property and hardening adjustment of the hardened sol-gel material. For example, it is possible to add 0.01 to 1,000 parts by mass of solvent to 1 part by mass of the sol-gel material. In addition, the invention is not limited thereto.

A reaction inhibitor to add to the sol-gel material is not limited particularly, as long as the inhibitor is capable of chelating metal alkoxide. Examples of the inhibitor are β-diketone compounds, β-ketoester compounds, and amine-series chelate agents. Examples of β-diketone are β-diketone compounds with the carbon number of from 5 to such as acetylacetone, benzoylacetone, dibenzoylmethane, 2,2,6,6-tetramethyl-3,5-heptadione and vinyl acetylacetone. The chelate agent is a general name of substances in which a plurality of atoms in the ligand molecule binds to a metal ion to form a metal chelate complex. The above-mentioned amine-series chelate agent is represented by general formula; NR6R7R8 (in the formula, each of R6, R7 and R8 is hydrogen or hydroxy alkyl group or alkyl group with the carbon number of from 2 to 6, preferably, 2 to 3, independently. In addition, R6, R7 and R8 are not hydrogen at the same time.) Specific examples are 2-aminoethanol, 2,2'-iminodiethanol, 3-aminopropanol, 4-amino1-1-butanol, and N-amino ethyl ethanolamine.

The siloxane material to add to the sol-gel material is not limited particularly, as long as the material is a material having silicon and oxygen as a backbone. Since it is possible to provide flexibility by adding the siloxane material to the sol-gel material, it is possible to suppress a crack in handling and to enhance physical durability. As the siloxane material to add to the sol-gel material, silicone materials are particularly preferable.

Examples of the silicone materials are liner silicone oil of a low degree of polymerization, typified by polydimethyl siloxane (PDMS) that is a polymer of dimethylchlorosilane, which exhibits fluidity at room temperature, modified silicone oil, linear PDMS of a high degree of polymerization, silicone rubber made to exhibit rubber-like elasticity by cross-linking PDMS to a middle degree, modified silicone rubber, resin-like silicone, and silicone resin (or DQ resin) that is a resin having three-dimensional network structure comprised of PDMS and four-functional siloxane. In addition, there are cases that organic molecules are used as the crosslinking agent and that four-functional siloxane (Q unit) is used.

The modified silicone oil is obtained by modifying the side chain and/or terminal of polysiloxane, and is classified into reactive silicone oil and non-reactive silicone oil. Examples of the reactive silicone oil are amino modification, epoxy modification, carboxyl modification, carbinol modification, methacryl modification, mercapto modification, phenol modification, one-terminal reactivity, and hetero-function modification. Examples of the non-reactive silicone oil are polyether modification, methyl styryl modification, alkyl modification, higher aliphatic ester modification, hydrophilic special modification, higher alkoxy modification, higher fatty acid modification, and fluorine modification. It is also possible to perform above-mentioned two modifications or more to one polysiloxane molecule.

Examples of commercially available modified silicone oils are TSF4421, XF42-334, XF42-B3629 and XF4213-3161 made by GE Toshiba silicone corporation, BY16-846, SF8416, SH203, SH230, SF8419, and SF8422 made by Dow Corning Toray Co., Ltd., and KF-410, KF-412, KF-413, KF-414, KF-415, KF-351A, KF-4003, KF-4701, KF-4917, KF-7235B, X-22-2000, X-22-3710, X-22-7322, X-22-1877, X-22-2516 and PAM-E made by Shin-Etsu Chemical Co., Ltd.

In addition, the sol-gel material forming the hardened sol-gel material layer may be a hybrid containing inorganic segments and organic segments, from the viewpoints of transfer velocity and transfer accuracy of the hardened sol-gel material layer. It is possible to achieve the hybrid by containing a sol-gel material (for example, silane coupling agent) having polymerizable groups typified by photopolymerizable groups in the molecule in the sol-gel material, containing a hydrogen-bonding organic polymer (for example, polyvinyl pyrolidone) without polymerizable groups, and containing a photopolymerizable resin. As the hybrid, for example, it is possible to use a material obtained by mixing metal alkoxide, silane coupling agent provided with photopolymerizable groups, radical polymerization-system resin, etc. To further enhance transfer accuracy, silicone may be added to the compounds. Further, from the viewpoint of transfer accuracy, the mixture ratio between metal alkoxide containing the silane coupling agent and the photopolymerizable resin is preferably in the range of 3:7 to 7:3. The ratio is more preferably in the range of 3.5:6.5 to 6.5:3.5. The resin used in the hybrid is not particularly limited when the resin is photopolymerizable, and can be the radical polymerization system or cation polymerization system.

Further, from the viewpoints of improving transfer velocity and accuracy of the hardened sol-gel material layer by the hybrid, it is also possible to add modified silicone and reactive silicone.

Specific examples of commercially available modified silicones are TSF4421 (made by GE Toshiba silicone corporation), XF42-334 (made by GE Toshiba silicone corporation), XF42-B3629 (made by GE Toshiba silicone corporation), XF4213-3161 (made by GE Toshiba silicone corporation), FZ-3720 (made by Dow Corning Toray Co., Ltd.), BY16-839 (made by Dow Corning Toray Co., Ltd.), SF8411 (made by Dow Corning Toray Co., Ltd.), FZ-3736 (made by Dow Corning Toray Co., Ltd.), BY-16-876 (made by Dow Corning Toray Co., Ltd.), SF8421 (made by Dow Corning Toray Co., Ltd.), SF8416 (made by Dow Corning Toray Co., Ltd.), SH203 (made by Dow Corning Toray Co., Ltd.), SH230 (made by Dow Corning Toray Co., Ltd.), SH510 (made by Dow Corning Toray Co., Ltd.), SH550 (made by Dow Corning Toray Co., Ltd.), SH710 (made by Dow Corning Toray Co., Ltd.), SF8419 (made by Dow Corning Toray Co., Ltd.), SF8422 (made by Dow Corning Toray Co., Ltd.), BY16 series (made by Dow Corning Toray Co., Ltd.), FZ3785 (made by Dow Corning Toray Co., Ltd.), KF-410 (made by Shin-Etsu Chemical Co., Ltd.), KF-412 (made by Shin-Etsu Chemical Co., Ltd.), KF-413 (made by Shin-Etsu Chemical Co., Ltd.), KF-414 (made by Shin-Etsu Chemical Co., Ltd.), KF-415 (made by Shin-Etsu Chemical Co., Ltd.), KF-351A (made by Shin-Etsu Chemical Co., Ltd.), KF-4003 (made by Shin-Etsu Chemical Co., Ltd.), KF-4701 (made by Shin-Etsu Chemical Co., Ltd.), KF-4917 (made by Shin-Etsu Chemical Co., Ltd.), KF-7235B (made by Shin-Etsu Chemical Co., Ltd.), KR-213 (made by Shin-Etsu Chemical Co., Ltd.), KR500 (made by Shin-Etsu Chemical Co., Ltd.), KF-9701 (made by Shin-Etsu Chemical Co., Ltd.), X21-5841 (made by Shin-Etsu Chemical Co., Ltd.), X-22-2000 (made by Shin-Etsu Chemical Co., Ltd.), X-22-3710 (made by Shin-Etsu Chemical Co., Ltd.), X-22-7322 (made by Shin-Etsu Chemical Co., Ltd.), X-22-1877 (made by Shin-Etsu Chemical Co., Ltd.), X-22-2516 (made by Shin-Etsu Chemical Co., Ltd.), and PAM-E (made by Shin-Etsu Chemical Co., Ltd.).

Examples of the active silicone are amino modification, epoxy modification, carboxyl modification, carbinol modification, methacryl modification, mercapto modification, phenol modification, one-terminal reactivity, and hetero-function modification.

Further, by containing a silicone compound containing one of a vinyl group, methacrylic group, amino group, epoxy group and alicyclic epoxy group, it is possible to use a hardening reaction by light irradiation at the same time, transfer accuracy and velocity improves, and such a compound is preferable. Particularly, by containing a silicone compound containing one of a vinyl group, methacrylic group, epoxy group and alicyclic epoxy group, it is possible to exert the above-mentioned effects more, and such a compound is preferable.

From the viewpoint of transfer accuracy of the fine concavo-convex structure, it is preferable to contain a silicone compound containing either the vinyl group or the methacrylic group. Further, from the viewpoint of adhesion between the substrate and the sol-gel material layer in transferring the sol-gel material layer 13 to the substrate, it is preferable to contain a silicone compound containing either the epoxy group or the alicyclic epoxy group. As the silicone compound containing one of the vinyl group, methacrylic group, amino group, epoxy group and alicyclic epoxy group, only one kind may be used, or a plurality of kinds may be used.

Silicone having photopolymerizable groups and silicone without photopolymerizable groups may be used together or may be used alone.

Examples of the silicone compound having vinyl groups are KR-2020 (made by Shin-Etsu silicone corporation), X-40-2667 (made by Shin-Etsu silicone corporation), CY52-162 (made by Dow Corning Toray Co., Ltd.), CY52-190 (made by Dow Corning Toray Co., Ltd.), CY52-276 (made by Dow Corning Toray Co., Ltd.), CY52-205 (made by Dow Corning Toray Co., Ltd.), SE1885 (made by Dow Corning Toray Co., Ltd.), SE1886 (made by Dow Corning Toray Co., Ltd.), SR-7010 (made by Dow Corning Toray Co., Ltd.), and XE5844 (made by GE Toshiba silicone corporation).

Examples of the silicone compound having methacrylic groups are X-22-164 (made by Shin-Etsu silicone corporation), X-22-164AS (made by Shin-Etsu silicone corporation), X-22-164A (made by Shin-Etsu silicone corporation), X-22-164B (made by Shin-Etsu silicone corporation), X-22-

164C (made by Shin-Etsu silicone corporation), and X-22-164E (made by Shin-Etsu silicone corporation).

Examples of the silicone compound having amino groups are PAM-E (made by Shin-Etsu silicone corporation), KF-8010 (made by Shin-Etsu silicone corporation), X-22-161A (made by Shin-Etsu silicone corporation), X-22-161B (made by Shin-Etsu silicone corporation), KF-8012 (made by Shin-Etsu silicone corporation), KF-8008 (made by Shin-Etsu silicone corporation), X-22-1661-3 (made by Shin-Etsu silicone corporation), TSF4700 (made by Momentive Performance Materials Japan corporation), TSF4701 (made by Momentive Performance Materials Japan corporation), TSF4702 (made by Momentive Performance Materials Japan corporation), TSF4703 (made by Momentive Performance Materials Japan corporation), TSF4704 (made by Momentive Performance Materials Japan corporation), TSF4705 (made by Momentive Performance Materials Japan corporation), TSF4706 (made by Momentive Performance Materials Japan corporation), TSF4707 (made by Momentive Performance Materials Japan corporation), TSF4708 (made by Momentive Performance Materials Japan corporation), and TSF4709 (made by Momentive Performance Materials Japan corporation).

Examples of the silicone compound having epoxy groups are X-22-163 (made by Shin-Etsu silicone corporation), KF-105 (made by Shin-Etsu silicone corporation), X-22-163A (made by Shin-Etsu silicone corporation), X-22-163B (made by Shin-Etsu silicone corporation), X-22-163C (made by Shin-Etsu silicone corporation), TSF-4730 (made by Momentive Performance Materials Japan corporation) and YF3965 (made by Momentive Performance Materials Japan corporation).

Examples of the silicone having alicyclic epoxy groups are X-22-169AS (made by Shin-Etsu silicone corporation), and X-22-169B (made by Shin-Etsu silicone corporation).

From the viewpoints of improvements in transfer accuracy and velocity by hybrid, it is also possible to use publicly known general photopolymerizable resins as well as the above-mentioned modified silicones and reactive silicones. As resins of photopolymerizable radical polymerization system, it is preferable to use resins obtained by removing fluorine-containing (meth)acrylate from above-mentioned resins of photopolymerizable radical polymerization system constituting the resin layer 12.

Further, the inorganic layer 13 may contain functional fine particles. By this means, improvements in the refractive index are made ease, and it is possible to provide functions such as electric conductivity, light catalyst capability and light scattering property. In addition, it is more preferable that the functional fine particles added to the inorganic layer 13 have a concentration gradient that gradually decreases from the upper surface (surface on the side opposite to the resin layer 12) to the lower surface (surface on the resin layer 12 side) in the inorganic layer 13. By thus providing the functional fine particles with the concentration gradient, it is possible to change the refractive index of the inorganic layer 13 gradually inside the layer. By this means, it is possible to reduce the difference in the refractive index between the inorganic layer 13 and an inorganic substrate in the interface with the inorganic substrate to be laminated later, and to suppress reflection in the interface. By thus providing the fine concavo-convex structure on the surface of the inorganic layer 13, while providing the functional fine particles with the concentration gradient in the inorganic layer 13, it is possible to reduce reflectance and to enhance transmittance. In addition, similarly, to change the dielectric constant, electric conductivity, magnetic susceptibility or the like gradually in the inorganic layer 13, the functional fine particles may be provided with a concentration gradient.

Embodiment 2

Embodiment 2 will be described next. In Embodiment 2, as the inorganic layer 13, used is an inorganic material layer that is a layer in which an unhardened sol-gel material is further contained in the hardened material of the sol-gel material. By thus using the hardened material of the sol-gel material, control of the refractive index is made ease. Further, the sol-gel material is added to voids and the like existing in the hardened material of the sol-gel material to fill the voids, and it is thereby possible to obtain the effects such as improvements in the refractive index and improvements in physical strength. Furthermore, since the unhardened sol-gel material functions as an adhesive, it is possible to laminate the inorganic material layer to another substrate. As a method of containing a unhardened sol-gel material in the hardened material of the sol-gel material, there are a method of immersing the hardened material in a solution of the sol-gel material, another method of exposing the hardened material to vapor of the sol-gel material, and the like.

In addition, the unhardened sol-gel material includes a partially hardened material of the sol-gel material. As the inorganic material layer, it is preferable that the unhardened sol-gel material contains a partially hardened material of the sol-gel material. The partially hardened material of the sol-gel material is a state in which the polymerization reaction of the sol-gel material partially proceeds and unreacted functional groups remain. When heat, light or the like is further applied to the partially hardened material, the unreacted functional groups are condensed, and hardening further proceeds. Thus, the partially hardened material of the sol-gel material also functions as an adhesive, and is thereby capable of being contained in the unhardened sol-gel material.

As the sol-gel material forming the inorganic material layer, it is possible to use the same material as the sol-gel material forming the hardened sol-gel material layer according to above-mentioned Embodiment 1. The sol-gel material forming the inorganic material layer may be a hybrid containing inorganic segments and organic segments, from the viewpoints of transfer velocity and transfer accuracy of the inorganic material layer. As the hybrid, it is possible to use the same material as in the hardened sol-gel material layer according to Embodiment 1. Further, it is preferable that the inorganic material layer contains functional fine particles. By this means, improvements in the refractive index are made ease, and it is possible to provide functions such as electric conductivity, light catalyst capability and light scattering property.

In addition, it is more preferable that the functional fine particles added to the inorganic material layer have a concentration gradient that gradually decreases from the upper surface (surface on the side opposite to the resin layer 12) to the lower surface (surface on the resin layer 12 side) in the inorganic material layer. By thus providing the functional fine particles with the concentration gradient, it is possible to change the refractive index of the inorganic material layer gradually inside the layer. By this means, it is possible to reduce the difference in the refractive index between the inorganic material layer and an inorganic substrate in the interface with the inorganic substrate to be laminated later, and to suppress reflection in the interFace. By thus providing the fine concavo-convex structure on the surface of the inorganic material layer, while providing the functional fine particles with the concentration gradient in the inorganic material layer, it is possible to reduce reflectance and to enhance transmittance. In addition, similarly, to change the dielectric constant, electric conductivity, magnetic susceptibility or the like gradually in the inorganic material layer, the functional fine particles may be provided with a concentration gradient.

Embodiment 3

Embodiment 3 will be described next. In Embodiment 3, as the inorganic layer 13, used is an inorganic fine-particle layer that is a layer containing a mixture of inorganic fine particles, binder polymer and sol-gel material. The inorganic fine-particle layer is a layer containing a mixture of inorganic fine particles, binder polymer and sol-gel material. By fixing inorganic fine particles with binder polymer, and adding the sol-gel material to voids thereof, since it is possible to fill voids of the inorganic fine-particle layer with the sol-gel material, it is possible to obtain the effects such as improvements in the refractive index and improvements in physical strength. Further, since the sol-gel material functions as an adhesive, it is possible to laminate the inorganic fine-particle layer to another substrate.

As the sol-gel material forming the inorganic fine-particle layer, it is possible to use the same material as the material forming the hardened sol-gel material layer according to above-mentioned Embodiment 1. Further, the sol-gel material forming the inorganic fine-particle layer may be a hybrid containing inorganic segments and organic segments, from the viewpoints of transfer velocity and transfer accuracy of the inorganic fine-particle layer. As the hybrid, it is possible to use the same material as in the hardened sol-gel material layer according to Embodiment 1.

The inorganic fine particles used in the inorganic fine-particle layer are not particularly limited, as long as the particles are fine particles of inorganic materials excellent in environmental resistance, weather resistance and long-term stability. Examples of the fine particles are metal fine particles made of metal such as titanium, zinc, tungsten, cadmium, indium, niobium, manganese, tin, iron and silver, fine particles made of metal oxide such as titanium oxide, zinc oxide, tungsten oxide, cadmium oxide, indium oxide, niobium oxide, manganese oxide, iron oxide, tin oxide, and silver oxide tin, and carbon fine particles such as carbon black, carbon nanotube and fullerene. As the shape of the fine particles, there are various shapes such as the shape of a ball, the shape of a particle, the shape of a stick, the shape of a needle, the hollow shape, and the random shape. The surface of the fine particle may be modified with a silane coupling agent or the like. The diameter of the fine particle is preferably 0.8 time the opening width of the fine concavo-convex portion or less so that the fine particles are capable of being filled inside the fine concavo-convex portion. Further, when the diameter is 0.5 time the opening width of the fine concavo-convex portion or less, since the particles are filled easier, the diameter is preferable. The diameter is further preferably 0.3 time or less. Herein, the opening width of the fine concavo-convex portion indicates an adjacent distance between convex portions (or concave portions) of the fine concavo-convex structure, and is defined as a distance between convex-portion vertexes (or a distance between concavo-portion bottom vertexes). In addition, it is possible to select various parameters such as the material, shape and size of the inorganic fine particles as appropriate in accordance with required physical properties, dispersion properties and the like.

In addition, it is desirable that the rate (volume %) made by the inorganic fine particles in the inorganic fine-particle layer is higher than the rate (volume %) made by the other elements (binder polymer, and sol-gel material). The reason is that control of the refractive index due to the inorganic fine particles is made ease by increasing the rate of the inorganic fine particles. More specifically, the rate made by the inorganic fine particles ranges from 10% to 90% (volume %). Further, the rate more preferably ranges from 20% to 90% to exert the effect by the inorganic fine particles more, and further preferably ranges from 20% to 80% since the dispersion property to the binder polymer is excellent.

The binder polymer used in the inorganic fine-particle layer is not particularly limited, as long as the polymer is a material that functions as a binder to bind the inorganic fine particles. For example, it is possible to use a hardened material and unhardened material of the above-mentioned photopolymerizable mixture. Further, a material may be used which is obtained by removing the fluorine component from the photopolymerizable mixture. Furthermore, a material may be used which is obtained by adding the photopolymerizable mixture to polyvinyl pyrolidone (PVP), polyvinyl alcohol (PVA), polypropylene (PP), polyethylene (PE), polyvinylidene fluoride (PVDF), N-methyl-2-pyrolidone (NMP), acrylic resin (PMMA), polydimethyl siloxane (PDMS), paraffin wax, silicone oil or the like.

It is preferable that the inorganic fine-particle layer contains a partially hardened material of the above-mentioned sol-gel material. The partially hardened material of the sol-gel material is a state in which the polymerization reaction of the sol-gel material partially proceeds and unreacted functional groups remain. When heat, light or the like is further applied to the partially hardened material, the unreacted functional groups react, and hardening further proceeds. Therefore, by laminating the inorganic fine-particle layer of the fine-structure layered product 1 to the surface of an inorganic substrate or the like and hardening the partially hardened material of the sol-gel material, it is possible to form the fine concavo-convex structure mainly formed of inorganic materials on the inorganic substrate. Therefore, it is possible to provide the substrate having the fine concavo-convex structure excellent in environmental resistance and weather resistance, using the above-mentioned fine-structure layered product 1. In addition, to obtain the fine concavo-convex structure mainly formed of inorganic materials, it is desirable that the content of the binder polymer in the inorganic fine-particle layer ranges from 1% to 50%. The content preferably ranges from 5% to 50% so as to make fixation of inorganic fine particles excellent, and further preferably ranges from 5% to 30% so as to decrease the organic content to enhance weather resistance.

Embodiment 4

Embodiment 4 will be described next. In Embodiment 4, as the inorganic layer 13, used is a semi-hardened sol-gel material layer that is a partially hardened material of the sol-gel material. The semi-hardened sol-gel material layer contains a partially hardened material of the sol-gel material. The partially hardened material of the sol-gel material refers to a state in which the polymerization reaction of the sol-gel material partially proceeds, and the viscosity of the material thereby increases to the extent that allows the shape to be held as the gel material, and is in a state in which unreacted functional groups remain. When heat, light or the like is further applied to the partially hardened material, the unreacted functional groups are condensed, and hardening further proceeds. Therefore, by laminating the semi-hardened sol-gel material layer of the fine-structure layered product 1 to the surface of an inorganic substrate or the like and hardening the semi-hardened sol-gel material layer, it is possible to form the substrate having the fine concavo-convex structure only with inorganic materials. Therefore, it is possible to provide the substrate having the fine concavo-convex structure excellent in environmental resistance and weather resistance, using the above-mentioned fine-structure layered product 1. In addition, since the fine-structure layered product 1 is laminated to the surface of the inorganic substrate or the like and used, the semi-hardened sol-gel material layer is preferably of a viscosity state having a surface tack property to the extent of being laminated.

In addition, as the sol-gel material forming the semi-hardened sol-gel material layer, it is possible to use the same material as the sol-gel material forming the hardened sol-gel material layer according to above-mentioned Embodiment 1. Further, the sol-gel material forming the semi-hardened sol-gel material layer may be a hybrid containing inorganic segments and organic segments, from the viewpoints of transfer velocity and transfer accuracy of the semi-hardened sol-gel material layer. As the hybrid, it is possible to use the same material as in the hardened sol-gel material layer according to Embodiment 1.

Further, it is also preferable to provide the inside material with hardening velocity variations in partial hardening of the semi-hardened sol-gel material layer to cause partial layer separation, and provide functionality in the thickness direction. For example, by gradually changing the refractive index, dielectric constant, electric conductivity, and magnetic susceptibility in the thickness direction, it is possible to use the layer as a functional film.

In addition, it is more preferable that functional fine particles added to the semi-hardened sol-gel material layer have a concentration gradient that gradually decreases from the upper surface (surface on the side opposite to the resin layer 12) to the lower surface (surface on the resin layer 12 side) in the semi-hardened sol-gel material layer. By thus providing the functional fine particles with the concentration gradient, it is possible to change the refractive index of the semi-hardened sol-gel material layer gradually inside the layer. By this means, it is possible to reduce the difference in the refractive index between the semi-hardened sol-gel material layer and an inorganic substrate in the interface with the inorganic substrate to be laminated later, and to suppress reflection in the interface. By thus providing the fine concavo-convex structure on the surface of the semi-hardened sol-gel material layer, while providing the functional fine particles with the concentration gradient in the semi-hardened sol-gel material layer, it is possible to reduce reflectance and to enhance transmittance. In addition, similarly, to change the dielectric constant, electric conductivity, magnetic susceptibility or the like gradually in the semi-hardened sol-gel material layer, the functional fine particles may be provided with a concentration gradient.

Hereinafter, the hardened sol-gel material layer (hardened material layer of the sol-gel material), semi-hardened sol-gel material layer, inorganic fine-particle layer and inorganic material layer are collectively described as the inorganic layer 13. The description described as the inorganic layer 13 means the description common to the hardened sol-gel material layer (hardened material layer of the sol-gel material), semi-hardened sol-gel material layer, inorganic fine-particle layer and inorganic material layer, and the description using one of the hardened sol-gel material layer (hardened material layer of the sol-gel material), semi-hardened sol-gel material layer, inorganic fine-particle layer and inorganic material layer means the respective description.

As the inorganic layer 13, it is preferable to contain at least one kind of metal alkoxide, hardened material of metal alkoxide and partially hardened material of metal alkoxide. By this means, peeling of the inorganic layer is made ease and control of the refractive index is made ease.

When the hardened sol-gel material layer, semi-hardened sol-gel material layer, and inorganic material layer are used as the inorganic layer 13, it is possible to contain functional fine particles to provide functionality such as control of the refractive index of the hardened material and improvements of strength. Examples of the functional fine particles are metal oxide, metal fine particles, and carbon fine particles. Examples of the metal oxide are silica, titania, zirconia, ceria, alumina, zinc oxide and tin oxide. Examples of carbon fine particles are carbon black, carbon nanotube and fullerene. As the shape of the fine particles, there are various shapes such as the shape of a ball, the shape of a particle, the shape of a stick, the shape of a needle, the hollow shape, and the random shape. The surface of the fine particle may be modified with a silane coupling agent or the like.

In addition, the inorganic layer 13 is laminated to the inorganic substrate, and is used as an optical element or the like. Therefore, although depending on the application, it is preferable that an adjacent distance (distance between convex-portion vertexes) between convex portions of the inorganic layer 13 is small, and that a height (height from the bottom of the concave portion to the vertex of the convex portion) of the convex portion is large. Herein, the concave portion refers to a portion higher than the average height of the fine concavo-convex structure, and the concave portion refers to a portion lower than the average height of the fine concavo-convex structure. In addition, the shape of the fine concavo-convex structure is capable of being designed as appropriate in accordance with the wavelength to apply. Further, the inorganic substrate is preferably provided on the surface on the side opposite to the surface having the fine concavo-convex structure of the inorganic layer 13.

Figure 2:
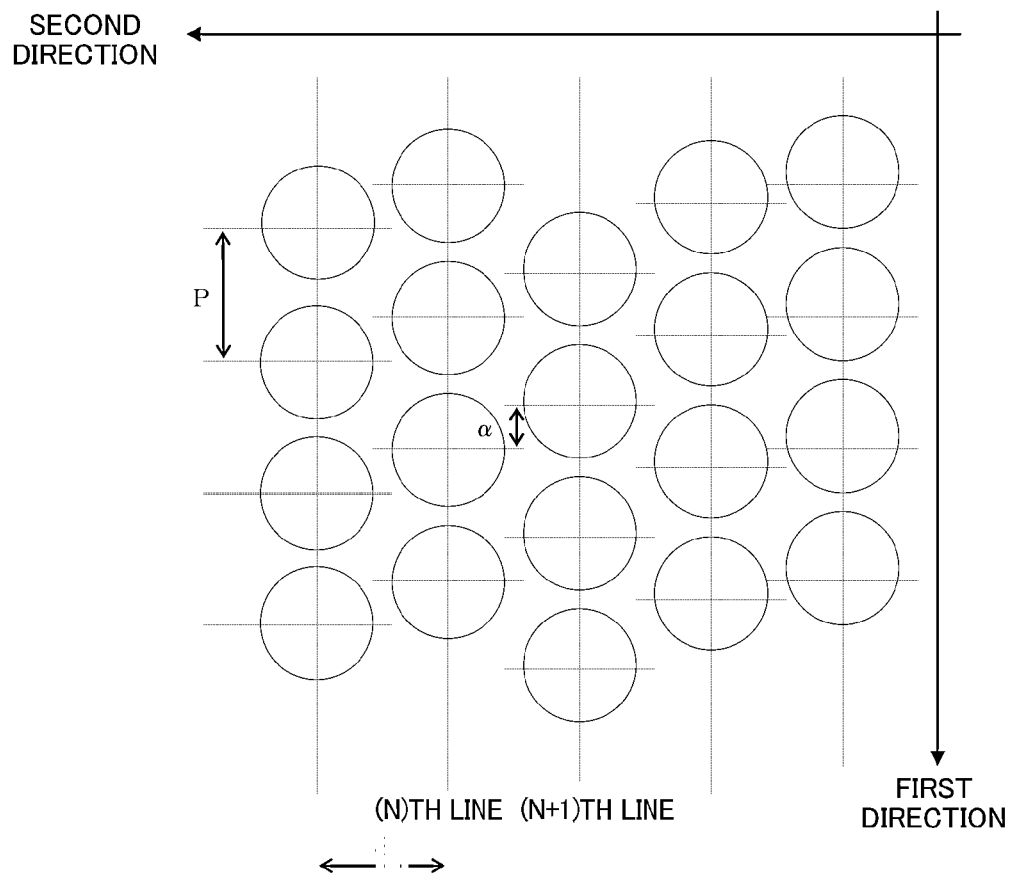
FIG. 2 is a plan schematic view showing an arrangement of convex portions or concave portions of the fine-structure layered product according to the first aspect.

Further, in the concavo-convex arrangement of the fine concavo-convex structure of the inorganic layer 13, as shown in FIG. 2, in the first direction and the second direction that are orthogonal inside the surface, convex portions (or concavo portions) are arranged with a pitch P in the first direction, and convex portions (or concavo portions) are arranged with a pitch S in the second direction. Further, the arrangement of the fine concavo-convex structure may be an arrangement having both periodicity and non-periodicity such that regularity of a phase difference α in the first direction between convex portions (or concave portions) forming lines in the second direction is low. The pitch P and pitch S are capable of being designed as appropriate corresponding to intended usage. In addition, the phase difference α means a distance between line segments (second direction) passing through the centers of the most adjacent convex portions in the adjacent lines (first direction). More specifically, as shown in FIG. 2, the phase difference means the distance between the line segment in the second direction passing through the center of some convex portion (or concave portion) in the Nth line forming the line in the first direction and the line segment in the second direction passing through the center of some convex portion (or concave portion) in the (N+1)th line with the shortest distance from the convex portion (or concave-portion).

For example, for display uses and like, in the case of desiring to suppress the reflectance and increase the transmittance in the visible-light region (400 nm to 780 nm), the adjacent distance between convex portions is preferably in the range of 1 nm to 300 nm, and is more preferably in the range of 1 nm to 150 nm. Thus, when the adjacent distance between convex portions is 150 nm or less, it is possible to also suppress the angle dependence of reflectance without causing diffraction light in the visible-light region. Similarly, the height of the convex portion is preferably in the range of 1 nm to 1,000 nm, and is more preferably in the range of 100 nm to 500 nm. Although the higher convex-portion height is preferable, when the aspect ratio that is the ratio between the adjacent distance and the height is 3 or more, the fine-structure layered product of the invention is hard to release in transferring to an inorganic substrate. Therefore, based on the above-mentioned design idea, it is preferable to design the fine concavo-convex structure so that the aspect ratio is less than 3.

Further, for example, since the spectral sensitivity of crystal-system silicon solar battery has the peak in the near-infrared region (700 nm to 1,000 nm), the uppermost surface member for the solar battery is required to have excellent transmittance in this wavelength region. In the case of thus desiring to suppress the reflectance and increase the transmittance in the near-infrared region, the adjacent distance between convex portions is preferably in the range of 300 nm to 2,000 nm, and is more preferably in the range of 500 nm to 1,000 nm. Further, the height of the convex portion is preferably in the range of 1 nm to 5,000 nm, and is more preferably in the range of 1,000 nm to 5,000 nm. In addition, also in this case, it is preferable to design the fine concavo-convex structure so that the aspect ratio is less than 3.

Figure 3:
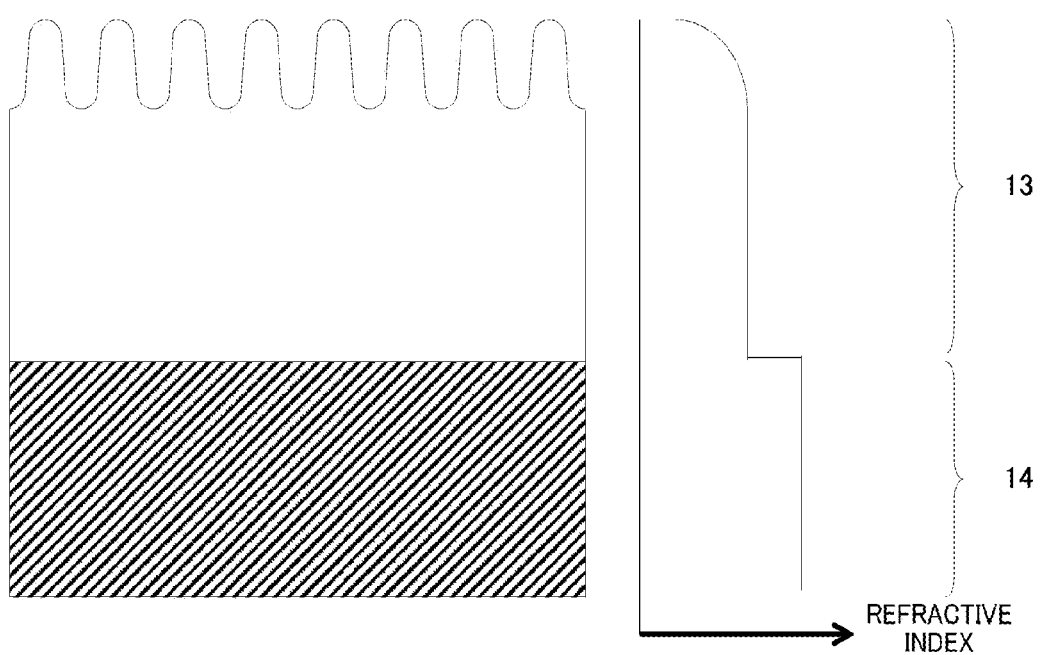
FIG. 3 is a schematic view showing that a refractive index difference exists in an interface between a hardened sol-gel material layer and an inorganic substrate in the fine-structure layered product according to the first aspect.
Figure 4:
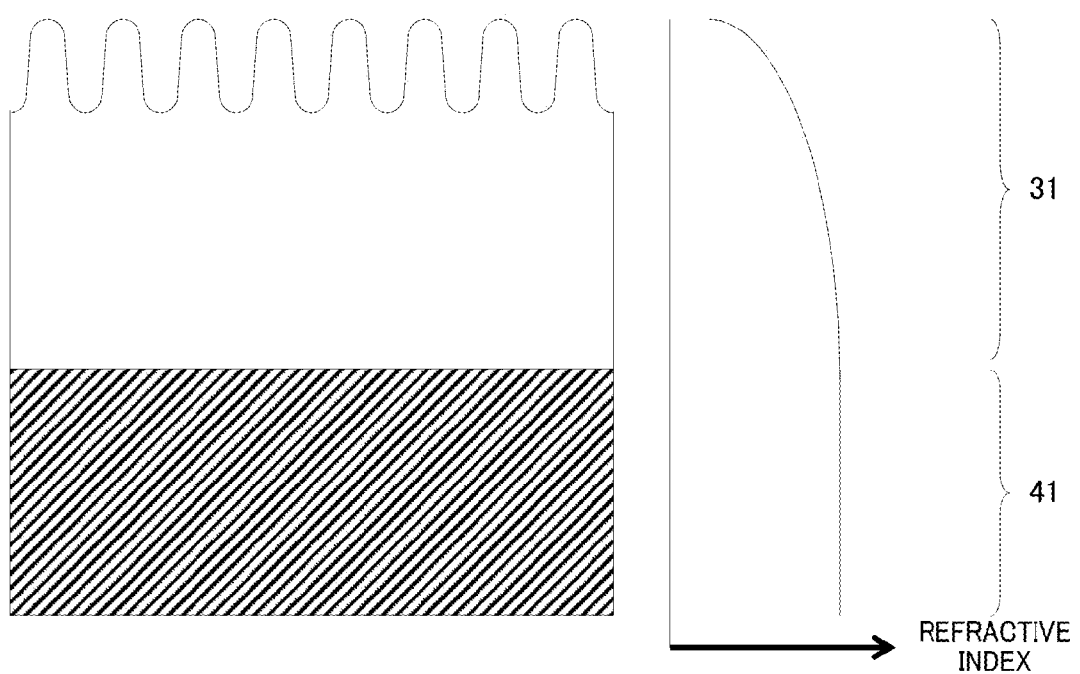
FIG. 4 is a schematic view showing that the refractive index changes gently in the hardened sol-gel material layer in the fine-structure layered product according to the first aspect.

In addition, when the hardened sol-gel material layer is used as the inorganic layer 13, due to properties of the hardened sol-gel material layer which is laminated to an inorganic substrate and is used as an optical element or the like, the interface between the inorganic substrate and the hardened sol-gel material layer becomes a problem. Herein, as shown in FIG. 3, when a difference in the refractive index exists in the interface between the inorganic layer 13 as the hardened sol-gel material layer and the inorganic material 14, reflection of light increases in the interface. Therefore, as shown in FIG. 4, it is preferable to add functional fine particles to the inorganic layer 13, form a concentration gradient of the functional fine particles in the inorganic layer 13 to smoothly change the refractive index inside the inorganic layer 13, and thereby suppress interface reflection. Particularly, the concentration gradient due to the functional fine particles preferably gradually decreases or increases from the upper surface (surface on the side opposite to the resin layer 12) to the lower surface (surface on the resin layer 12 side) in the inorganic layer 13, and more preferably decreases. Further, in the interface between the inorganic layer 13 and the inorganic substrate 14, it is more preferable that the refractive indexes thereof are substantially equal. Herein, the refractive indexes being substantially equal includes cases of having differences in the refractive index to the extent that reflection in the interface does not become a problem as optical usage. For example, when the refractive index of the inorganic material 14 is 1.45, to achieve the interface reflectance of 0.1% or less that does not become the problem as optical usage, the refractive index of the inorganic layer 13 in the interface needs to be in the range of 1.37 to 1.54. Therefore, the substantially equal refractive indexes include the above-mentioned range. In addition, these values are adjusted as appropriate by the required interface reflectance. For example, in the case of requiring the interface reflectance of 0.05% or less when the refractive index of the inorganic substrate 14 is 1.45, the refractive index of the inorganic layer 13 hardened sol-gel material layer in the interface is only required to be 1.39 to 1.51.

In addition, similarly, to change the dielectric constant, electric conductivity, magnetic susceptibility or the like gradually in the inorganic layer 13, a concentration gradient due to functional fine particles may be formed in the hardened sol-gel material layer.

Further, for the purpose of improving leveling properties, hardening control, refractive index control, adhesion with the inorganic substrate, film thickness control and the like, it is possible to contain additives such as polymer and binder in the hardened sol-gel material layer, semi-hardened sol-gel material layer, and inorganic material layer. As the additives, it is further possible to use an anti-form agent, dispersing agent, silane coupling agent, thick hardening agent and the like.

Further, when the hardened sol-gel material layer is used as the inorganic layer 13, the surface on the frontside (the side opposite to the resin layer 12) of the hardened sol-gel material layer is a flattened flat surface. By thus flattening the surface of the hardened sol-gel material layer, it is possible to suitably perform subsequent laminating to the inorganic substrate and the like. Further, it is possible to keep optical properties of the formed optical element excellent. In addition, flattening described herein only means that the surface is flattened to the extent that a concavo-convex structure such as the fine concavo-convex structure is not formed, and is not required to form a precise flat surface (smooth surface).

The manufacturing method of the flat surface is not limited particularly, and for example, it is possible to obtain a flat surface by applying a diluent of the sol-gel material onto a film or wafer, volatilizing the solvent, next laminating to the fine concavo-convex structure of the resin layer 12, hardening the sol-gel material, and then peeling off the film.

Herein, as the above-mentioned film, for example, there are films comprised of amorphous thermoplastic resins such as polyvinyl alcohol resin, polyacrylonitrile resin, methyl polymethacrylate resin, polycarbonate resin, polystyrene resin, cycloolefin resin (COP), cross-linked polyethylene resin, polyvinyl chloride resin, polyvinyl chloride copolymer resin, polyvinylidene chloride resin, polyvinylidene chloride copolymer resin, polyarylate resin, polyphenylene ether resin, modified polyphenylene ether resin, polyether imide resin, polyether sulfone resin, polysulfone resin and polyether ketone resin, crystalline thermoplastic resins such as polyethylene terephthalate (PET) resin, polyethylene naphthalate resin, polyethylene resin, polypropylene resin, polybutylene terephthalate resin, aromatic polyester resin, polyacetal resin, polyamide resin and polyimide resin, and ultraviolet (UV)-curable resins and thermosetting resins of acrylic system, epoxy system, urethane system and the like, etc. Further, films may be used which are comprised of complex materials obtained by combining the UV-curable resin or thermosetting resin with inorganic substrate of glass or the like, the thermoplastic resin, triacetate resin and the like. Furthermore, films may be used which are obtained by depositing metal such as Al, Au, Ag, Cu, Zn, Ce, Ti and In, alloys thereof, oxides thereof, compounds thereof and like on the above-mentioned film substrate.

As the wafer, for example, there are silicon wafers and the like.

Further, a mold release layer to decrease the adhesion strength between the film or wafer and the hardened sol-gel material layer may be provided between the film or wafer and the hardened sol-gel material layer. It is possible to form the mold release layer using a surface modifier(s) with the purpose of providing abrasion resistance, scratch resistance, fingerprint adhesion prevention, antifouling property, leveling properties, water repellency, oil repellency and the like. Examples of the surface modifiers are perfluoro alkyl alkylene alkoxy silane compounds such as triethoxy-1H,1H,2H, 2H-tridecafluoro-octylsilane, heptadecafluorodecyl-trimethoxysilane, $CF_3(CF_2)_4CH_2CH_2Si(OC_2H_5)_3$, $CF_3(CF_2)_4CH_2CH_2SiCH_3(OC_2H_5)_2$, $CF_3(CF_2)_7CH_2CH_2Si(OC_2H_7)_3$, $CF_3CF_2CH_2CH_2Si(OC_3H_7)_3$, $CF_3(CF_2)_2CH_2CH_2Si(OC_3H_7)_3$, $(CF_3(CF_2)_4CH_2CH_2SiCH_3(OC_3H_7)_2$, $CF_3(CF_2)_5CH_2CH_2SiCH_3(OC_3H_7)_2$, and $CF_3(CF_2)_7CH_2CH_2SiCH_3(OC_3H_7)_2$. Further, examples of commercially available surface modifiers are "FTERGENT" made by NEOS Company Limited (for example, M series: FTERGENT 251, FTERGENT 215M, FTERGENT 250, FTX-245M, FTX-290M; S series: FTX-207S, FTX-211S, FTX-220S, FTX-230S; F series: FTX-209F, FTX-213F, FTERGENT 222F, FTX-233F, FTERGENT 245F; G series: FTERGENT 208G, FTX-218G, FTX-230G, FTS-240G; Oligomer series: FTERGENT 730FM, FTERGENT 730LM, FTERGENT P series: FTERGENT 710FL, FTX-710HL, etc.), "MEGAFAC" made by DIC Corporation (for example, F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, etc.), "OPTOOL (Registered Trademark)" (for example, DSX, DAC, AES), "EFTONE (Registered Trademark)" (for example, AT-100), "ZEFFLE (Registered Trademark)" (for example, GH-701), "UNIDYNE (Registered Trademark)", "DAIFREE (Registered Trademark)" and "OPTOACE (Registered Trademark)" made by Daikin Industries, Ltd., "Novec EGC-1720" made by Sumitomo 3M Limited, and "Fluoro Surf (Registered Trademark)" made by Fluoro Technology.

In addition, in laminating the hardened sol-gel material layer and the inorganic substrate, the sol-gel material, a partially hardened material of the sol-gel material or the like may be used as an adhesive.

Figure 5A:
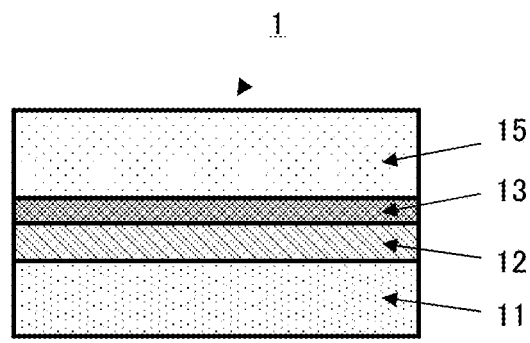
FIG. 5 contains section schematic views showing section structures of other examples of the fine-structure layered product according to the first aspect.

FIG. 5 contains section schematic views showing the fine-structure layered product 1 of the aspect different from FIG. 1. In the fine-structure layered product 1 as shown in FIG. 5A, a film (resin film) 15 is provided on the surface on the side opposite to the resin layer 12 of the inorganic layer 13. Such a film 15 acts as a protective film (cover film) to protect the inorganic layer 13 in the roll-to-roll process. By the film 15 being disposed to contact the inorganic layer 13, even in a state in which the sol-gel material is not completely hardened, it is possible to prevent the hardened inorganic layer 13 from adhering to another member in winding the fine-structure layered product 1, and to prevent the inorganic layer 13 from becoming deformed. Herein, the film 15 is peeled in the subsequent process, and therefore, is desirably capable of being peeled easily. At least, it is necessary that the adhesion strength between the inorganic layer 13 and the film 15 is weaker than the adhesion strength between the inorganic layer 13 and the resin layer 12.

Herein, as the film 15, for example, there are films comprised of amorphous thermoplastic resins such as polyvinyl alcohol resin, polyacrylonitrile resin, methyl polymethacrylate resin, polycarbonate resin, polystyrene resin, cycloolefin resin (COP), cross-linked polyethylene resin, polyvinyl chloride resin, polyvinyl chloride copolymer resin, polyvinylidene chloride resin, polyvinylidene chloride copolymer resin, polyarylate resin, polyphenylene ether resin, modified polyphenylene ether resin, polyether imide resin, polyether sulfone resin, polysulfone resin and polyether ketone resin, crystalline thermoplastic resins such as polyethylene terephthalate (PET) resin, polyethylene naphthalate resin, polyethylene resin, polypropylene resin, polybutylene terephthalate resin, aromatic polyester resin, polyacetal resin, polyamide resin and polyimide resin, and ultraviolet (UV)-curable resins and thermosetting resins of acrylic system, epoxy system, urethane system and the like, etc. Further, films may be used which are comprised of complex materials obtained by combining the UV-curable resin or thermosetting resin with inorganic substrate of glass or the like, the thermoplastic resin, triacetate resin and the like. Furthermore, films may be used which are obtained by depositing metal such as Al, Au, Ag, Cu, Zn, Ce, Ti and In, alloys thereof, oxides thereof, compounds thereof and like on the above-mentioned film substrate.

A mold release layer to decrease the adhesion strength between the film 15 and the inorganic layer 13 may be provided between the film 15 and the inorganic layer 13. It is possible to form the mold release layer using a surface modifier(s) with the purpose of providing abrasion resistance, scratch resistance, fingerprint adhesion prevention, antifouling property, leveling properties, water repellency, oil repellency and the like. Examples of the surface modifiers are perfluoro alkyl alkylene alkoxy silane compounds such as triethoxy-1H,1H,2H,2H-tridecafluoro-octylsilane, heptadecafluorodecyl-trimethoxysilane, $CF_3(CF_2)_4CH_2CH_2Si(OC_2H_5)_3$, $CF_3(CF_2)_4CH_2CH_2SiCH_3(OC_2H_5)_2$, $CF_3(CF_2)_7CH_2CH_2Si(OC_2H_7)_3$, $CF_3CF_2CH_2CH_2Si(OC_3H_7)_3$, $CF_3(CF_2)_2CH_2CH_2Si(OC_3H_7)_3$, $CF_3(CF_2)_4CH_2CH_2SiCH_3(OC_3H_7)_2$, $CF_3(CF_2)_5CH_2CH_2SiCH_3(OC_3H_7)_2$, and $CF_3(CF_2)_7CH_2CH_2SiCH_3(OC_3H_7)_2$. Further, examples of commercially available surface modifiers are "FTERGENT" made by NEOS Company Limited (for example, M series: FTERGENT 251, FTERGENT 215M, FTERGENT 250, FTX-245M, FTX-290M; S series: FTX-207S, FTX-211S, FTX-220S, FTX-230S; F series: FTX-209F, FTX-213F, FTERGENT 222F, FTX-233F, FTERGENT 245F; G series: FTERGENT 208G, FTX-218G, FTX-230G, FTS-240G; Oligomer series: FTERGENT 730FM, FTERGENT 730LM, FTERGENT P series: FTERGENT 710FL, FTX-710HL, etc.), "MEGAFAC" made by DIC Corporation (for example, F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, etc.), "OPTOOL (Registered Trademark)" (for example, DSX, DAC, AES), "EFTONE (Registered Trademark)" (for example, AT-100), "ZEFFLE (Registered Trademark)" (for example, GH-701), "UNIDYNE (Registered Trademark)", "DAIFREE (Registered Trademark)" and "OPTOACE (Registered Trademark)" made by Daikin Industries, Ltd., "Novec EGC-1720" made by Sumitomo 3M Limited, and "Fluoro Surf (Registered Trademark)" made by Fluoro Technology.

Figure 5B:
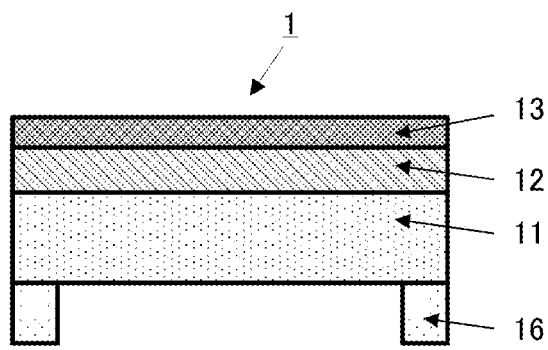

In the fine-structure layered product 1 as shown in FIG. 5B, two long films 16 (bank, spacer) are spaced and disposed at the end portions (edges) on the backside (the side opposite to the resin layer 12) of the substrate 11. Herein, two long films 16 are disposed in the paper depth direction to be substantially parallel in the longitudinal direction. As the above-mentioned film 15, such long films 16 act as a spacer to protect the inorganic layer 13 in the roll-to-roll process. The reason is that by two long films 16, it is possible to prevent the inorganic layer 13 from adhering to another member in winding the fine-structure layered product 1, and to prevent the inorganic layer 13 from becoming deformed. In addition, the thickness of the long film 16 is preferably thicker than the inorganic layer 13. The number of long films 16 may be two or more. Moreover, details of the long film 16 are the same as the film 15.

Figure 5C:
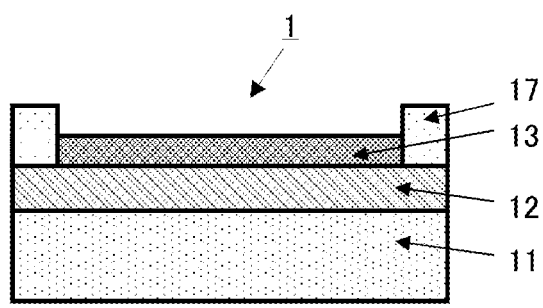

In the fine-structure layered product 1 as shown in FIG. 5C, two long films 17 (bank, spacer) are spaced and disposed at the end portions (edges) on the frontside (the side opposite to the substrate 11) of the resin layer 12. Herein, two long films 17 are disposed in the paper depth direction to be substantially parallel in the longitudinal direction. Further, two long films 17 are disposed in areas corresponding to the ends of the resin layer 12 on the resin layer 12, and the inorganic layer 13 is disposed in an area sandwiched between two long films 17. Such long films 17 also act as a spacer to protect the inorganic layer 13 in the roll-to-roll process. The reason is that by two long films 17, it is possible to prevent the inorganic layer 13 from adhering to another member in winding the fine-structure layered product 1, and to prevent the inorganic layer 13 from becoming deformed. In addition, the thickness of the long film 17 is preferably thicker than the inorganic layer 13. The number of long films 17 may be two or more. Moreover, details of the long film 17 are the same as the film 15.

In addition, the above-mentioned two long films 17 may be disposed at the end portions (edges) on the frontside (the side opposite to the substrate 11) of the hardened sol-gel material layer. In this case, two long films 17 are preferably disposed so that the longitudinal directions thereof are substantially parallel with each other. Further, in the above-mentioned example, it is also possible to arrange two long films 17 or more. Further, when the hardened sol-gel material layer is used as the inorganic layer 13, two long films 17 or more with the thickness thicker than the inorganic layer 13 may be provided on the flattened surface of the inorganic layer 13. In this case, two long films 17 or more are arranged so that the longitudinal directions thereof are substantially parallel with each other.

Described next a preparation method of a fine-structure layered product using the fine-structure layered product 1 according to the first aspect of the invention. In addition, in the following description, it is assumed that the fine-structure layered product according to the above-mentioned Embodiments is the 1st fine-structure layered product 1, and that fine-structure layered products prepared with the 1st fine-structure layered product 1 are 2nd to 15th fine-structure layered products.

FIG. 6 contains views showing outlines of a preparation process of the 1st fine-structure layered product 1 and a preparation method of a fine-structure layered product using the 1st fine-structure layered product 1 according to Embodiments 1 to 3. In addition, shown herein are the manufacturing process of the fine-structure layered product 1 as shown in FIG. 1 and FIG. 5A and the like, but the present invention is not limited thereto.

Figure 6A:
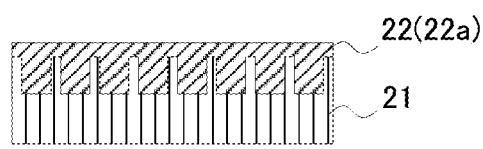
FIG. 6 contains views showing outlines of a preparation process of a first fine-structure layered product 1 and a preparation method of a fine-structure layered product using the first fine-structure layered product 1 according to the first aspect.

Described first is the case of using the fine-structure layered product according to Embodiment 1. As shown in FIG. 6A, a sol-gel material layer 22 is applied and formed on a resin mold 21 with a resin layer having a fine concavo-convex structure provided on a substrate. The sol-gel material layer 22 is dried and hardened, and the 1st fine-structure layered product 1 is prepared. Then, as shown in FIG. 6B, a film 15 is laminated to the hardened sol-gel material layer as the inorganic layer 13 (hereinafter, referred to as a "first inorganic layer") of the 1st fine-structure layered product 1, and the 1st fine-structure layered product 1 is wound in the shape of a reel. In addition, it is also possible to obtain the 1st fine-structure layered product 1 by applying and forming the sol-gel material layer 22 on the film 15, then laminating to the resin mold 21 to perform light irradiation, next winding the 1st fine-structure layered product 1 in the shape of a reel, and curing at temperatures of from 40° C. to 120° C. for about 20 to 60 minutes. Herein, in the region on the frontside of the fine concavo-convex structure of the resin layer (resin mold 21), the fluorine element concentration is increased as compared with the other regions. Further, the film 15 is laminated to the 1st fine-structure layered product 1, but the film 15 may not be used. Furthermore, it is possible to set dry and hardening conditions of the sol-gel material layer 22, for example, at 60° C. to 105° C. for about 1 to 30 minutes.

Figure 6D:
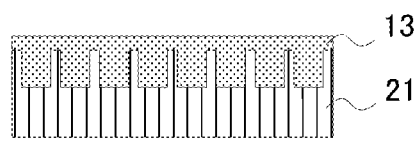
Figure 6B:
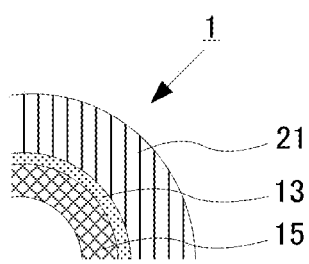
Figure 6E:
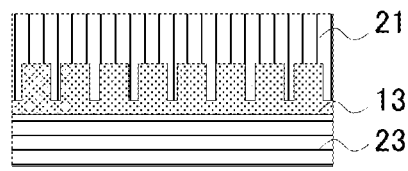
Figure 6F:
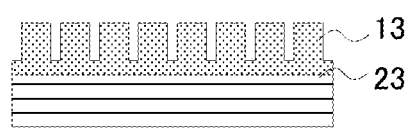
Figure 6C:
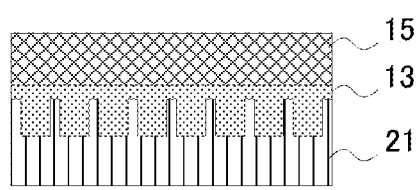

Next, as shown in FIGS. 6C and 6D, the film 15 is peeled off from the 1st fine-structure layered product 1, and the hardened sol-gel material layer is laminated to a substrate 23 made of an inorganic material such as glass via an adhesion layer made of an unhardened sol-gel material layer as shown in FIG. 6E. After irradiating with light, the hardened sol-gel material layer is subjected to heat treatment. It is possible to set the conditions of the heat thermal treatment, for example, at 60° C. to 120° C. for about 10 to 60 minutes under a nitrogen atmosphere. Further, in laminating the substrate 23 and the hardened sol-gel material layer, the sol-gel material, a partially hardened material of the sol-gel material or the like may be used as an adhesive. Furthermore, the sol-gel material may be directly applied onto the fine concavo-convex structure of the resin mold 21, dried and hardened.

Figure 6G:
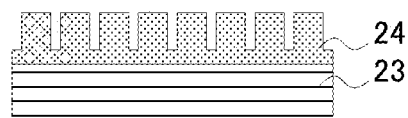

Subsequently, as shown in FIG. 6F, the layered product including the substrate 23 is immersed in toluene or the like, the resin mold 21 is separated in the interface between the resin mold 21 and the hardened sol-gel material layer, and the layered product of the substrate 23 and the hardened sol-gel material layer is obtained. Then, as shown in FIG. 6G, the hardened sol-gel material layer is subjected to heat treatment, an inorganic layer 24 (hardened sol-gel material layer) is obtained, and the 2nd fine-structure layered product 2 is thereby prepared. It is possible to set conditions of the heat treatment, for example, at 300° C. for about 1 hour under a nitrogen atmosphere.

In addition, in the above-mentioned manufacturing process, it is also possible to obtain the layered product of the substrate 23 and the hardened sol-gel material layer by performing heat treatment and ultraviolet irradiation through the resin mold 21 on the layered product including the substrate 23, and then, peeling off the resin mold 21. Then, as shown in FIG. 6G, the hardened sol-gel material layer is subjected to heat treatment, and the inorganic layer 24 (hardened sol-gel material layer) is obtained. It is possible to set conditions of the heat treatment, for example, at 300° C. for about 1 hour under a nitrogen atmosphere.

Further, the above-mentioned manufacturing process may be provided with a process of forming a high-concentration fluorine layer on the fine concavo-convex structure surface of the first inorganic layer 13 of the 2nd fine-structure layered product. By this means, energy on the surface of the first inorganic layer 13 decreases, and it is possible to obtain the 3rd fine-structure layered product provided with the antifouling property and water repellency. In addition, as the high-concentration fluorine layer, from the viewpoints of obtaining the aforementioned effects, the contact angle of water to the fine concavo-convex structure surface of the 3rd fine-structure layered product is preferably larger than 90 degrees. From the viewpoints of exhibiting water repellency performance and antifouling performance more, the angle is more preferably 105 degrees or more, and is preferably 130 degrees or more. The angle is most preferably 140 degrees or more. Further, from the viewpoint of obtaining the super-water repellency surface, the angle is preferably 150 degrees or more.

Furthermore, the above-mentioned manufacturing process may be provided with a process of forming a semi-hardened sol-gel material layer on the fine concavo-convex structure of the first inorganic layer 13 of the 2nd fine-structure layered product 2 or on the high-concentration fluorine layer of the 3rd fine-structure layered product. By this means, it is possible to obtain the 4th fine-structure layered product. Further, an inorganic substrate is placed on the surface on the side opposite to the fine concavo-convex structure of the semi-hardened sol-gel material layer of the 4th fine-structure layered product, and then, the semi-hardened sol-gel material layer is preliminarily hardened. Then, the preliminarily hardened semi-hardened sol-gel material layer is peeled off from the interface with the first inorganic layer 13, and then, by hardening the semi-hardened sol-gel material layer, it is possible to manufacture the 5th fine-structure layered product.

Still furthermore, the above-mentioned manufacturing process may be provided with a process of forming another inorganic layer (hereinafter, referred to as "the second inorganic layer") containing the sol-gel material on the fine concavo-convex structure of the first inorganic layer 13 of the 2nd fine-structure layered product 2 or on the high-concentration fluorine layer of the 3rd fine-structure layered product. By this means, it is possible to manufacture the 6th fine-structure layered product. Further, an organic substrate is placed on the surface on the side opposite to the fine concavo-convex structure of the second inorganic layer of the 6th fine-structure layered product via an adhesive layer including the sol-gel material and is heated, and then, the second inorganic layer is peeled off from the interface with the first inorganic layer 13. Then, by hardening the adhesive layer including the sol-gel material, it is possible to manufacture the 7th fine-structure layered product.

Moreover, the above-mentioned manufacturing process may be provided with a process of forming a resin layer 12 on the fine concavo-convex structure of the first inorganic layer 13 of the 2nd fine-structure layered product 2 or on the high-concentration fluorine layer of the 3rd fine-structure layered product. By this means, it is possible to manufacture the 8th fine-structure layered product. Further, after peeling off the resin layer 12 of the 8th fine-structure layered product in the interface with the first inorganic layer 13, a semi-hardened sol-gel material layer is formed to contact the fine concavo-convex structure of the resin layer 12. Then, an inorganic substrate is placed on the surface on the side opposite to the fine concavo-convex structure of the formed semi-hardened sol-gel material layer, and then, the semi-hardened sol-gel material layer is preliminarily hardened. Finally, the preliminarily hardened semi-hardened sol-gel material layer is peeled off in the interface with the hardened sol-gel material layer, and then, by hardening the preliminarily hardened semi-hardened sol-gel material layer, it is possible to manufacture the 9th fine-structure layered product.

Described next is the case of using the fine-structure layered product 1 according to Embodiment 2 as the 1st fine-structure layered product. First, as shown in FIG. 6A, a sol-gel material layer 22 is applied and formed on a resin mold 21 with a resin layer having a fine concavo-convex structure provided on a substrate. The sol-gel material layer 22 is dried and hardened. Then, the sol-gel material is contained in the hardened sol-gel material layer 22, and the 1st fine-structure layered product 1 including a first inorganic layer 13 (inorganic material layer) is obtained. Then, as shown in FIG. 6B, a film 15 is laminated to the first inorganic layer 13 of the 1st fine-structure layered product 1, and the 1st fine-structure layered product 1 is wound in the shape of a reel. Herein, in the region on the frontside of the fine concavo-convex structure of the resin layer (resin mold 21), the fluorine element concentration is increased as compared with the other regions. Further, a film 15 is laminated to the 1st fine-structure layered product 1, but the film 15 may not be used. Furthermore, it is possible to set dry and hardening conditions of the sol-gel material layer 22, for example, at 60° C. to 105° C. for about 1 to 30 minutes.

In addition, the sol-gel material is directly applied onto the fine concavo-convex structure of the resin mold 21, dried and hardened. Then, the 1st fine-structure layered product 1 including the first inorganic resin layer 13 may be obtained by containing the sol-gel material in the hardened sol-gel material layer 22.

Next, as shown in FIGS. 6C and 6D, the film 15 is peeled off from the 1st fine-structure layered product 1, the inorganic material layer is laminated to a substrate 23 made of an inorganic material such as glass as shown in FIG. 6E, and the sol-gel material of the first inorganic layer 13 is partially hardened. It is possible to set the conditions of partial hardening at 60° C. to 120° C. for about 10 to 60 minutes under a nitrogen atmosphere. Subsequently, as shown in FIGS. 6F and 6G, as in the case of using the fine-structure layered product 1 according to above-mentioned Embodiment 1 as the 1st fine-structure layered product 1, by obtaining an inorganic layer 24 (inorganic material layer) by peeling off the resin mold 21 and performing heat treatment on the first inorganic layer 13 (inorganic material layer), the 2nd fine-structure layered product is prepared.

In addition, as in the case of using the fine-structure layered product 1 according to Embodiment 1, it is also possible to obtain the layered product of the substrate 23 and the first inorganic layer 13 by performing heat treatment and UV irradiation through the resin mold, and then, peeling off the resin mold 21. The 1st fine-structure layered product according to Embodiment 2 is capable of being used in the same manner as the 1st fine-structure layered product according to Embodiment 1, and enables 3rd to 9th fine-structure layered products to be prepared.

Described next is the case of using a fine-structure layered product according to Embodiment 3 as the 1st fine-structure layered product. First, as shown in FIG. 6A, a mixture layer 22a of inorganic fine particles and polymer binder is applied and formed on a resin mold 21 with a resin layer having a fine concavo-convex structure provided on a substrate. The mixture layer 22a is dried and hardened. Then, the sol-gel material is contained in the mixture layer 22a, and the 1st fine-structure layered product 1 including a first inorganic layer 13 (inorganic fine-particle layer) is obtained. Then, as shown in FIG. 6B, a film 15 is laminated to the inorganic fine-particle layer of the 1st fine-structure layered product 1, and the 1st fine-structure layered product 1 is wound in the shape of a reel. Herein, in the region on the frontside of the fine concavo-convex structure of the resin layer (resin mold 21), the fluorine element concentration is increased as compared with the other regions. Further, the film 15 is laminated to the 1st fine-structure layered product 1, but the film 15 may not be used. Furthermore, it is possible to set dry conditions of the mixture layer 22a, for example, at 60° C. to 105° C. for about 1 to 30 minutes. Moreover, hardening of the mixture layer 22a may be light cross-linking using UV light.

Next, as shown in FIGS. 6C and 6D, the film 15 is peeled off from the 1st fine-structure layered product 1, the inorganic fine-particle layer is laminated to a substrate 23 made of an inorganic material such as glass as shown in FIG. 6E, and the sol-gel material of the first inorganic layer 13 (inorganic fine-particle layer) is partially hardened. It is possible to set the conditions of partial hardening, for example, at 60° C. to 120° C. for about 10 to 60 minutes under a nitrogen atmosphere. Subsequently, as shown in FIGS. 6F and 6G, as in the case of using the fine-structure layered product 1 according to above-mentioned Embodiment 1 as the 1st fine-structure layered product, after peeling off the resin mold 21, by completely hardening the first inorganic layer 13 (inorganic fine-particle layer) and obtaining an inorganic layer 24 (hardened material layer) as shown in FIG. 6G, it is possible to obtain the 2nd fine-structure layered product. It is possible to set the conditions of complete hardening, for example, at 300° C. for about 1 hour under a nitrogen atmosphere.

In addition, the 1st fine-structure layered product according to Embodiment 2 is capable of being used in the same manner as the 1st fine-structure layered product according to Embodiment 1, and enables 3rd to 9th fine-structure layered products to be prepared.

[Semi-Hardened Sol-Gel Material Layer]

FIG. 7 contains views showing outlines of a manufacturing process of the 1st fine-structure layered product 1 and a preparation method of a fine-structure layered product using the 1st fine-structure layered product 1 according to Embodiment 4. In addition, shown herein are the manufacturing process of the fine-structure layered product 1 as shown in FIG. 1 and FIG. 5A and the like, but the present invention is not limited thereto.

Figure 7A:
FIG. 7 contains views showing outlines of a manufacturing process of the first fine-structure layered product 1 and a preparation method of a fine-structure layered product using the first fine-structure layered product 1 according to the first aspect.
Figure 7A:
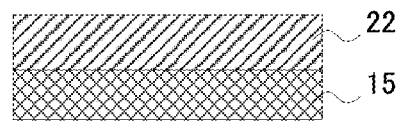

First, as shown in FIG. 7A, prepared are a resin mold 21 with a resin layer having a fine concavo-convex structure provided on a substrate, and a film 15 with a sol-gel material layer 22 applied and formed. Then, as shown in FIG. 7B, the sol-gel material layer 22 is contacted by applying pressure with the fine concavo-convex structure of the resin mold 21 to form a layered product, and as shown in FIG. 7C, the layered product is wound in the shape of a reel. Subsequently, as shown in FIG. 7D, the sol-gel material layer 22 is dried and semi-hardened, and obtained is the 1st fine-structure layered product 1 including an inorganic layer 13 (first semi-hardened sol-gel material layer).

Further, the sol-gel material layer 22 may be directly applied on the fine concavo-convex structure of the resin mold 21, and then, may be laminated to the film and reeled. It is possible to perform the semi-hardening process of the sol-gel material layer 22 before and/or after reeling.

Herein, in the region on the frontside of the fine concavo-convex structure of the resin layer, the fluorine element concentration is increased as compared with the other regions. Further, the 1st fine-structure layered product 1 includes the film 15, but the film 15 may not be used. In this case, the sol-gel material layer 22 is directly applied and formed on the resin mold 21. Further, it is possible to set dry and semi-hardening conditions, for example, at 80° C. for about 10 minutes.

Figure 7F:
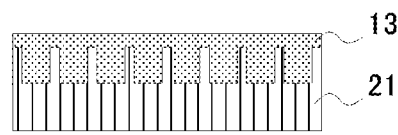
Figure 7B:
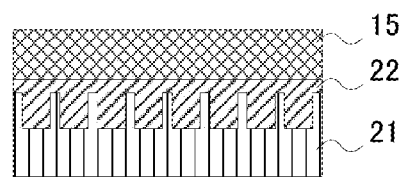
Figure 7G:
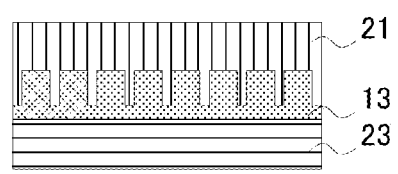
Figure 7C:
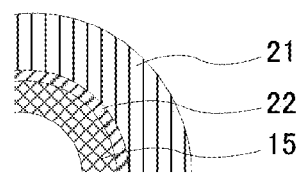
Figure 7H:
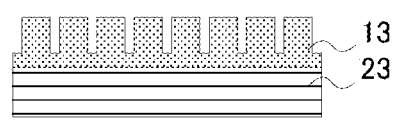
Figure 7D:
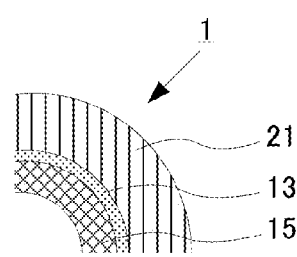
Figure 7I:
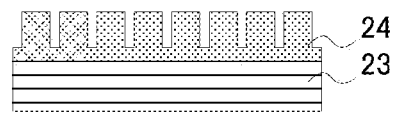
Figure 7E:
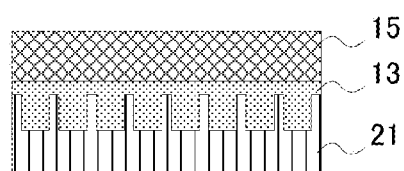

Next, as shown in FIGS. 7E and 7F, the film 15 is removed from the 1st fine-structure layered product 1, the semi-hardened sol-gel material layer is laminated to a substrate 23 made of an inorganic material such as glass as shown in FIG. 7G, and an inorganic layer 13 (first semi-hardened sol-gel material layer) is partially hardened. It is possible to set the conditions of partial hardening, for example, at 100° C. for about 1 hour under a nitrogen atmosphere.

In addition, ultraviolet rays may be applied through the resin mold 21. Further, it is also possible to partially harden by applying ultraviolet rays through the resin mold 21, and further curing in the temperature range from room temperature to 120° C.

Subsequently, as shown in FIG. 7H, the resin mold 21 is peeled off in the interface between the resin mold 21 and the inorganic layer 13, and the layered product of the substrate 23 and the inorganic layer 13 is obtained. Then, as shown in FIG. 7I, by completely hardening the inorganic layer 13 (partially hardened first semi-hardened sol-gel material layer) and obtaining an inorganic layer 24 (hardened sol-gel material layer), it is possible to manufacture the 10th fine-structure layered product. It is possible to set the conditions of complete hardening, for example, at 300° C. for about 1 hour under a nitrogen atmosphere. In addition, in the above-mentioned manufacturing process, by providing a process of forming a high-concentration fluorine layer on the fine concavo-convex structure surface of the inorganic layer 13 of the 10th fine-structure layered product, it is possible to manufacture the 11th fine-structure layered product.

Further, by providing a process of forming a second semi-hardened sol-gel material layer on the fine concavo-convex structure of the inorganic layer 24 of the 10th fine-structure layered product or on the high-concentration fluorine layer of the 11th fine-structure layered product, it is possible to prepare the 12th fine-structure layered product. Furthermore, an inorganic substrate is placed on the surface on the side opposite to the fine concavo-convex structure of the second semi-hardened sol-gel material layer of the 12th fine-structure layered product, and the second semi-hardened sol-gel material layer is preliminarily hardened. Then, the preliminarily hardened second semi-hardened sol-gel material layer is peeled off from the interface with the inorganic layer 24, and then, by hardening the preliminarily hardened second semi-hardened sol-gel material layer to be the hardened sol-gel layer, it is possible to manufacture the 13th fine-structure layered product.

Moreover, in the above-mentioned manufacturing process, by forming a resin layer on the fine concavo-convex structure surface of the hardened sol-gel layer of the 13th fine-structure layered product, it is possible to manufacture the 14th fine-structure layered product. Further, after peeling off the resin layer of the 14th fine-structure layered product in the interface with the inorganic layer 24, a semi-hardened sol-gel material layer is formed to contact the fine concavo-convex structure of the resin layer. Then, an inorganic substrate is placed on the surface on the side opposite to the fine concavo-convex structure of the semi-hardened sol-gel material layer, and then, the semi-hardened sol-gel material layer is preliminarily hardened. Finally, the preliminarily hardened semi-hardened sol-gel material layer is peeled off in the interface with the inorganic layer 24, and then, by hardening the preliminarily hardened semi-hardened sol-gel material layer, it is possible to manufacture the 15th fine-structure layered product.

Thus, by using the fine-structure layered product 1 as the 1st fine-structure layered product, it is possible to prepare the 2nd to 15th fine-structure layered products having the fine concavo-convex structure mainly formed of the inorganic materials excellent in environmental resistance, weather resistance and long-term stability. Further, the inorganic layer 13 in the 1st fine-structure layered product 1 is formed by the sol-gel method, and it is thereby possible to form the fine concavo-convex structure of a large area with high productivity. Furthermore, since the fluorine element concentration is increased in the region on the inorganic layer 13 side of the resin layer 12, separation between the resin layer 12 and the inorganic layer 13 is made ease, and it is possible to enhance productivity of the fine concavo-convex structure. Thus, by using the 1st fine-structure layered product 1 as the 1st fine-structure layered product, it is possible to form the 2nd to 15th fine-structure layered products having the fine concavo-convex structure excellent in environmental resistance, weather resistance and long-term stability with a large area and high productivity.

The fine-structure layered product 1 according to the present invention is preferably in the shape of a reel. By making the fine-structure layered product 1 a reel-shaped resin mold, it is possible to use as the resin mold in the shape of a reel. By using the resin mold, it is possible to manufacture materials to be transferred continuously. Details of the continuous process using the reel-shaped resin mold will be described below. In addition, substrates, light cross-linkable resins, and sol-gel materials used in the reel-shaped resin mold are the same as the materials as described previously.

<Second Aspect>

The inventors of the invention found out that it is possible to achieve a manufacturing method of a fine-structure product for enabling increases in the cycle time to be avoided in manufacturing the fine-structure product and further, enabling the large area to be made, by providing an inorganic layer including a sol-gel material on the reel-shaped resin mold, and hardening at least a part of the inorganic layer.

In other words, it is the gist of the second aspect of the invention to preliminarily harden an inorganic layer including a sol-gel formed on the reel-shaped resin mold, provide an inorganic material layer on the preliminarily hardened inorganic layer to prepare a layered product, peel off the prepared layered product from the reel-shaped resin mold, and thereby achieve the manufacturing method of a fine-structure product which is excellent in production efficiently and enables a large area to be made. In addition, although details will be described later, the inorganic material layer is provided on the inorganic layer including the sol-gel material, and is comprised of an inorganic material different from the inorganic layer.

The second aspect of the invention will specifically be described below. FIG. 8 contains views showing an outline of the manufacturing method of a fine-structure product according to an Embodiment of the second aspect.

<Manufacturing Method of a Fine-Structure Product>

Figure 8A:
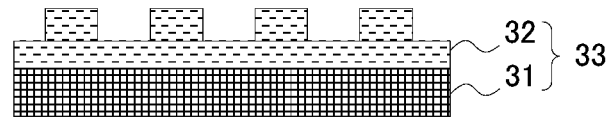
FIG. 8 contains views showing an outline of a manufacturing method of a fine-structure product according to an Embodiment of a second aspect.
Figure 8B:
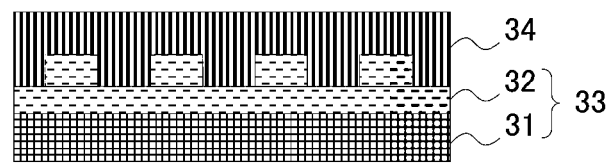

In the manufacturing method of a fine-structure product according to this Embodiment, as shown in FIG. 8A, prepared is a reel-shaped resin mold 33 provided with a light transmissive substrate 31 (transparent sheet), and a light cross-linkable resin layer 32 that is provided on the substrate 31 and that has a fine concavo-convex structure on its surface (mold preparation process). Next, as shown in FIG. 8B, a sol-gel material is applied on the light cross-linkable resin layer 32 of the reel-shaped resin mold 33, and an inorganic layer 34 containing the sol-gel material is formed (sol-gel layer formation process).

Herein, as the sol-gel material forming the inorganic layer 34, it is possible to use the same materials as the inorganic layer 13 according to the above-mentioned first aspect of the invention. In other words, as the inorganic layer 34, the hardened sol-gel material layer containing the hardened material of the sol-gel material may be used, the semi-hardened sol-gel material layer may be used, the inorganic material layer including the hardened material of the sol-gel material and the unhardened sol-gel material may be used, and the inorganic fine-particle layer including a mixture of inorganic fine particles, binder polymer and sol-gel material may be used.

Subsequently, the inorganic layer 34 is preliminarily hardened. In the preliminarily hardening process, as the inorganic layer 34, in the case of obtaining the hardened sol-gel material layer (hardened material layer of the sol-gel material), the inorganic layer 34 may be hardened fully. In the case of obtaining the semi-hardened sol-gel material layer, the inorganic layer 34 may be partially hardened. In the case of obtaining the inorganic fine-particle layer, the inorganic layer 34 may be partially hardened or fully hardened. In the case of obtaining the inorganic material layer, the inorganic layer 34 may be fully hardened to introduce a new sol-gel material into the fully hardened inorganic material layer 34 (preliminary hardening process).

Figure 8C:
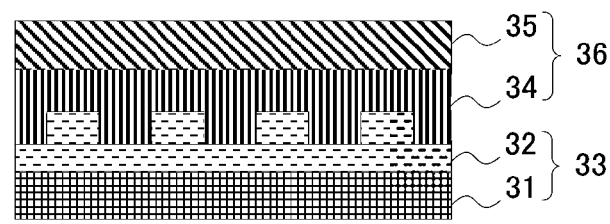
Figure 8D:
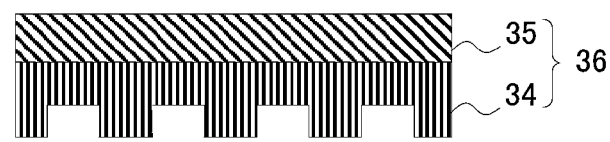
Figure 8E:
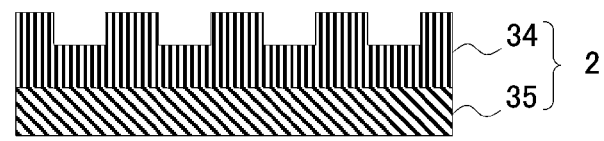

Next, as shown in FIG. 8C, an inorganic material layer 35 is provided on the inorganic layer 34 to form a layered product 36 (layering process). Herein, the layered product 36 is a layered product for the fine-structure product 2, and includes two layers of the inorganic layer 34, and the inorganic material layer 35 layered on the inorganic layer 34. Next, as shown in FIG. 8D, the layered product 36 for the fine-structure product is peeled off from the reel-shaped resin mold 33 to transfer the fine concavo-convex structure to the inorganic layer 34 (transfer process). Next, as shown in FIG. 8E, the inorganic layer 34 of the peeled layered product 36 is completely hardened to obtain the fine-structure product 2 (complete hardening process).

By using the reel-shaped resin mold 33, since it is possible to transfer the fine concavo-convex structure without using a flat-shaped die, continuous production is allowed and productivity is improved. Accordingly, it is possible to produce the fine-structure product excellent in weather resistance, environmental resistance and long-term stability with a large area, and further, it is possible to perform continuous production and reduce the cycle time. Each manufacturing process will specifically be described below.

(a) Reel-Shaped Resin Mold Preparation Process

Figure 9:
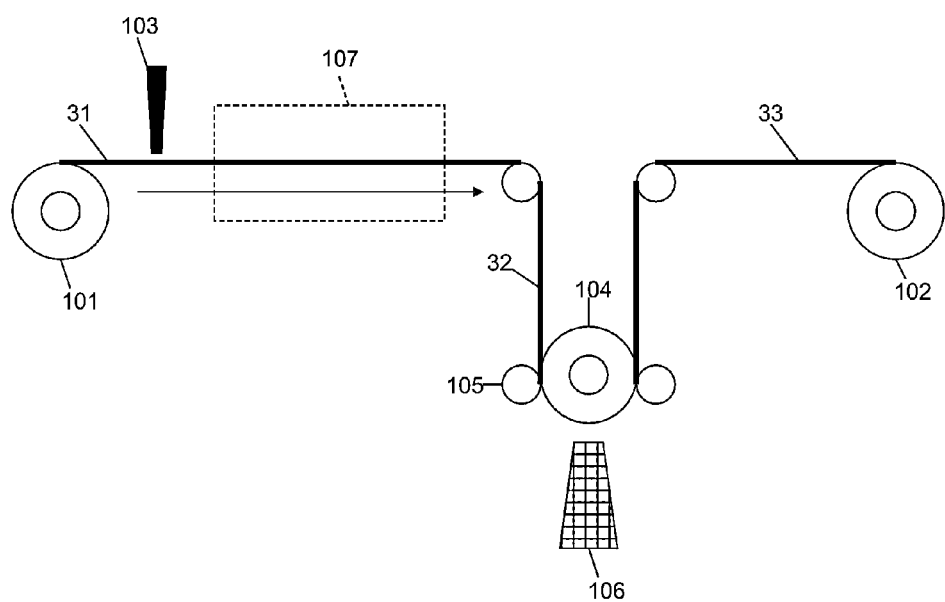
FIG. 9 is a schematic view of a manufacturing apparatus used in a reel-shaped resin mold preparation process in the manufacturing method of a fine-structure product according to the second aspect.

FIG. 9 is a schematic view of a manufacturing apparatus used in the reel-shaped resin mold preparation process in the manufacturing method of a fine-structure product according to this Embodiment. The manufacturing apparatus as shown in FIG. 9 is provided with an original sheet roll 101 that feeds the substrate 31, and a reeling roll 102 that reels the reel-shaped resin mold 33. In between the original sheet roll 101 and the reeling roll 102 are provided a coating apparatus 103 that coats the substrate 31 with a light cross-linkable resin, a cylindrical master mold 104 having a fine concavo-convex structure on its outer surface, a pressing means 105 that brings the light cross-linkable resin on the substrate 31 and the outer surface of the cylindrical master mold into intimate contact with each other, and a light source 106 that irradiates the light cross-linkable resin with light, in this order from the upstream side toward the downstream side in the transport direction of the substrate 31. When the light cross-linkable resin is applied using a solvent, a transfer apparatus may be used which is further provided with a dry furnace 107 that dries the solvent in the light cross-linkable resin on the downstream side of the coating apparatus 103.

In the reel-shaped resin mold preparation process, the light cross-linkable resin is applied on the light transmissive substrate 31 (transparent sheet) fed out of the original sheet roll 101 with the coating apparatus 103 to form the light cross-linkable resin layer 32. Next, while rotating the cylindrical master mold 104 having the fine concavo-convex structure on the outer surface, the outer surface of the cylindrical master mold 104 is brought into intimate contact with the light cross-linkable resin layer 32 with the pressing means 15, and the fine concavo-convex structure is transferred to the surface of the light cross-linkable resin layer 32. Next, the light cross-linkable resin layer 32 is irradiated with light from the light source 106 and is light-polymerized to prepare the reel-shaped resin mold 33, and then, the reel-shaped resin mold 33 is reeled up with the reeling roll 102. Further, in the reel-shaped resin mold preparation process, to protect the fine concavo-convex structure subjected to fine concavo-convex structure transfer from the cylindrical master mold, a protective film (cover film) may be laminated on the light cross-linkable resin layer 32.

As the coating method of the substrate 31 with the light cross-linkable resin with the coating apparatus 103, there are coating methods using publically known coating coaters or impregnation coating coaters. Specific examples of the methods are coating using a gravure coater, micro-gravure coater, blade coater, wire bar coater, air knife coater, dip coater, comma knife coater, spray coater, curtain coater, spin coater, laminator and the like. As these coating methods, when necessary, one kind of coating method may be used or two kinds of coating methods or more may be combined to use. Further, these coating methods may be performed by a digressional scheme or continuous scheme. From the viewpoint of productivity, it is preferable to coat by the continuous scheme. Further, the coating method of the continuous scheme using a dip coater, comma knife coater, gravure coater or laminator is particularly preferable.

The light source 106 used in application of light to the light cross-linkable resin layer 32 is not particularly limited, and it is possible to use various kinds of light sources corresponding to usage and facility. As the light source 106, it is possible to use a high pressure mercury lamp, low pressure mercury lamp, electrodeless lamp, metal halide lamp, excimer lamp, LED lamp, xenon pulse UV lamp and the like. Further, it is possible to light-polymerize the light cross-linkable resin by irradiating with UV light or visible light of wavelengths of 200 nm to 500 nm so that an exposure amount ranges from 100 mJ/cm$^2$ to 2,000 mJ/cm$^2$. Further, from the viewpoint of preventing oxygen from inhibiting the light cross-linking reaction, it is desirable to apply light in a state in which the oxygen concentration is low in applying light.

In the mold preparation process, with the pressing means 105 that brings the cylindrical master mold 104 and the light cross-linkable resin layer 32 into intimate contact with each other, in a state in which the cylindrical master mold 104 and the light cross-linkable resin layer 32 are in intimate contact with each other, the light cross-linkable resin layer 32 is irradiated with light to polymerize. In the state in which the fine concavo-convex structure on the outer surface of the cylindrical master mold 104 and the light cross-linkable resin layer 32 are in intimate contact with each other, by applying light to transfer, it is possible to accurately transfer the fine concavo-convex structure on the outer surface of the cylindrical master mold 104. Further, by transferring in the state in which the fine concavo-convex structure on the outer surface of the cylindrical master mold 104 and the light cross-linkable resin layer 32 are in intimate contact with each other, it is possible to avoid insufficient polymerization due to oxygen.

Further, in the reel-shaped resin mold preparation process, it is preferable to apply light with the cylindrical master mold 104 and the light cross-linkable resin layer 32 brought into intimate contact with each other under a nitrogen atmosphere. By this means, since it is possible to avoid contact of oxygen in the atmosphere to the light cross-linkable resin of the light cross-linkable resin layer 32, and reduce inhibition in the photopolymerization reaction due to oxygen, it is thereby possible to harden the resin layer sufficiently, and such conditions are preferable.

In order to apply light with the light cross-linkable resin layer 32 and the cylindrical master mold 104 brought into intimate contact with each other, light may be applied by directly bringing the light cross-linkable resin layer 33 and the cylindrical master mold into contact by applying pressure with each other with a nip roll as the pressing means 105, or light may be applied with the light cross-linkable resin layer 32 and the cylindrical master mold brought into intimate contact with each other while controlling tension of the substrate 31 (transparent sheet) by feeding/reeling control. In these cases, it is possible to adjust the pressing pressure and tension as appropriate according to transfer properties of the light cross-linkable resin layer 32.

It is possible to harden the light cross-linkable resin, for example, by light cross-linking, heat harden, harden with electron beams, microwaves and the like. Among the methods, it is preferable to use light cross-linking. After coating the substrate (transparent sheet) with the light cross-linkable resin by the above-mentioned coating method, by irradiating the light cross-linkable resin with light with an arbitrary amount in a predetermined wavelength, it is possible to promote the photopolymerization reaction of the light cross-linkable resin.

(Cylindrical Master Mold)

As the cylindrical master mold 104, used is a cylindrical master mold having a fine concavo-convex structure corresponding to the shape of the fine concavo-convex structure of the fine-structure product to manufacture on the outer surface. The fine concavo-convex structure of the cylindrical master mold 104 is capable of being formed directly on the outer surface of the substrate by a processing method such as a laser rutting method, electron beam lithography method, photolithography method, direct-drawing lithography method using a semiconductor laser, interference exposure method, electroforming method, and anodic oxidation method. Among the methods, from the viewpoint of obtaining a cylindrical master mold with seamless in the fine concavo-convex shape, preferable are the photolithography method, direct-drawing lithography method using a semiconductor laser, interference exposure method, electroforming method, and anodic oxidation method, and more preferable are the direct-drawing lithography method using a semiconductor laser, interference exposure method, and anodic oxidation method.

Further, as the cylindrical master mold 104, a mold may be used which is obtained by transferring a fine concavo-convex structure formed on a surface of a flat-shaped substrate by the above-mentioned processing method to a resin material (film), and laminating the film to the outer surface of the cylindrical master mold with position accuracy. Furthermore, another mold may be used which is obtained by transferring a fine concavo-convex structure formed on a surface of a flat-shaped substrate by the above-mentioned processing method to a thin film of nickel or the like by the electroforming method, and winding the thin film around a roller.

As materials for the cylindrical master mold 104, it is desirable to use materials easy in formation of the fine concavo-convex structure and excellent in durability. From such viewpoints, as the materials used for the cylindrical master mold 104, preferable are a glass roll, quartz glass roll, nickel electroformed roll, chromium electroformed roll, aluminum roll and SUS roll (stainless steel roll).

As the base material for the nickel electroformed roll and chromium electroformed roll, it is possible to use electrically conductive materials with electrical conductivity. As the electrically conductive materials, examples of suitably used materials are iron, carbon steel, chrome steel, cemented carbide, steel for a die (for example, maraging steel), stainless steel and aluminum alloy.

It is desirable to apply mold release treatment to the surface of the cylindrical master mold 104. By applying the mold release treatment, it is possible to decrease surface free energy of the cylindrical master mold 104, and therefore, also in the case of transferring to the light cross-linkable resin continuously, it is possible to hold the excellent peeling property and the concavo-convex structure shape of the fine concavo-convex structure. In the mold release treatment, it is possible to use commercially available mold release agents and surface treatment agents. Examples of the commercially available mold release agents and surface treatment agents are OPTOOL (made by Daikin Industries, Ltd.) DURASURF (made by Daikin Industries, Ltd.), and Novec series (made by Sumitomo 3M Limited). Further, as the mold release agents and surface treatment agents, corresponding to combinations of the type of material for the cylindrical master mold 104 and the light cross-linkable resin to be transferred, it is possible to select suitable mold release agent and surface treatment agent as appropriate.

By applying such mold release treatment, in the case where a fluorine component is contained in the light cross-linkable resin, it is possible to promote surface segregation of the fluorine component, and it is thereby possible to more improve the surface release properties of the obtained resin mold. Thus, by applying the mold release treatment to the surface of the cylindrical master mold 104, it is possible to manufacture reel-shaped resin molds having high release properties with high Es/Eb values.

Figure 10:
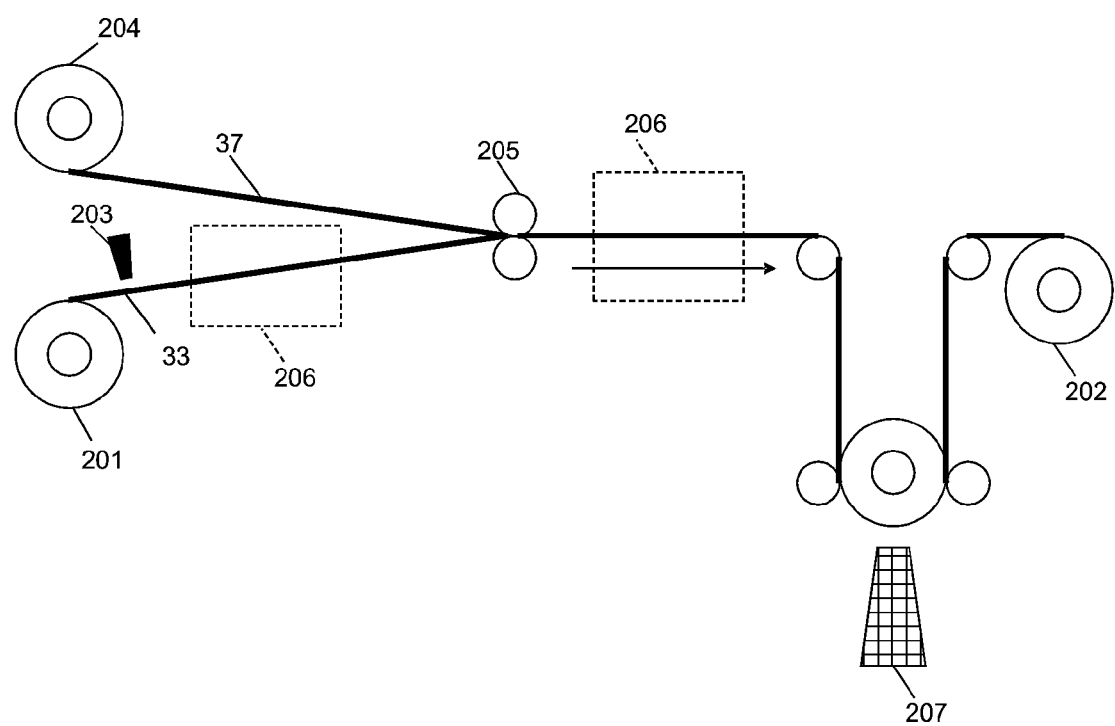
FIG. 10 is a schematic view of a manufacturing apparatus used in an inorganic layer formation process and a preliminary hardening process in the manufacturing method of a fine-structure product according to the second aspect.
Figure 11A:
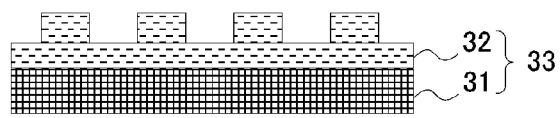
FIG. 11 contains schematic views showing another example of the manufacturing process of a fine-structure product according to the second aspect.
Figure 11B:
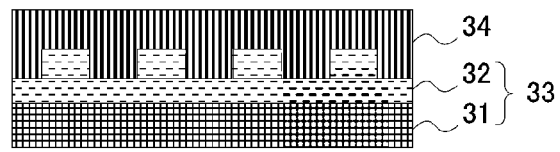
Figure 11C:
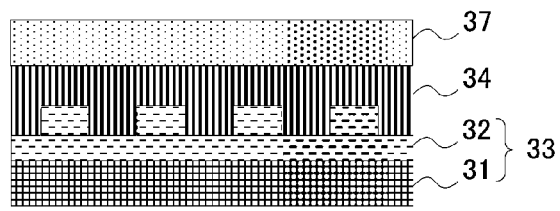
Figure 11D:
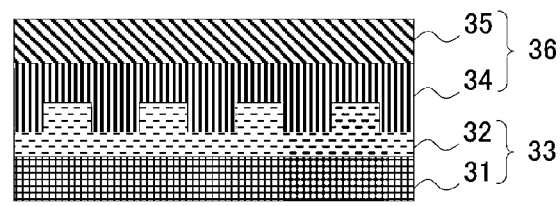
Figure 11E:
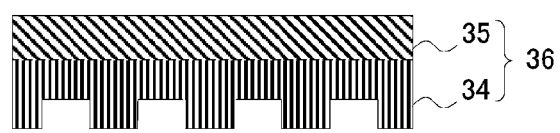
Figure 11F:
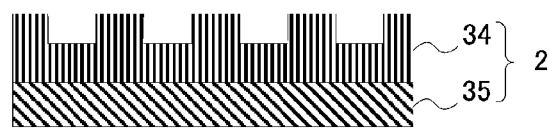

FIG. 10 is a schematic view of a manufacturing apparatus used in the inorganic layer formation process and the preliminary hardening process. The manufacturing apparatus as shown in FIG. 10 is provided with a reel-shaped resin mold roll 201 that feeds out the reel-shaped resin mold, and a reeling roll 202 that reels the reel-shaped resin mold 33. In between the reel-shaped resin mold roll 201 and the reeling roll 202 are provided a coating apparatus 203 that coats the reel-shaped resin mold 33 with a sol-gel material, a cover film feeding roll 204 that feeds out a cover film 37, a laminating means 205 for laminating the reel-shaped resin mold 33 and the cover film 37, a dry furnace 206 that partially hardens the inorganic layer 34 on the reel-shaped resin mold 33, and a light source 207 that applies light in the case of partially hardening the inorganic layer 34 by light, in this order from the upstream side toward the downstream side in the transport direction of the reel-shaped resin mold 33. Further, the reel-shaped resin mold roll 201 that feeds out the reel-shaped resin mold 33 and the cover film feeding roll 204 that feeds out the cover film 37 may be interchanged. In the case of interchanging, the sol-gel material is applied on the cover film 37. Further, the dry furnace 206 may be provided on either the upstream side or the downstream side of the laminating means 205 in the transport direction of the reel-shaped resin mold 33.

(b) Inorganic Layer Formation Process

In the inorganic layer formation process, the sol-gel material is directly applied on the fine concavo-convex structure of the reel-shaped resin mold 33 fed out of the reel-shaped resin mold roll 201 with the coating apparatus 203 to form the inorganic layer 34.

As the coating method of coating the fine concavo-convex structure of the reel-shaped resin mold 33 with the sol-gel material with the coating apparatus 203, there are coating methods using publically known coating coaters or impregnation coating coaters. Specific examples of the methods are coating methods using a gravure coater, micro-gravure coater, blade coater, wire bar coater, air knife coater, dip coater, comma knife coater, spray coater, curtain coater, spin coater, laminator and the like. As these coating methods, when necessary, a single kind may be used or a plurality of kinds may be combined to use. Further, these coating methods may be performed by a digressional scheme or continuous scheme. From the viewpoint of productivity, it is preferable to coat by the continuous scheme. Further, the coating method of the continuous scheme using a dip coater, comma knife coater, gravure coater or laminator is particularly preferable.

(c) Preliminary Hardening Process

In the preliminary hardening process, the inorganic layer 34 formed on the surface of the reel-shaped resin mold 33 is preliminarily hardened, by partially or fully hardening the sol-gel material with the dry furnace 206. Herein, partial hardening is in a state in which the sol-gel material partially develops the reaction by hydrolytic polycondensation, and means the state in which the viscosity of the sol-gel material increases but the surface tack property remains. Meanwhile, hardening means a state in which the reaction progresses more than partial hardening and the surface tack property is eliminated. Both in the case where the material is partially hardened and in the case where the material is fully hardened, by applying heat treatment of higher temperatures, the material develops the reaction, and finally, is completely hardened. As the inorganic layer 34, in the case of obtaining the hardened sol-gel material layer (hardened material layer of the sol-gel material), the inorganic layer 34 is hardened fully. In the case of obtaining the semi-hardened sol-gel material layer, the inorganic layer 34 is partially hardened. In the case of obtaining the inorganic fine-particle layer, the inorganic layer 34 is partially hardened or fully hardened. In the case of obtaining the inorganic material layer, the inorganic layer 34 is fully hardened.

Next, the cover film 37 fed out of the feeding roll 204 is laminated onto the inorganic layer 34 with the laminating means 205. In addition, preliminary hardening of the inorganic layer 34 may be performed after laminating the cover film 37. In the case of preliminarily hardening the inorganic layer 34 with light, the inorganic layer 34 is irradiated with light to preliminarily hardened, and then, the reel-shaped resin mold 33 is reeled with the reeling roll 202. In addition, the apparatus as shown in FIG. 12 exemplifies the manufacturing apparatus provided with both the dry furnace 206 and the light source 207, but a manufacturing apparatus capable of preliminarily hardening the inorganic layer 34 with the dry furnace 206 or the light source 207 does not need to be always provided with both the dry furnace 206 and the light source 207.

In the preliminary hardening process, the inorganic layer 34 formed on the surface of the reel-shaped resin mold 33 is partially hardened or hardened by heating and/or applying UV. For example, the conditions for preliminary hardening are at temperatures of 40° C. to 120° C. for about 1 to 20 minutes, preferably about 1 to 60 minutes, under a nitrogen atmosphere. In the case of hardening the inorganic layer 34, only heating or heating and UV irradiation is used. It is possible to vaporize the solvent in the inorganic layer 34 by heating in hardening. By preliminarily hardening the sol-gel material by heating or light irradiation, peeling of the layered product 36 is made ease in the transfer process. Further, in the preliminary hardening process, when a photoinitiator and sol-gel material having photopolymerizable groups are beforehand introduced in the inorganic layer 34, it is also possible to partially harden the inorganic layer 34 by applying light irradiation, EB irradiation, microwave irradiation or the like from the light source.

In the preliminary curding process, in the case of hardening the inorganic layer 34, the film thickness of the inorganic layer 34 of 10 µm or less is preferable from the viewpoint of facilitating hardening, and the thickness of 3 µm or less is more preferable. When the film thickness of the inorganic layer 34 is 1.5 µm or less, it is easy to suppress cracks in hardening, and such a thickness is preferable. Further, by adding the heating process after partially hardening, it is possible to reduce the hardening time. Furthermore, conversely, it is possible to reduce the hardening time by partially hardening by the heating process, subsequently promoting hardening by UV irradiation, and further adding a curing process (30° C. to 120° C.).

Further, it is also possible to perform preliminary hardening with the reel-shaped resin mold reeled. With the mold rolled up, by curing in an environment with the temperature and moisture controlled, it is possible to promote partial hardening. It is possible to promote partial hardening on conditions of moisture of 20% to 80%, temperature of 40° C. to 100° C. and one hour to several days.

In addition, in the case of obtaining the inorganic material layer as the inorganic layer 34, it is possible to obtain the inorganic material layer by hardening the inorganic layer 34 in the hardening process, and then, immersing in a diluent sol-gel material or exposing to vapor of the sol-gel material.

Thus, by using the reel-shaped resin mold 33, continuous production is allowed, and therefore, it is possible to significantly reduce the cycle time.

(d) Layering Process

In the layering process, the inorganic material layer 35 is laminated onto the inorganic layer 34 to be the layered product 36. In addition, to laminate the inorganic material layer 35 and the inorganic layer 34, the sol-gel material, a partially hardened material of the sol-gel material or the like may be used as an adhesive.

(Inorganic Material Layer)

As the inorganic material layer 35, for example, it is preferable to use an inorganic substrate such as soda sheet glass, quartz glass substrate, sapphire substrate, transparent electrically conductive substrate and silicone substrate. In addition, the inorganic material layer 35 may be layered before above-mentioned preliminary hardening of the inorganic layer 34 or after preliminary hardening.

As the inorganic substrate, it is preferable to have excellent adhesion to the inorganic layer 34 and heat resistance to the extent capable of enduring heating in the hardening process, described later. Further, by applying surface treatment to the inorganic substrate, the adhesion to the inorganic layer 34 is improved. As the surface treatment, it is possible to select adhesive coating, surface treatment agent, silane coupling agent, UV ozone cleaning, plasma cleaning or the like as appropriate. Further, it is also possible to combine these kinds of surface treatment to use. Particularly preferable surface treatment is introduction of an adhesive layer by adhesive coating, UV ozone cleaning to develop hydroxyl groups on the surface, plasma cleaning, alkali cleaning, or silane coupling treatment.

As the adhesive layer, it is possible to use commercially available various kinds of adhesives, and examples of the adhesives are epoxy adhesives, acrylate adhesives, methacrylate adhesives, isocyanate adhesives, and silicone adhesives. Further, these adhesives may be used alone, or a plurality of kinds of adhesives may be used. From the viewpoint of being excellent in adhesion to the inorganic material, as the adhesive layer, it is preferable to use epoxy adhesives and silicone adhesives.

Further, as the adhesive layer, it is also possible to use the above-mentioned sol-gel material. Furthermore, it is also possible to use prepolymer such that the sol-gel material is partially condensed. By using the prepolymer, it is possible to reduce the time required for adhesion and further suppress cracks due to adhesion. It is possible to develop preliminary condensation by causing the sol-gel material to partially react at 30° C. to 120° C. under a nitrogen atmosphere or at 20° C. to 120° C. under a reduced pressure.

(e) Transfer Process

In the transfer process, the reel-shaped resin mold is peeled off from the interface with the preliminarily hardened inorganic layer 34. For peeling off the reel-shaped resin mold 33, a peeling method of physically peeling may be used, another peeling method of chemically peeling may be used, and it is possible to select various peeling methods. As the peeling method of physically peeling, there is a method of reeling only the reel-shaped resin mold 34.

As the peeling method of chemically peeling, there is a method of peeling the reel-shaped resin mold 33 by immersing in a peeling agent and solvent. In this case, it is possible to remove the peeling agent from the peeled inorganic layer 34 by rinse treatment. It is possible to select the peeling agent and solvent as appropriate in accordance with the used substrate 31 and light cross-linkable resin. In epoxy, acrylic isocyanate and silicone light cross-linkable resins, it is possible to use DYNASOLVE series (made by DYNALOY, LLC.), eSOLVE series (made by Kaneko Chemical, Co., Ltd.) and the like. Moreover, it is possible to use an alkali aqueous solution, acid, mixed acid and the like. As the solvent, as well as various solvents used in viscosity adjustment of the light cross-linkable resin, it is possible to use toluene, benzene, acetonitrile, chloromethane, dichloromethane, chloroform, carbon tetrachloride, and 1,2-dichloroethane. These solvents may be used alone or in combination of a plurality of kinds.

Further, by heating to high temperatures to decompose organic materials of the light cross-linkable resin, substrate 31 and others forming the reel-shaped resin mold 33, it is also possible to cause the reel-shaped resin mold 33 to disappear from the surface of the inorganic layer 34. In this case, since the product is heated to high temperatures, it is also possible to completely harden the inorganic layer 34.

Furthermore, it is also possible to peel by using a difference in thermal expansion between the inorganic layer 34 and the resin layer of the reel-shaped resin mold 33 by heating or cooling.

(f) Complete Hardening Process

In the complete hardening process, the inorganic layer 34 is heated to high temperatures, and is hardened completely. In the complete hardening process, the hardening temperature and heating time vary with the composition of the inorganic layer 34, and substantially, it is possible to completely harden the inorganic layer 34 by heating at 300° C. or more for about one hour. In addition, in liquid glass, it is also possible to harden at room temperature. It is possible to manufacture the fine-structure products according to this Embodiment by the above-mentioned processes.

Herein, complete hardening means a state in which the inorganic layer 34 is stable in a usage environment in which the fine-structure product is used. For example, in the case where complete hardening is performed at a temperature of T1, even when hardening of the inorganic layer 34 further develops by heat treatment of higher temperature (temperature of T2 (T1>T1)), the state, in which hardening of the inorganic layer 34 does not develop in an environment in which the fine-structure product is used, is expressed as complete hardening.

(g) Cover Film Layering Process

In addition, in the manufacturing method of a fine-structure product according to the above-mentioned Embodiment, after the inorganic layer formation process, the cover film layering process for layering the protective film 37 (the cover film 37) on the inorganic layer 34 may be performed after forming the inorganic layer 34 on the fine concavo-convex structure on the surface of the reel-shaped resin mold 33 (see FIGS. 11A to 11F). By thus providing the cover film 37, it is possible to protect the inorganic layer 34 against winding tension. It is possible to peel off the cover film 37 before the preliminary hardening process or the layering process.

It is possible to provide the cover film 37 by various layering methods, and it is preferable to layer by the laminate method after applying the sol-gel material. By layering the cover film by the laminate method, it is possible to continuously layer on the reel-shaped resin mold 33 without cutting the reel-shaped resin mold 33 and the inorganic layer 34, productivity is extremely high, and therefore, this method is preferable.

(Cover Film)

As in the substrate 31, the cover film 37 is preferably resin films excellent in handling properties and processing properties. Examples of the cover film are amorphous thermoplastic resins such as a methyl polymethacrylate film, polycarbonate film, polystyrene film, cycloolefin film (COP), cross-linked polyethylene film, polyvinyl chloride film, polyarylate film, polyphenylene ether film, modified polyphenylene ether film, polyether imide film, polyether sulfone film, polysulfone film, polyether ketone film and triacetyl cellulose (TAC) film, polyethylene terephthalate (PET) film, polyethylene naphthalate film, polyethylene film, polypropylene film, polybutylene terephthalate film, aromatic polyester film, polyacetal film, and polyamide film, preferable from the viewpoints of the film thickness, rigidity and elongation are a polyethylene film, polypropylene film, triacetyl cellulose (TAO) film, and polyethylene terephthalate (PET), and a polyethylene film and polypropylene film are more preferable.

Further, by applying primer treatment, atmospheric plasma treatment and corona treatment to the cover film 37, it is possible to improve adhesion to the inorganic layer 34.

As the film thickness of the cover film 37, from the viewpoints of preventing the concavo-convex structure from breaking due to winding tension and the handling property, the thickness preferably ranges from 0 to 100 μm, and more preferably ranges from 0 to 50 μm.

Further, in the above-mentioned manufacturing method of a fine-structure product, the inorganic layer 34 may be partially hardened after forming the inorganic layer 34 in the inorganic layer formation process, and providing the inorganic material layer 35 on the inorganic layer 34 to form the layered product 36 in the layering process. Thus, by hardening the inorganic layer 34 after layering the inorganic material layer 35, since the inorganic layer 34 and the inorganic material layer 35 are chemically bound, the inorganic layer 34 and the inorganic material layer 35 do not peel off from each other, and it is possible to remove the reel-shaped resin mold 33 easily.

Furthermore, in the above-mentioned manufacturing method of a fine-structure product, the cover film coated with the sol-gel material may be laminated to the reel-shaped resin mold to fill (coat) the fine concavo-convex structure of the reel-shaped resin mold with the inorganic layer 34. Thus, by coating with the sol-gel material using the cover film, since the reel-shaped resin mold 33 is not directly coated with sol-gel material, it is possible to suppress scratches on the fine concavo-convex structure on the surface of the reel-shaped resin mold 33.

Figure 12A:
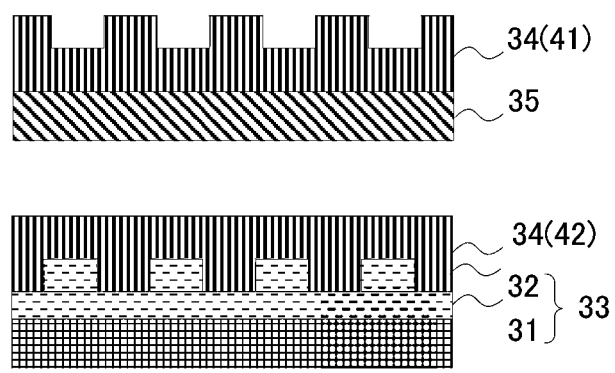
FIG. 12 contains schematic views showing still another example of the manufacturing process of a fine-structure product according to the second aspect.
Figure 12B:
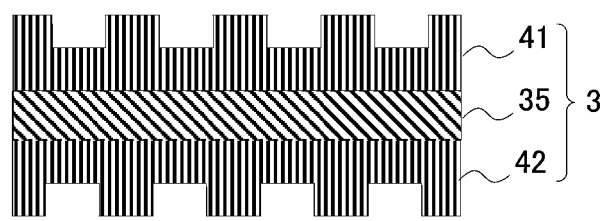

Referring to FIGS. 12A and 12B, described next is a manufacturing method of a fine-structure product 3 having fine concavo-convex structures on both main surfaces of the inorganic material layer 35. The fine-structure product 3 is manufactured by applying the above-mentioned manufacturing method of a fine-structure product to both main surfaces of the inorganic material layer 35. First, as shown in FIG. 12A, by the above-mentioned manufacturing method of a fine-structure product, the inorganic layer 34 (hereinafter, also referred to as a "first inorganic layer 41") is layered on one of main surfaces of the inorganic material layer 35 (first inorganic layer formation process). Next, the fine concavo-convex structure of the reel-shaped resin mold 33 is filled with the sol-gel material to form the inorganic layer 34 (hereinafter, also referred to as a "second inorganic layer 42"). Next, as shown in FIG. 12B, the second inorganic layer 42 is layered on the inorganic material layer 35 so that the main surface on the side opposite to the fine concavo-convex structure formation surface is opposed to the other main surface of the inorganic material layer 35 (second inorganic layer formation process). By the aforementioned processes, it is possible to manufacture the fine-structure product 3 having the fine concavo-convex structures on both main surfaces.

Further, in the above-mentioned manufacturing method of the fine-structure product 3, the first inorganic layer formation process provided on one main surface of the inorganic material layer 35 may be performed parallel with the second inorganic layer formation process. In this case, the second inorganic layer 42 may be layered before the partial hardening process of the first inorganic layer 41 or after the partial hardening process. Further, the second inorganic layer 42 on the other main-surface side of the inorganic material layer 35 may be provided on the fine-structure product 2 such that the inorganic layer 34 (first inorganic layer 41) on one main-surface side of the inorganic material layer 35 is completely hardened. Thus, by providing the first inorganic layer 41 and the second inorganic layer 42 each having the fine concavo-convex structure on both main surfaces of the inorganic material layer 35, it is possible to obtain the fine-structure product 3 particularly excellent in optical performance.

In addition, in the above-mentioned manufacturing process, the inorganic material layer 35 may be a reel-shaped inorganic material typified by a glass film. Furthermore, the fine concavo-convex structure of the inorganic layer 34 (the first inorganic layer 41 and the second inorganic layer 42) is preferably in the shape of pillars including a plurality of convex portions in the shape of a cone, the shape of a pyramid or the shape of an elliptic cone, or in the shape of holes including a plurality of concave portions in the shape of a cone, the shape of a pyramid or the shape of an elliptic cone, and it is preferable that the distance between adjacent convex portions ranges from 1 nm to 2,000 nm, and that the height of the convex portion ranges from 1 nm to 5,000 nm.

Further, since the reel-shaped resin mold is formed of organic materials, it is possible to peel off the mold from the inorganic layer easily, and by adding the fluorine compound, the mold release properties from the sol-gel material are more excellent. Thus, in this Embodiment, by transferring the fine concavo-convex structure form the reel-shaped resin mold to the inorganic layer from the cylindrical master mold, continuous productivity becomes excellent with the concavo-convex structure shape of the fine concavo-convex structure maintained.

Furthermore, in this Embodiment, since the reel-shaped resin mold is used, the need is eliminated for heat pressurized press required in the case of using a flat-shaped mold, and the temperature rising/lowering time and press formation time is significantly reduced. As a result, the cycle time is excellent. Still furthermore, in this Embodiment, since the reel-shaped resin mold is used as the substrate, it is possible to partially harden by applying light with the fine concavo-convex structure of the reel-shaped resin mold filled with the sol-gel material. As a result, as compared with the case of directly transferring from the cylindrical master mold to the sol-gel material, it is possible to reduce the forming time, and to largely shorten the cycle time.

Moreover, since the fine-structure product manufactured by the manufacturing method of the fine-structure product according to the invention is excellent in weather resistance, environmental resistance and long-term stability, while enabling the large area to be made, it is possible to use suitably as a surface panel of a solar battery of a large area. Further, in the case of using as a lighting apparatus, since anti-reflection performance is excellent, while efficiency of capturing light from the inside is excellent, it is possible to improve energy efficiency. Furthermore, in the case of being used in a display or the like, it is possible to reduce reflectance of light and improve transmittance.

Examples performed to clarify the effects of the present invention will be described next. In addition, the invention is not limited to the following Examples at all. Further, materials, composition, processing processes and others in the Examples are illustrative, and are capable of being carried into practice with modifications thereof as appropriate.

Examples of the fine-structure layered product according to the first aspect of the invention will be described first. Examples of the fine-structure layered product according to above-mentioned Embodiment 1 of the invention will be described first.

Example 1

Curd So-Gel Material Layer

First, prepared was a resin mold including a resin layer having a fine concavo-convex structure provided on a substrate. The resin mold was prepared by a method of pressing a light curable resin applied on the substrate against a cylindrical master mold having a fine concavo-convex structure on its surface, and then, light cross-linking the light curable resin.

Quartz glass was used for a substrate of the cylindrical master mold. The fine concavo-convex structure on the surface was formed on the surface of the quartz glass, by the direct-drawing lithography method using a semiconductor laser. Then, the surface of the quartz glass with the fine concavo-convex structure formed was coated with DURA-SURF HD-1101Z (made by Daikin industries, Ltd.), heated at 60° C. for 1 hour, then left at room temperature for 24 hours, and fixed. Subsequently, the surface was cleaned three times using DURASURF HD-ZV (made by Daikin Industries, Ltd.), and mold release treatment was applied to the surface of the quartz glass.

As the light curable resin, a mixture was used which was obtained by mixing OPTOOL DAC HP (made by Daikin Industries, Ltd.), trimethylol propane triacrylate (made by TOAGOSEI CO. LTD. M350) and Irgacure 184 (made by Ciba) in a ratio of 10:100:5 in parts by weight. The light curable resin was coated on an easy adhesion surface of a PET film: A4100 (made by Toyobo Co., Ltd.: width 300 mm, thickness 100 μm) that is the substrate by Micro Gravure coating (made by Yasui Seiki Co., Ltd.) so that the film thickness was 6 μm.

The PET film coated with the light curable resin was pressed against the above-mentioned cylindrical master mold with a nip roll (0.1 MPa), and was irradiated with ultraviolet rays to light polymerize, and the reel-shaped resin mold (length 200 m, width 300 mm) comprised of the substrate and the resin layer was obtained. The conditions of light cross-linking were an atmosphere and pressure of the atmosphere, a temperature of 25° C., moisture of 60%, and the integral amount of exposure below the center of the lamp of 600 mJ/cm$^2$. Further, as the light source of ultraviolet rays, used was the UV exposure apparatus (H bulb, Fusion UV Systems Japan Co., Ltd.).

The shape of the fine concavo-convex structure of thus obtained reel-shaped resin mold was checked by observation with a scanning electron microscope. In the reel-shaped resin mold, the adjacent distance between convex portions was 250 nm, and the height of the convex portion was 250 nm. The used scanning electron microscope, measurement conditions and the like are as described below.

Apparatus; HITACHI s-5500
Acceleration voltage; 10 kV
Mode; Normal

Further, the surface fluorine element concentration of the reel-shaped resin mold was measured by X-ray photoelectron spectroscopy (hereinafter, XPS). Es/Eb, which was a ratio of the fluorine element concentration Es in the surface region (region to be a hardened sol-gel material layer side region later) to the average fluorine element concentration Eb in the resin layer, was 69. In addition, herein, the reel-shaped resin mold was cut into small pieces of about 2 mm square, the piece was covered with a 1 mm×2 mm slot type mask, and measurement was performed. The used apparatus, measurement conditions and the like are as described below.

Used apparatus; Thermo Fisher ESCALAB 250
Excitation source; mono, AIK α 15 kV×10 mA
Analysis size; about 1 mm (the shape is an ellipse)
Capture region
Survey scan; 0~1, 100 eV
Narrow scan; F 1s, 2-1s, o 1s, N 1s
Pass energy
Survey scan; 100 eV
Narrow scan; 20 eV Next, fine-structure layered products were prepared using the above-mentioned reel-shaped resin mold. Herein, the fine-structure layered products that were layered products of the hardened material layer of the sol-gel material and the resin mold were obtained by winding out the reel-shaped resin mold with the fine concavo-convex structure formed to place on a flat surface, then coating the surface of the fine concavo-convex structure with one of solution (1), solution (2), solution (3) and solution (4) prepared as described below diluted to 20% with a propylene glycol monomethyl ether solvent so that the film thickness was 6 μm, drying at 105° C. for 3 minutes and thereby hardening with UV light. The coating was performed by Micro Gravure coating (made by Yasui Seiki Co., Ltd.). Hereinafter, the fine-structure layered products formed using the solution (1), solution (2), solution (3) and solution (4) are respectively referred to as fine-structure layered product (1), fine-structure layered product (2), fine-structure layered product (3), and fine-structure layered product (4).

Solution (1): Titanium tetrabutoxide, 3-acryloxy-propyl-trimethoxysilane and phenyl modified silicone oil (made by Dow Corning Toray Co., Ltd.) were mixed in 1:1:1 in parts by weight and stirred, and then, a photoinitiator (Irgacure 184) was added in 5 weight % relative to 3-acryloxy-propyl-trimethoxysilane.

Solution (2): Titanium tetrabutoxide and benzoyl acetone were mixed in a mole ratio of 1:1 and chelated. Subsequently, tetraethoxysilane was mixed in a mole ratio of 1:1 relative to titanium tetrabutoxide.

Solution (3): Titanium tetrabutoxide and benzoyl acetone were mixed in a mole ratio of 1:1 and chelated. Subsequently, 3-acryloxy-propyl-trimethoxysilane and triethoxy boron were added and stirred. Next, tetraethoxysilane was mixed and stirred. Then, the photoinitiator (Irgacure 184) was added in 5 parts by weight relative to 3-acryloxy-propyl-trimethoxysilane and stirred. Finally, addition was made so that titanium tetrabutoxide, 3-acryloxy-propyl-trimethoxysilane and tetraethoxysilane were in a mole ratio of 1:1:1, and further, triethoxy boron was added in 0.1 mol % relative to the entire alkoxide.

Solution (4): Titanium tetrabutoxide and benzoyl acetone were mixed in a mole ratio of 1:1 and chelated. Subsequently, 3-acryloxy-propyl-trimethoxysilane and triethoxy boron were added and stirred. Next, tetraethoxysilane was mixed and stirred for 3 hours while heating at 80° C. Then, the photoinitiator (Irgacure 184) was added in 5 parts by weight relative to 3-acryloxy-propyl-trimethoxysilane and stirred. Finally, addition was made so that titanium tetrabutoxide, 3-acryloxy-propyl-trimethoxysilane and tetraethoxysilane were in a mole ratio of 1:1:1, and further, triethoxy boron was added in 0.1 mol % relative to the entire alkoxide.

After the above-mentioned treatment, a film was laminated to each fine-structure layered product as a protective member, and each fine-structure layered product was wound in the shape of a reel. As the film, a polyethylene sheet with a thickness of 25 μm was used.

Then, a fine concavo-convex structure mainly formed of inorganic materials was formed from each fine-structure layered product. First, the inorganic layer of the fine-structure layered product was laminated to a 250 mm×300 mm soda glass substrate via an adhesive layer. After irradiating with light, heat treatment of 120° C. for 1 hour was applied in an oven under a nitrogen atmosphere. Herein, as the adhesive layer, the above-mentioned solutions (1) to (4) were used. The solution (1) was used as the adhesive layer when the inorganic material layer was formed using the solution (1) as the raw material. Similarly, the solution (2) was used as the adhesive layer when the inorganic material layer was formed using the solution (2) as the raw material, the solution (3) was used as the adhesive layer when the inorganic material layer was formed using the solution (3) as the raw material, and the solution (4) was used as the adhesive layer when the inorganic material layer was formed using the solution (4) as the raw material.

Next, the product was immersed in toluene at room temperature for 5 minutes, the rein mold was peeled off from the inorganic layer, and a layered structure of the soda glass substrate and the inorganic layer was obtained. Then, heat treatment of 300° C. for 1 hour was applied to the inorganic layer in an oven under a nitrogen atmosphere. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product A to fine-structure layered product D).

Example 2

Hardened Sol-Gel Material Layer

Described herein is an Example in which a film is placed to contact the inorganic layer as shown in FIG. 5A.

First, the reel-shaped resin mold the same as in Example 1 was prepared. Next, fine-structure layered products were prepared using the prepared reel-shaped resin mold. Herein, a PE (polyethylene) film was coated with one of the solution (1), solution (2), solution (3) and solution (4) in Example 1 diluted to 20% with a propylene glycol monomethyl ether solvent so that the film thickness was 6 gm, was dried at 105° C. for 3 minutes, and then, was laminated to the surface of the fine concavo-convex structure of the resin mold, and hardening was made with UV light. By this means, obtained were layered products of the PET film, hardened material layer of the sol-gel material and the resin mold. The coating was performed by Micro Gravure coating (made by Yasui Seiki Co., Ltd.). Also in this Example, the fine-structure layered products formed using the solution (1), solution (2), solution (3) and solution (4) are respectively referred to as fine-structure layered product (1), fine-structure layered product (2), fine-structure layered product (3), and fine-structure layered product (4).

Subsequently, the PE film was peeled off from each of the above-mentioned fine-structure layered product (1) to fine-structure layered product (4). Then, a fine concavo-convex structure mainly formed of inorganic materials was formed from each of the above-mentioned fine-structure layered products. Details were the same as in Example 1. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product (1) to fine-structure layered product (4)).

Examples of the fine-structure layered product according to above-mentioned Embodiment 2 of the invention will be described next.

Example 3

Inorganic Material Layer

First, the reel-shaped resin mold the same as in above-mentioned Example 1 was prepared. Next, fine-structure layered products were prepared using the above-mentioned reel-shaped resin mold. Herein, layered products of the hardened material layer of the sol-gel material and the resin mold were obtained by winding out the reel-shaped resin mold with the fine concavo-convex structure formed to place on a flat surface, then coating the surface of the fine concavo-convex structure with one of solution (5), solution (6), and solution (7) prepared as described below so that the film thickness was 6 m, and drying at 105° C. for 3 minutes. The coating was performed by Micro Gravure coating (made by Yasui Seiki Co., Ltd.). Hereinafter, the layered products formed using the solution (5), solution (6), and solution (7) are respectively referred to as layered product (5), layered product (6), and layered product (7).

Solution (5): Tetraethoxysilane, ethanol, water and hydrochloric acid were mixed in a mole ratio of 1:1:4:0.01.

Solution (6): Tetraethoxysilane, water, methanol, ethanol, and isopropanol were mixed in a weight ratio of 1:0.2:0.2:0.2:0.8.

Solution (7): Alkoxide, water, methanol, ethanol, and isopropanol were mixed in a weight ratio of 1:0.2:0.2:0.2:0.8. Herein, as the alkoxide, a mixture obtained by mixing tetraethoxysilane and titanium tetrabutoxide in a weight ratio of 4:1 was used.

Subsequently, each of the above-mentioned layered product (5), layered product (6), and layered product (7) was immersed in each of solution (A), solution (B) and solution (C) prepared as described below, then was cleaned with ethanol, and was dried at 60° C., and a fine-structure layered product was obtained. Fine-structure layered products obtained by immersing the layered product (5) in the solution (A), solution (B) and solution (C) are respectively referred to as fine-structure layered product (5A), fine-structure layered product (5B), and fine-structure layered product (5C). Similarly, fine-structure layered products obtained by immersing the layered product (6) in the solution (A), solution (B) and solution (C) are respectively referred to as fine-structure layered product (6A), fine-structure layered product (6B), and fine-structure layered product (6C), and fine-structure layered products obtained by immersing the layered product (7) in the solution (A), solution (B) and solution (C) are respectively referred to as fine-structure layered product (7A), fine-structure layered product (7B), and fine-structure layered product (7C).

Solution (A): Tetramethoxysilane, acetylacetone, ethanol, water and hydrochloric acid were mixed in a mole ratio of 1:0.5:1:4:0.01.

Solution (B): Tetramethoxysilane, benzoylacetone, water, methanol, ethanol, and isopropanol were mixed in a weight ratio of 1:0.5:0.2:0.2:0.2:0.8.

Solution (C): Alkoxide, triethanol amine, water, methanol, ethanol, and isopropanol were mixed in a weight ratio of 1:0.5:0.2:0.2:0.2:0.8. Herein, as the alkoxide, a mixture obtained by mixing tetramethoxysilane and titanium tetraethoxide in a weight ratio of 4:1 was used.

After the above-mentioned treatment, a film was laminated to each fine-structure layered product as a protective member, and each fine-structure layered product was wound in the shape of a reel.

Then, a fine concavo-convex structure mainly formed of inorganic materials was formed from each fine-structure layered product. First, the inorganic material layer of the fine-structure layered product was laminated to a soda glass substrate of 250 mm×500 mm square, and partial hardening treatment of the sol-gel material was performed at 120° C. for 1 hour in an oven under a nitrogen atmosphere. Next, the product was immersed in toluene at room temperature for 5 minutes, the resin mold was peeled off from the inorganic material layer, and a layered structure of the soda glass substrate and the inorganic material layer was obtained. Then, complete hardening treatment of 300° C. for 1 hour was applied to the inorganic material layer in an oven under a nitrogen atmosphere. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product 5A to fine-structure layered product 7C).

Example 4

Inorganic Material Layer

Described herein is an Example in which a film is placed to contact the inorganic material layer as shown in FIG. 5A.

First, the reel-shaped resin mold the same as in above-mentioned Example 1 was prepared. Next, fine-structure layered products were prepared using the prepared reel-shaped resin mold. Herein, a PE film was coated with one of the solution (5), solution (6), and solution (7) in Example 3 so that the film thickness was 6 μm, was dried at 105° C. for 3 minutes, and then, was laminated to the surface of the fine concavo-convex structure of the resin mold, and hardening was made with UV light. By this means, obtained were layered products of the PET film, hardened material layer of the sol-gel material and the resin mold. The coating was performed by Micro Gravure coating (made by Yasui Seiki Co., Ltd.). Also in this Example, the layered products formed using the solution (5), solution (6), and solution (7) are respectively referred to as layered product (5), layered product (6), and layered product (7).

Subsequently, the PET film was removed from each of the above-mentioned layered product (5), layered product (6), and layered product (7). Then, each product was immersed in one of the solution (A), solution (B) and solution (C), then was cleaned with ethanol, and was dried at 60 degree, and a fine-structure layered product was obtained. Also in this Example, fine-structure layered products obtained by combining the layered product (5), layered product (6) and layered product (7) and the solution (A), solution (B) and solution (C) are respectively referred to as fine-structure layered product (5A) to fine-structure layered product (7C)

After the above-mentioned treatment, a film was laminated to each fine-structure layered product as a protective member, and each fine-structure layered product was wound in the shape of a reel.

Then, fine concavo-convex structures mainly formed of inorganic materials as in Example 1 were formed from the above-mentioned fine-structure layered products. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product (5A) to fine-structure layered product (7C)).

Example 5

Inorganic Material Layer

Fine-structure layered products were prepared using the reel-shaped resin mold prepared in Example 1. Herein, a PE film was coated with a solution X, obtained by mixing SH710 (made by Dow Corning Toray Co., Ltd.), KBM510 (made by Shin-Etsu Chemical Co., Ltd.), titanium tetrabutoxide (made by Wako Pure Chemical Industries Co., Ltd.), Irgacure 184 (made by Ciba) and Irgacure 369 (made by Ciba) in a ratio of 1:2:2:0.068:0.032 in parts by weight, so that the film thickness was 6 μm, the reel-shaped resin mold with the PET fine concavo-convex structure formed was wound out, the film was laminated to the fine concavo-convex structure, at the same time UV exposure was performed, and the product was reeled.

Next, the reeled layered product comprised of the PE film/solution X layer/resin mold was wound out, the PE film was removed, the layered product was immersed in one of solution (8), solution (9) and solution (10) prepared as described below, then was cleaned with ethanol, and was dried at 60 degree, and a fine-structure layered product was obtained. Fine-structure layered products obtained by immersing the layered product in the solution (8), solution (9) and solution (10) are respectively referred to as fine-structure layered product (8), fine-structure layered product (9), and fine-structure layered product (10).

Solution (8): Tetramethoxysilane, acetylacetone, ethanol, water and hydrochloric acid were mixed in a mole ratio of 1:0.5:1:4:0.01.

Solution (9): Tetramethoxysilane, benzoylacetone, water, methanol, ethanol, and isopropanol were mixed in a weight ratio of 1:0.5:0.2:0.2:0.2:0.8.

Solution (10): Alkoxide, triethanol amine, water, methanol, ethanol, and isopropanol were mixed in a weight ratio of 1:0.5:0.2:0.2:0.2:0.8. Herein, as the alkoxide, a mixture obtained by mixing tetramethoxysilane and titanium tetraethoxide in a weight ratio of 4:1 was used.

After the above-mentioned treatment, a film was laminated to each fine-structure layered product as a protective member, and each fine-structure layered product was wound in the shape of a reel.

Then, a fine concavo-convex structure mainly formed of inorganic materials was formed from each fine-structure layered product. First, the inorganic material layer of the fine-structure layered product was laminated to a soda glass substrate of 250 mm×500 mm square, and partial hardening treatment of the sol-gel material was performed at 120° C. for 1 hour in an oven under a nitrogen atmosphere. Next, the product was immersed in toluene at room temperature for 5 minutes, the resin mold was peeled off from the inorganic material layer, and a layered structure of the soda glass substrate and the inorganic material layer was obtained. Then, complete hardening treatment of 300° C. for 1 hour was applied to the inorganic material layer in an oven under a nitrogen atmosphere. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product (8) to fine-structure layered product (10)).

Examples of the fine-structure layered product according to above-mentioned Embodiment 3 will be described next.

Example 6

Inorganic Fine-Particle Layer

First, the reel-shaped resin mold was prepared as in Example 1. Next, fine-structure layered products were prepared using the prepared reel-shaped resin mold. Herein, the layered products of a mixture layer of inorganic fine particles that are the solid content of each solution and binder polymer, and the resin mold were obtained by winding out the reel-shaped resin mold with the fine concavo-convex structure formed to place on a flat surface, then coating the surface of the fine concavo-convex structure with one of solution (11), solution (12), solution (13) and solution (14) prepared as described below so that the film thickness was 6 μm, drying at 105° C. for 3 minutes and thereby crosslinking with UV light. The coating was performed by Micro Gravure coating (made by Yasui Seiki Co., Ltd.). Hereinafter, the layered products formed using the solution (11), solution (12), solution (13) and solution (14) are respectively referred to as layered product (11), layered product (12), layered product (13), and layered product (14).

Solution (11): Polyvinyl pyrolidone was dissolved in an ethanol solvent in 50 mg/ml, and then, 25 weigh % of titania fine particles were mixed. Subsequently, the solution was dissolved in a propylene glycol monomethyl ether solvent in 30 weight %.

Solution (12): Polyvinyl pyrolidone was dissolved in an ethanol solvent in 100 mg/ml, and then, 25 weigh % of titania fine particles were mixed. Subsequently, the solution was dissolved in a propylene glycol monomethyl ether solvent in 20 weight %.

Solution (13): Titanium tetraisopropoxide was mixed in a weight ratio of 5:1 in a solution obtained by mixing 2-aminoethanol and ethanol in a weight ratio of 1:3, and next, polyvinyl pyrolidone was mixed in a weight ratio of 12:1. Subsequently, 25 weigh % of titania fine particles were mixed. Then, the solution was dissolved in a propylene glycol monomethyl ether solvent in 10 weight %.

Solution (14): OPTOOL DAC HP, trimethylol propane triacrylate, Irgacure 184 and titania fine particles were mixed in a ratio of 10:100:5:25 in parts by weight. Then, the solution was dissolved in a propylene glycol monomethyl ether solvent in 10 weight %.

Subsequently, each of the above-mentioned layered product (11), layered product (12), layered product (13) and layered product (14) was immersed in one of solution (D), solution (E) and solution (F) prepared as described below, then was cleaned with ethanol, and was dried at 60° C., and a fine-structure layered product was obtained. Fine-structure layered products obtained by immersing the layered product (11) in the solution (D), solution (E) and solution (F) are respectively referred to as fine-structure layered product (11D), fine-structure layered product (11E) and fine-structure layered product (11F). Similarly, fine-structure layered products obtained by immersing the layered product (12) in the solution (D), solution (E) and solution (F) are respectively referred to as fine-structure layered product (12D), fine-structure layered product (12E) and fine-structure layered product (11F), fine-structure layered products obtained by immersing the layered product (13) in the solution (D), solution (E) and solution (F) are respectively referred to as fine-structure layered product (13D), fine-structure layered product (13E) and fine-structure layered product (13F), and fine-structure layered products obtained by immersing the layered product (14) in the solution (D), solution (E) and solution (F) are respectively referred to as fine-structure layered product (14D), fine-structure layered product (14E) and fine-structure layered product (14F).

Solution (D): Tetraethoxysilane, benzoylacetone, ethanol, water and hydrochloric acid were mixed in a mole ratio of 1:0.5:1:4:0.01.

Solution (E): Tetraethoxysilane, benzoylacetone, water, methanol, ethanol, and isopropanol were mixed in a weight ratio of 1:0.5:0.2:0.2:0.2:0.8.

Solution (F): Alkoxide, benzoylacetone, water, methanol, ethanol, and isopropanol were mixed in a weight ratio of 1:0.5:0.2:0.2:0.2:0.8. Herein, as the alkoxide, a mixture obtained by mixing tetraethoxysilane and titanium tetrabutoxide in a weight ratio of 4:1 was used.

After the above-mentioned treatment, a film was laminated to each fine-structure layered product as a protective member, and each fine-structure layered product was wound in the shape of a reel.

Then, a fine concavo-convex structure mainly formed of inorganic materials was formed from each fine-structure layered product. First, the inorganic fine-particle layer of the fine-structure layered product was laminated to a 250 mm×500 mm soda glass substrate, partial hardening treatment of the sol-gel material was performed at 120° C. for 1 hour in an oven under a nitrogen atmosphere, the resin mold was peeled off from the inorganic fine-particle layer, and a layered structure of the soda glass substrate and the inorganic fine-particle layer was obtained. Then, complete hardening treatment of 300° C. for 1 hour was applied to the inorganic fine-particle layer in an oven under a nitrogen atmosphere. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product (11D) to fine-structure layered product (14F)).

Example 7

Inorganic Fine-Particle Layer

Described herein is an Example in which a film is placed to contact the inorganic fine-particle layer as shown in FIG. 5A.

First, the reel-shaped resin mold the same as in Example was prepared. Next, fine-structure layered products were prepared using the prepared reel-shaped resin mold. Herein, a PE film was coated with one of the solution (11), solution (12), solution (13) and solution (14) in Example 6 so that the film thickness was 6 μm, dried at 105° C. for 3 minutes, then was laminated to the fine concavo-convex structure surface of the resin mole, and was cross-linked with UV light. By this means, obtained were layered products of the PET film, mixture layer of inorganic fine particles that are the solid content of each solution and binder polymer, and the resin mold. The coating was performed by Micro Gravure coating (made by Yasui Seiki Co., Ltd.). Also in this Example, the layered products formed using the solution (11), solution (12), solution (13) and solution (14) are respectively referred to as layered product (11), layered product (12), layered product (13), and layered product (14).

Subsequently, the PET film was removed from each of the above-mentioned layered product (11), layered product (12), layered product (13), and layered product (14). Then, each product was immersed in one of the solution (D), solution (E) and solution (F) in Example 6, then was cleaned with ethanol, and was dried at 60° C. and a fine-structure layered product was obtained. Also in this Example, fine-structure layered products obtained by combining the layered product (11), layered product (12), layered product (13), and layered product (14) and the solution (D), solution (E) and solution (F) are respectively referred to as fine-structure layered product (11D) to fine-structure layered product (14F).

After the above-mentioned treatment, a film was laminated to each fine-structure layered product as a protective member, and each fine-structure layered product was wound in the shape of a reel.

Then, fine concavo-convex structures mainly formed of inorganic materials were formed from the above-mentioned fine-structure layered products. Details are the same as Embodiment 1. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product (11D) to fine-structure layered product (14F)).

Example 8

Inorganic Fine-Particle Layer

Fine-structure layered products were prepared using the reel-shaped resin mold prepared in Example 1. Herein, a PE film was coated with a solution Y, obtained by adding 20 parts by mass of titanium oxide fine particles to a 100 parts by mass of a mixture obtained by mixing SH710 (made by Dow Corning Toray Co., Ltd.), KBM510 (made by Shin-Etsu Chemical Co., Ltd.) titanium tetrabutoxide (Wako), Irgacure 184 (made by Ciba) and Irgacure 369 (made by Ciba) in a ratio of 1:2:0.068:0.032 in parts by mass, so that the film thickness was 6 μm, the reel-shaped resin mold with the PET fine concavo-convex structure formed was wound out, the film was laminated to the fine concavo-convex structure, at the same time UV exposure was performed, and the product was reeled.

Next, the reeled layered product comprised of the PE film/solution Y layer/resin mold was wound out, the PE film was removed, the layered product was immersed in one of solution (15), solution (16) and solution (17) prepared as described below, then was cleaned with ethanol, and was dried at 60° C., and a fine-structure layered product was obtained. Fine-structure layered products obtained by immersing the layered product in the solution (15), solution (16) and solution (17) are respectively referred to as fine-structure layered product (15), fine-structure layered product (16), and fine-structure layered product (17).

Solution (15): Tetramethoxysilane, acetylacetone, ethanol, water and hydrochloric acid were mixed in a mole ratio of 1:0.5:1:4:0.01.

Solution (16): Tetramethoxysilane, benzoylacetone, water, methanol, ethanol, and isopropanol were mixed in a weight ratio of 1:0.5:0.2:0.2:0.2:0.8.

Solution (17): Alkoxide, triethanol amine, water, methanol, ethanol, and isopropanol were mixed in a weight ratio of 1:0.5:0.2:0.2:0.2:0.8. Herein, as the alkoxide, a mixture obtained by mixing tetramethoxysilane and titanium tetraethoxide in a weight ratio of 4:1 was used.

After the above-mentioned treatment, a film was laminated to each fine-structure layered product as a protective member, and each fine-structure layered product was wound in the shape of a reel.

Then, a fine concavo-convex structure mainly formed of inorganic materials was formed from each fine-structure layered product. First, the inorganic material layer of the fine-structure layered product was laminated to a 250 mm×500 mm soda glass substrate, partial hardening treatment of the sol-gel material was performed at 120° C. for 1 hour in an oven under a nitrogen atmosphere, the resin mold was peeled off from the inorganic material layer, and a layered structure of the soda glass substrate and the inorganic material layer was obtained. Then, complete hardening treatment of 300° C. for 1 hour was applied to the inorganic material layer in an oven under a nitrogen atmosphere. As a result of checking the shape of thus obtained fine concavo-convex structure with the scanning electron microscope, the adjacent distance between convex portions was 250 nm, and the height of the convex portion was 250 nm. The result was the same in all the fine-structure layered products (fine-structure layered product (15) to fine-structure layered product (17)).

Examples of the fine-structure layered product according to above-mentioned Embodiment 4 will be described next.

Example 9

Semi-Hardened Sol-Gel Material Layer

First, the reel-shaped resin mold the same as in Example 1 was prepared. Next, a fine-structure layered product was prepared using the prepared reel-shaped resin mold. Herein, the reel-shaped resin mold with the fine concavo-convex structure formed was wound out and placed on a flat surface, the surface of the fine concavo-convex structure was coated with ACCUGLASS 311 made by Honeywell International Inc. so that the film thickness was 3 μm, was dried at 80° C. for 10 minutes, and was subjected to semi-hardening treatment, and a fine-structure layered product was obtained. The coating was performed by Micro Gravure coating (made by Yasui Seiki Co., Ltd.). Subsequently, the fine-structure layered product was wound in the shape of a reel.

Then, a fine concavo-convex structure mainly formed of inorganic materials was formed from the above-mentioned fine-structure layered product. First, the reel-shaped fine-structure layered product was drawn, and the semi-hardened sol-gel material layer was laminated to a soda glass substrate of 100 mm square, and was cut to a length of 100 mm. Subsequently, partial hardening treatment of 100° C. for 1 hour was performed in an oven under a nitrogen atmosphere. Next, the product was immersed in toluene at room temperature for 5 minutes, the resin mold was peeled off from the semi-hardened sol-gel material layer, and a layered structure of the soda glass substrate and the semi-hardened sol-gel material layer was obtained. Then, complete hardening treatment of 300° C. for 1 hour was applied to the semi-hardened sol-gel material layer in an oven under a nitrogen atmosphere. As a result of checking the shape of thus obtained fine concavo-convex structure with the scanning electron microscope, the adjacent distance between convex portions was 250 nm, and the height of the convex portion was 250 nm.

Further, the above-mentioned reel-shaped fine-structure layered product was drawn, the same treatment was applied to another soda glass substrate of 100 mm square, and fine concavo-convex structures were formed continuously. Also in such continuous production, the quality of the fine concavo-convex structures did not change. Thus, the fine-structure layered product in this Example is the reel-shaped resin mold, therefore is easy to bend, and is able to follow the plane of the soda glass substrate. Hence, by using the fine-structure layered product in this Example, it was possible to form the fine concavo-convex structure of a large area without causing any defect.

In addition, thus obtained fine concavo-convex structure is mainly formed of inorganic materials, and therefore, is excellent in environmental resistance, weather resistance and long-term stability.

Example 10

Semi-Hardened Sol-Gel Material Layer

Described herein is an Example in which a film is placed to contact the semi-hardened sol-gel material layer as shown in FIG. 5A.

First, the reel-shaped resin mold the same as in Example 1 was prepared. Next, a fine-structure layered product was prepared using the prepared reel-shaped resin mold. Herein, ACCUGLASS 311 made by Honeywell International Inc. was coated on a polyethylene film so that the film thickness was 3 μm, and the reel-shaped resin mold and the polyethylene film were laminated so that the above-mentioned coated material came into contact with the fine concavo-convex structure of the reel-shaped resin mold. Then, the layered product thereof was reeled, then was dried at 80° C. for 24 hours, and was subjected to semi-hardening treatment, and the fine-structure layered product was obtained.

Then, a fine concavo-convex structure mainly formed of inorganic materials was formed from the above-mentioned fine-structure layered product. Details are the same as Example 1. As a result of checking the shape of thus obtained fine concavo-convex structure with the scanning electron microscope, the adjacent distance between convex portions was 250 nm, and the height of the convex portion was 250 nm.

Example 11

Semi-Hardened Sol-Gel Material Layer

Described herein is an Example in which long slender films are placed on the backside of the resin mold as shown in FIG. 5B.

First, the reel-shaped resin mold the same as in Example 1 was prepared. Next, a fine-structure layered product was prepared using the prepared reel-shaped resin mold. Herein, the reel-shaped resin mold with the fine concavo-convex structure formed was wound out and placed on a flat surface, and the surface was coated with ACCUGLASS 311 made by Honeywell International Inc. so that the film thickness was 3 μm. The coating was performed by Micro Gravure coating (made by Yasui Seiki Co., Ltd.). Further, long slender films with a thickness (height) of 20 μm were laminated so as to contact the film end (edge) of the backside (the surface without having the fine concavo-convex structure) of the resin mold. Then, after reeling the layered product, the product was dried at 80° C. for 24 hours, and was subjected to semi-hardening treatment, and the fine-structure layered product was obtained.

Then, a fine concavo-convex structure mainly formed of inorganic materials was formed from the above-mentioned fine-structure layered product. Details are the same as Example 3. As a result of checking the shape of thus obtained fine concavo-convex structure with the scanning electron microscope, the adjacent distance between convex portions was 250 nm, and the height of the convex portion was 250 nm.

Example 12

Semi-Hardened Sol-Gel Material Layer

Described herein is an Example in which long slender films are placed in the end portions (edges) on the frontside of the resin mold as shown in FIG. 5C.

First, the reel-shaped resin mold the same as in Example 1 was prepared. Next, a fine-structure layered product was prepared using the prepared reel-shaped resin mold. Herein, first, a long slender film comprised of a fluorine resin was laminated to the end portion (edge) of the resin layer having the fine concavo-convex structure of the reel-shaped resin mold. The film was laminated to two portions in the edge in the longitudinal direction of the resin layer. Then, the surface of the fine concavo-convex structure was coated with ACCUGLASS 311 made by Honeywell International Inc. so that the film thickness was 3 μm. The coating was performed by Micro Gravure coating (made by Yasui Seiki Co., Ltd.). Then, after reeling the layered product, the product was dried at of 80° C. for 24 hours, and was subjected to semi-hardening treatment, and the fine-structure layered product was obtained.

Then, a fine concavo-convex structure mainly formed of inorganic materials as in Example 1 was formed from the above-mentioned fine-structure layered product. As a result of checking the shape of thus obtained fine concavo-convex structure with the scanning electron microscope, the adjacent distance between convex portions was 250 nm, and the height of the convex portion was 250 nm.

As described above, in any of the Examples according to above-mentioned Embodiments 1 to 4, fine concavo-convex structures mainly formed of inorganic materials were obtained which accurately reflected the fine concavo-convex shape of the resin mold. Particularly, it was confirmed that it is possible to form the fine concavo-convex structure with ease on a substrate of a large area of 250 mm×500 mm. When the fine concavo-convex structure is formed by the conventional technique such as electron beam lithography, the period of several months is required for preparation, and also from this respect, it is understood that productivity is high in the method of using the structure layered product described in the present invention. Further, in the above-mentioned Embodiments, since the reel-shaped fine-structure layered product is used, it is possible to perform continuous production and obtain high productivity. Furthermore, the fine concavo-convex structure is mainly formed of inorganic materials, and therefore, is excellent in environmental resistance, weather resistance, and long-term stability as compared with the fine concavo-convex structure mainly formed of resin materials. As described above, it was confirmed that it is possible to manufacture the fine concavo-convex structure mainly formed of inorganic materials excellent in environmental resistance, weather resistance and long-term stability with a large area and high productivity, by using the fine-structure layered product of the invention.

Next, fine-structure layered products (products for transfer) were prepared using the fine-structure products according to above-mentioned Embodiments 1 to 4, and performance of the prepared layered products for transfer was evaluated.

<Preparation of the Cylindrical Master Mold (Mold for Resin Mold Preparation)>

A quartz glass roll was used as a substrate of the cylindrical master mold, and a fine concavo-convex structure was formed on the outer surface of the quartz glass roll, by the direct-drawing lithography method using a semiconductor laser. Then, the outer surface of the quartz glass roll with the fine concavo-convex structure formed was coated with DURASURF HD-1101Z (made by Daikin Industries, Ltd.), heated at 60° C. for 1 hour, left at room temperature for 24 hours, and fixed. Then, the surface was cleaned three times using DURASURF HD-ZV (made by Daikin Industries, Ltd.), and mold release treatment was applied. By the aforementioned process, prepared were a quartz glass roll having a fine hole structure with a pitch of 200 nm, a quartz glass roll having a fine hole structure with a pitch of 460 nm and a quartz glass roll having a line-and-space structure with a pitch of 130 nm.

In the following description, each of three prepared quartz glass rolls (hereinafter, simply referred to as "cylindrical master molds") was used to prepare resin molds A and B.

<Preparation of the Resin Mold A>

OPTOOL DAC HP (made by Daikin Industries, Ltd.), trimethylol propane triacrylate (made by TOAGOSEI CO. LTD. M350) and Irgacure 184 (made by Ciba) were mixed to prepare a transfer material. To 100 parts by mass of trimethylol propane triacrylate was added 10 to 20 parts by mass of OPTOOL DAC HP. In addition, in a process for making the resin mold B from the resin mold A described later, the resin mold B was prepared using the same resin as the resin used in preparing the resin mold A.

The transfer material was coated on an easy adhesion surface of a PET film A-4100 (made by Toyobo Co., Ltd.: width 300 mm, thickness 100 μm) by Micro Gravure coating (made by Yasui Seiki Co., Ltd.) so that the coating film thickness was 6 μm. Next, the PET film coated with the transfer material was pressed against the cylindrical master mold with a nip roll (0.1 MPa). Next, ultraviolet rays were applied under conditions of a temperature of 25° C. and moisture of 60% under atmospheric pressure, using the UV exposure apparatus (H bulb, Fusion UV Systems Japan Co., Ltd.) so that the integral amount of exposure below the center of the lamp was 600 mJ/cm$^2$, light cross-linking was performed continuously, and obtained was the reel-shaped resin mold A (length 200 m, width 300 mm) with the fine concavo-convex structure transferred onto the surface. Es/Eb, which was a ratio of the surface fluorine element concentration (Es) and the average fluorine element concentration (Eb) of the obtained resin mold A, was adjusted in the range of 40 to 80 based on charge-in quantity of OPTOOL DAC HP. The aforementioned process was performed using the prepared three cylindrical master molds, and three resin molds A were prepared. The concavo-convex structure and Es/Eb of each of the prepared resin molds A are shown in following Table 1.

TABLE 1

| | CONCAVO-CONVEX STRUCTURE | | Es/Eb |
|---|---|---|---|
| RESIN MOLD A | CONVEX TYPE (DOT) | PITCH 200 nm HEIGHT 200 nm PITCH 460 nm HEIGHT 460 nm | 40~80 |
| | LINE-AND-SPACE | PITCH 130 nm | |

<Preparation of the Resin Mold B>

The same transfer material as the transfer material used in preparing the resin mold A was coated on an easy adhesion surface of a PET film A-4100 (made by Toyobo Co., Ltd.: width 300 mm, thickness 100 μm) by Micro Gravure coating (made by Yasui Seiki Co., Ltd.) so that the coating film thickness was 6 μm. Next, the PET film coated with the transfer material was pressed against the fine concavo-convex structure surface of the resin mold A obtained by directly transferring from cylindrical master mold with a nip roll (0.1 MPa). Next, ultraviolet rays were applied under conditions of a temperature of 25° C. and moisture of 60% under atmospheric pressure, using the UV exposure apparatus (H bulb, Fusion UV Systems Japan Co., Ltd., H bulb) so that the integral amount of exposure below the center of the lamp was 600 mJ/cm$^2$, light cross-linking was performed continuously, and obtained was the reel-shaped resin mold B (length 200 m, width 300 mm) provided with the same fine concavo-convex structure as the cylindrical master mold. Es/Eb, which was a ratio of the surface fluorine element concentration (Es) and the average fluorine element concentration (Eb) of the obtained resin mold B, was adjusted in the range of 35 to 75 based on charge-in quantity of OPTOOL DAC HP. The aforementioned process was performed using three resin molds A, and three resin molds B were prepared. The concavo-convex structure and Es/Eb of each of the prepared resin molds B are shown in following Table 2.

TABLE 2

| | CONCAVO-CONVEX STRUCTURE | | Es/Eb |
|---|---|---|---|
| RESIN MOLD B | CONCAVE TYPE (HOLE) | PITCH 200 nm DEPTH 200 nm OPENING DIAMETER 180 nm PITCH 460 nm DEPTH 460 nm OPENING DIAMETER 430 nm | 35~75 |
| | LINE-AND-SPACE | PITCH 130 nm | |

Layered products for transfer were prepared using the resin molds A and B prepared by the above-mentioned processes. The concavo-convex structure and Es/Eb of each of the resin molds A and B used in preparation of layered products for transfer are shown in following Table 3. In the following examples, the resin molds A and B shown in following Table 3 were used.

TABLE 3

| | CONCAVO-CONVEX STRUCTURE | | Es/Eb |
|---|---|---|---|
| RESIN MOLD A | CONVEX TYPE (DOT) | PITCH 200 nm DEPTH 200 nm | 55 49 74 |
| | LINE-AND-SPACE | PITCH 130 nm | 48 |

TABLE 3-continued

| | CONCAVO-CONVEX STRUCTURE | | Es/Eb |
|---|---|---|---|
| RESIN MOLD B | CONCAVE TYPE (HOLE) | PITCH 460 nm DEPTH 460 nm OPENING DIAMETER 430 nm | 68 49 43 |

Example 13

Preparation of Layered Products for Transfer

An inorganic layer including a sol-gel material was formed on each of the resin molds A and B to prepare a fine-structure layered product (A). Next, a substrate was laminated to the top surface of the inorganic layer, then the resin mold A or B was peeled, and a layered product for transfer was thereby prepared. Sol-gel materials (A) to (F) shown in following Table 4 were used to form the film of the inorganic layer including the sol-gel material. In addition, in following Table 4, the category indicates that raw materials were only inorganic materials, or a complex (hybrid) of organic materials and inorganic materials. Further, the condensation time was a time taken for the sol-gel material to undergo preliminary condensation. Preliminary condensation is to beforehand perform polycondensation partially on the sol-gel material, and was performed on the condition of 80 degree in a vacuum. In following Table 4, TTB represents tetra(tert-butoxy) titanium (IV) (made by Wako Pure Chemical Industries Co., Ltd.), DEDFS represents diethoxy-diphenyl-silane (made by Shin-Etsu silicone corporation, LS-5990), TEOS represents tetraethoxysilane (made by Shin-Etsu Chemical Co., Ltd., LS-2430), 3APTMS represents 3-acryloxy-propyl-triethoxysilane (made by Shin-Etsu silicone corporation, KBM-5103), I. 184 represents Irgacure 184 (made by Ciba), M211B represents ARONIX M211B (made by TOAGOSEI CO. LTD.), and M101A represents ARONIX M101A (made by TOAGOSEI CO. LTD.).

TABLE 4

| SOL-GEL MATERIAL | CATEGORY | RAW MATERIAL | WEIGHT (g) | CONDENSATION TIME (h) |
|---|---|---|---|---|
| (A) | INORGANIC MATERIAL | SH710 | 0.25 | 4 |
| | | X21-5841 | 0.25 | |
| | | TTB | 37.5 | |
| | | DEDFS | 12.5 | |
| | | TEOS | 50 | |
| (B) | INORGANIC MATERIAL | ACCUGLASS311 (MADE BY HONEYWELL INTERNATIONAL INC.) | | 0 |
| (C) | INORGANIC MATERIAL | TGA-MPA (MADE BY APOLLORINK INC.) | | 0 |
| (D) | ORGANIC MATERIAL- INORGANIC MATERIAL- COMPLEX | X22-164A | 0.25 | 0 |
| | | SH710 | 0.25 | |
| | | TTB | 37.5 | |
| | | DEDFS | 12.5 | |
| | | 3APTMS | 50 | |
| | | I. 184 | 2.8 | |
| (E) | ORGANIC MATERIAL- INORGANIC MATERIAL- COMPLEX | TTB | 37.4 | 0 |
| | | DEDFS | 11 | |
| | | SH710 | 4.4 | |
| | | 3APTMS | 17.6 | |
| | | M211B | 8.8 | |
| | | M101A | 8.8 | |
| | | M350 | 8.8 | |
| | | I. 184 | 2.2 | |

TABLE 4-continued

| SOL-GEL MATERIAL | CATEGORY | RAW MATERIAL | WEIGHT (g) | CONDENSATION TIME (h) |
|---|---|---|---|---|
| (F) | ORGANIC MATERIAL-INORGANIC MATERIAL-COMPLEX | TTB | 37.4 | 4 |
| | | DEDFS | 11 | |
| | | SH710 | 4.4 | |
| | | 3APTMS | 17.6 | |
| | | M211B | 8.8 | |
| | | M101A | 8.8 | |
| | | M350 | 8.8 | |
| | | I. 184 | 2.2 | |

The sol-gel material was diluted with PGME (propylene glycol monomethyl ether), and the dilute ratio was adjusted so that the film thickness of the dried solid content was 1 μm. By Micro Gravure coating, the diluted sol-gel material was coated on the fine concavo-convex structure of each of the resin molds A and B. Next, the solvent was removed, while performing the sol-gel reaction for gelation, and a fine-structure layered product (A) was prepared. Gelation was performed in an environment of 25° C.·moisture 50%.

Next, the inorganic layer of the fine-structure layered product (A) was laminated onto a glass substrate of 500 mm×1,000 mm. Laminating was performed with a laminator. When the sol-gel materials (A) to (C) were used, a layered product (1) for transfer was prepared by leaving for 12 hours in an environment of room temperature·moisture 50%, and then, peeling off each of the resin molds A and B. Meanwhile, when the sol-gel materials (D) to (E) were used, a layered product (1) for transfer was prepared by applying UV through each of the resin molds A and B, leaving for 10 minutes in an environment of room temperature·moisture 50%, and then, peeling off each of the resin molds A and B.

<Evaluation of the Layered Product (1) for Transfer>

Samples were prepared by cutting the layered product (1) for transfer. For the prepared samples, the surface of the inorganic layer was observed and evaluated with the scanning electron microscope. Evaluation results are shown in following Table 5. In following Table 5, ○ represents that the fine concavo-convex structure was transferred to 90% or more of the transfer area, Δ represents transfer of 70% to less than 90%, and X represents transfer less than 70%. Further, X also represents the case where the sol-gel material of the inorganic layer was unhardened.

materials and shapes of the concavo-convex structures when Es/Eb is in the predetermined range.

Figure 13:
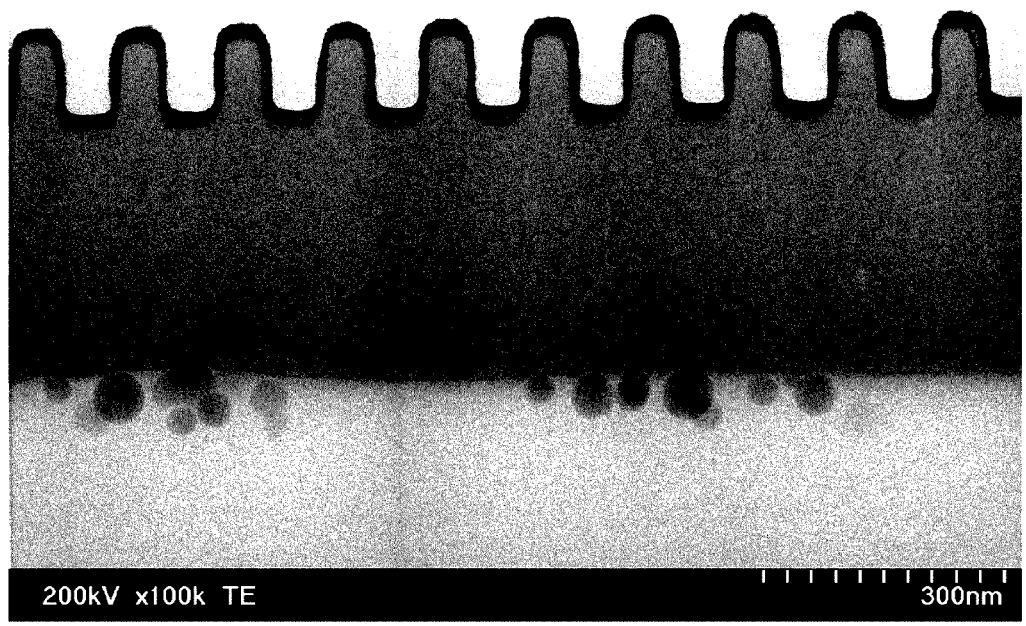
FIG. 13 is a section transmission electron microscope photograph (TEM image) of a transferred layered product of the fine-structure product according to the Example.

FIG. 13 shows a section transmission electron microscope photograph (TEM image) of the transferred layered product prepared by using the sol-gel material (A). As can be seen from FIG. 13, it is understood that the line-and-space structure did not become distorted over the paper front-depth direction (line direction), and that the fine concavo-convex structure was transferred with high accuracy without any defect up to the edge portion.

Example 14

A fine-structure layered product (B) was prepared in the same way as in Example 13 except polycondensation of the sol-gel material was promoted to eliminate the surface tack property by passing through a dry atmosphere of 80° C. in applying the sol-gel material. The surface of the inorganic layer of the prepared fine-structure layered product (2) was covered with a cover film made of polyethylene, and was reeled.

Next, the fine-structure layered product (B) was wound out, and the cover film was peeled off. The same sol-gel material as the sol-gel material contained in the sol-gel layer of the fine-structure layered product (B) was coated on a glass substrate of 500 mm×1,000 mm with a bar coater so that the film thickness was 1 μm. Next, the sol-gel material underwent gelation in an atmosphere of 80° C. and moisture 60%, and the inorganic layer subjected to gelation was laminated to the surface of the sol-gel layer of the fine-structure layered product (B) with the laminator. Next, the resin mold was peeled off from the fine-structure layered product (B) to prepare a layered product (2-1) for transfer. When the sol-gel materials (A) to (C) were used, the resin

TABLE 5

| | CONCAVO-CONVEX STRUCTURE | Es/Eb | SOL-GEL MATERIAL | DETERMINATION | SUBSTRATE | CONCAVO-CONVEX STRUCTURE | STRUCTURE |
|---|---|---|---|---|---|---|---|
| RESIN MOLD A | CONVEX TYPE | 55 | (A)~(F) | ○ | GLASS | CONCAVE TYPE | PITCH 200 nm |
| | | 49 | | | | | DEPTH 200 nm |
| | | 74 | | | | | OPENING DIAMETER 180 nm |
| RESIN MOLD B | LINE-AND-SPACE CONCAVE TYPE | 48 | | | | LINE-AND-SPACE CONVEX TYPE | PITCH 130 nm |
| | | 68 | | | | | PITCH 460 nm |
| | | 49 | | | | | HEIGHT 460 nm |
| | | 43 | | | | | |

As shown in Table 5, when the layered product (1) for transfer was used, the fine concavo-convex structure was transferred to the inorganic layers of all the samples. From the result, it is understood that it is possible to obtain excellent transfer results irrespective of types of the sol-gel mold was peeled off after leaving for 12 hours in an environment of room temperature·moisture 50%. Meanwhile, when the sol-gel materials (D) to (F) were used, the resin mold was peeled off after applying UV from the resin mold side, and leaving for 30 minutes.

Further, the same sol-gel material as the sol-gel material contained in the sol-gel layer of the fine-structure layered product (B) was coated on a sapphire substrate of 4 inches with a spin coater so that the film thickness was 700 nm. Next, six sapphire substrates left for 2 minutes in an environment of 25° C. moisture 50% were arranged so that two substrates were disposed transversely and that three substrates were disposed longitudinally. The inorganic layer of the fine-structure layered product (B) was laminated to the sol-gel layers of these six sapphire substrates. The following operation was performed in the same way as the case of the above-mentioned glass substrate to prepare a layered product (2-2) for transfer.

<Evaluation of Layered Products (2-1, 2-2) for Transfer>

Samples were prepared by cutting the layered product (2-1) for transfer using the glass substrate and the layered product (2-1) for transfer using the sapphire substrates as the substrate. For the prepared samples, the surface of the inorganic layer was observed and evaluated with the scanning electron microscope. Evaluation results are shown in following Table 6. In addition, in following Table 6, the evaluation was made using the same criteria as in Table 5.

thickness was 700 nm. In addition, as the applied sol-gel material, the same materials as the sol-gel materials used in preparing the fine-structure layered product (C) were used. Next, the surface of the newly coated inorganic layer was laminated to a glass substrate of 500 mm×1,000 mm. Then, as in Example 14, the resin mold was peeled off to prepare a layered product (3-1) for transfer. Further, as in Example 14, sapphire substrates were used to prepare a layered product (3-2) for transfer.

<Evaluation of Layered Products (3-1, 3-2) for Transfer>

As in Example 14, for samples obtained by cutting the layered products (3-1) and (3-2) for transfer, the surface of the inorganic layer was observed with the scanning electron microscope. As a result, fine structures that were transferred and formed were confirmed on all the samples, and the same results as in above-mentioned Table 6 were obtained.

Example 16

The correlation between the content of Ti alkoxide in the sol-gel material and the refractive index was examined for the sol-gel materials as shown in above-mentioned Table 4.

TABLE 6

| MOLD | CONCAVO-CONVEX STRUCTURE | Es/Eb | SOL-GEL MATERIAL | DETERMINATION | SUBSTRATE | CONCAVO-CONVEX STRUCTURE | |
|---|---|---|---|---|---|---|---|
| RESIN MOLD A | CONVEX TYPE | 55 | (A)~(F) | ◯ | GLASS | CONCAVE TYPE | PITCH 200 nm |
| | | 49 | | | | | DEPTH 200 nm |
| | | 74 | | | | | OPENING |
| | | 55 | | ◯ | SAPPHIRE | | DIAMETER 180 nm |
| | | 49 | | | | | |
| | | 74 | | | | | |
| RESIN MOLD B | CONCAVE TYPE | 68 | (A)~(F) | ◯ | GLASS | CONVEX TYPE | PITCH 460 nm |
| | | 49 | | | | | HEIGHT 460 nm |
| | | 43 | | | | | |
| | | 68 | | ◯ | SAPPHIRE | | |
| | | 49 | | | | | |
| | | 43 | | | | | |

As shown in Table 6, when the layered product (2-1) for transfer and the layered product (2-2) for transfer were used, it was confirmed that the fine concavo-convex structure was transferred and formed onto all the samples. From the result, it is understood that it is possible to obtain excellent transfer results irrespective of types of the sol-gel materials and shapes of the concavo-convex structures when Es/Eb is in the predetermined range.

Example 15

A first inorganic layer containing the sol-gel material was formed on each of the resin molds A and B to prepare a fine-structure layered product. A second inorganic layer containing the sol-gel material was further formed on the first inorganic layer to prepare a fine-structure layered product (C). As the sol-gel material, the materials shown in above-mentioned Table 4 were used. The first inorganic layer and the second inorganic layer were formed on the same conditions as in Example 13 except passing through a dry atmosphere of 80° C. Next, the prepared fine-structure layered product (C) was covered with a cover film made of polyethylene, and was reeled.

Figure 14:
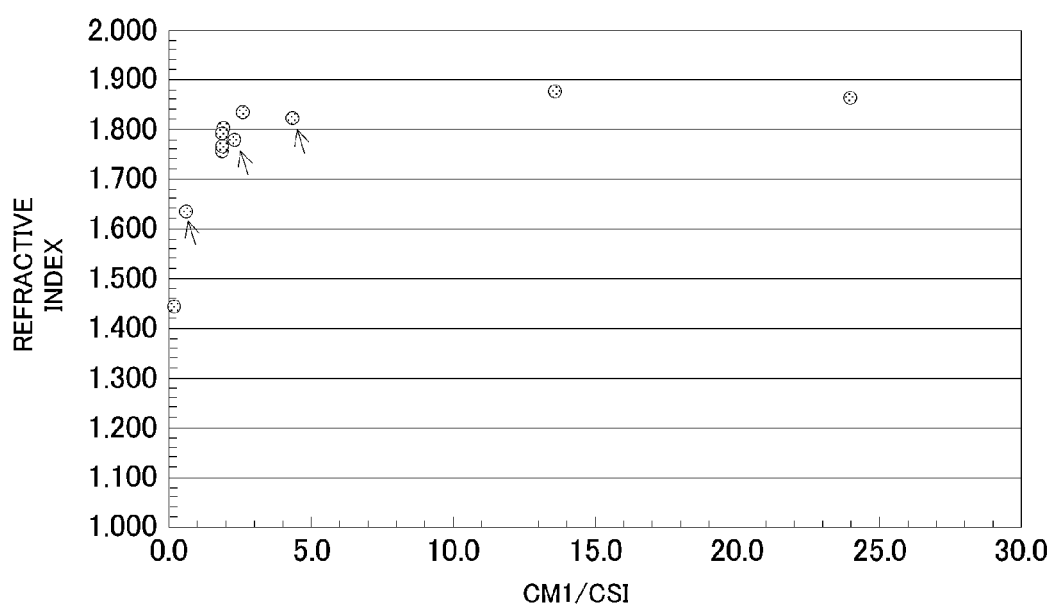
FIG. 14 is a graph showing correlation between the content rate of Ti alkoxide in the sol-gel material and the refractive index.

Next, the fine-structure layered product (C) was wound out, and the cover film was peeled off. Next, using the same apparatus as in manufacturing of the resin molds A and B, the sol-gel material was further coated on the inorganic layer of the fine-structure layered product (C) so that the solid film The results are shown in FIG. 14. In FIG. 14, CM1/CSi in the horizontal axis means the ratio between the mole concentration (CSi) of metal alkoxide having metal species Si, and the mole concentration (CM1) of metal alkoxide having metal species Ti. As the sol-gel materials, the materials of rates of plots shown by the arrows in FIG. 14 were used. As a result, transferred and formed fine structures were confirmed. As shown in FIG. 14, it is understood that the refractive index is high in the case where CM1/CSi is 2.5 or more. In addition, plots except the plots shown by the arrows in FIG. 14 indicate the relationship between CSi and CM1, and the refractive index Comparative Example 1

Preparation of the Mold

As a substrate of a flat-shaped die, a 4-inch quartz glass roll was used. A fine concavo-convex structure was formed on the surface of the quartz glass roll, by the direct-drawing lithography method using a semiconductor laser. Then, the surface of the quartz glass roll with the fine concavo-convex structure formed was coated with DURASURF HD-1101Z (made by Daikin Industries. Ltd.), heated at 60° C. for 1 hour, then left at room temperature for 24 hours, and fixed. Subsequently, the surface was cleaned three times using DURASURF HD-ZV (made by Daikin Industries, Ltd.), and mold release treatment was applied to prepare a glass-made mold (non-resin-made mold). As the fine concavo-convex structure, concavo-convex structures respectively with a pitch of 200 nm and a pitch of 460 nm were prepared.

<Preparation of Layered Products (4-1) and (4-2) for Transfer>

An inorganic layer containing the sol-gel material was formed on the glass-made mold. As the sol-gel material, the materials shown in above-mentioned Table 4 were used. A film of the sol-gel material diluted with PGME was formed on the fine concavo-convex structure of the glass-made mold by the spin coating method so that the film thickness was 1 μm. Next, the inorganic layer was laminated to a 6-inch glass substrate. Using the sol-gel materials (A) to (C), layered products (4-1) for transfer were prepared by leaving for 12 hours in an environment of room temperature·moisture 50%, and then, peeling off the glass-made mold. Further, using the sol-gel materials (D) to (F), layered products (4-2) for transfer were prepared by applying UV from the glass-made mold side, leaving for 20 minutes, and then, peeling the glass-made mold.

<Evaluation of Layered Products (4-1) and (4-2) for Transfer>

The prepared layered products (4-1) and (4-2) for transfer were evaluated in the same manner as in the layered products (1) and (3-2) for transfer according to Examples 13 to 15. The results are shown in following Table 7. In following Table 7, the determination was made using the same criteria as in above-mentioned Table 5.

TABLE 7

| | CONCAVO-CONVEX STRUCTURE | | $E_s/E_b$ | SOL-GEL MATERIAL | DETERMINATION |
|---|---|---|---|---|---|
| GLASS SUBSTRATE | CONVEX TYPE | PITCH 200 nm HEIGHT 200 nm | $36/0 \to \infty$ | (A)~(C) | x |
| | | | | (D)~(F) | x |
| | CONCAVE TYPE | PITCH 200 nm DEPTH 200 nm OPENING DIAMETER 180 nm | $34/0 \to \infty$ | (A)~(C) | x |
| | | | | (D)~(F) | x |
| | CONVEX TYPE | PITCH 460 nm HEIGHT 460 nm | $36/0 \to \infty$ | (A)~(C) | x |
| | | | | (D)~(F) | x |
| | CONCAVE TYPE | PITCH 460 nm DEPTH 460 nm OPENING DIAMETER 430 nm | $34/0 \to \infty$ | (A)~(C) | x |
| | | | | (D)~(F) | x |

As shown in Table 7, when the sol-gel materials (A) to (C) were used, the sol-gel materials were not hardened, and the fine structure was neither transferred nor formed. Meanwhile, when the sol-gel materials (D) to (F) were used, hardening of the sol-gel materials was confirmed, but peeling failures were large in peeling the glass-made mold, and many transfer failures were identified inside the surface of the 4-inch cut sample. From the results, when $E_s/E_b$ is substantially infinite, it is understood that the transfer result fails even using any one of the sol-gel materials (A) to (F).

Comparative Example 2

Preparation of Layered Products (5-1) and (5-2) for Transfer

Using the glass-made mold prepared in the same manner as in Comparative Example 1, an inorganic layer containing the sol-gel material was formed on the fine concavo-convex structure of the glass-made mold as in Comparative Example 1. Next, after drying at 80° C. for 10 minutes, the same sol-gel material was spin-coated on an 8-inch glass substrate so that the film thickness was 700 nm, and the inorganic layer was formed. Subsequently, the surface of the inorganic layer of the glass-made mold was laminated to the inorganic layer of the glass substrate. Layered products (5-1) and (5-2) for transfer were prepared in the same manner as in Comparative Example 1 except the aforementioned respect.

<Evaluation of Layered Products (5-1) and (5-2) for Transfer>

The prepared layered products (5-1) and (5-2) for transfer were evaluated in the same manner as in Comparative Example 1. As a result, as in the layered products (4-1) and (4-2) according to Comparative Example 1, when the sol-gel materials (A) to (C) were used, the sol-gel materials were not hardened, and the fine concavo-convex structure was not transferred. Meanwhile, when the sol-gel materials (D) to (F) were used, hardening of the sol-gel materials was confirmed, but peeling failures were large in peeling the glass-made mold, and many transfer failures were identified inside the surface of the 4-inch cut sample.

Comparative Example 3

Preparation of Layered Products (6-1) and (6-2) for Transfer

Using the glass-made mold prepared in the same manner as in Comparative Example 1, an inorganic layer containing the sol-gel material was formed on the fine concavo-convex structure of the glass-made mold as in Comparative Example 1. Next, after drying the inorganic layer at 80° C. for 10 minutes, the same sol-gel material was spin-coated on the hardened inorganic layer so that the film thickness was 700 nm. Subsequently, the surface of the inorganic layer of the glass-made mold was laminated to the inorganic layer of the glass substrate. Subsequently, layered products (6-1) and (6-2) for transfer were prepared by peeling the glass-made mold as in Comparative Example 1.

<Evaluation of Layered Products (6-1) and (6-2) for Transfer>

The prepared layered products (6-1) and (6-2) for transfer were evaluated in the same manner as in Comparative Example 1. As a result, as in the layered products (4-1) and (4-2) according to Comparative Example 1, when the sol-gel materials (A) to (C) were used, the sol-gel materials were not hardened, and the fine concavo-convex structure was not transferred. Meanwhile, when the sol-gel materials (D) to (F) were used, hardening of the sol-gel materials was confirmed, but peeling failures were large in peeling the glass-made mold, and many transfer failures were identified inside the surface of the 4-inch cut sample.

Next, the inventors of the present invention studied the relationship between the surface fluorine element concentration Es and average fluorine element concentration Eb of the resin mold (resin layer) and transfer performance. The content studied by the inventors of the invention will be described below.

Example 17

Preparation of a Glass-Made Mold

A glass-made mold was prepared in the same manner as in the glass-made mold according to Comparative Example 1. In this glass-made mold, the pitch was 460 nm, the depth was 460 nm, and the opening diameter was 430 nm. In the glass-made mold, since the average fluorine element concentration Eb approaches 0, the Es/Eb value approaches ∞ (infinite).

<Preparation of the Resin Mold B>

Used was a cylindrical master mold provided with a fine concavo-convex structure in the shape of holes on the outer surface of the cylindrical master mold. In the fine concavo-convex structure, the pitch was 460 nm, the opening diameter was 430 nm, and the depth was 460 nm. Next, the resin mold A was prepared as in Example 13, and resin molds B (1) to (12) were prepared using the prepared resin mold A as a mold.

In the resin molds B (1) to (8), as a transfer material resin in preparing the resin mold A, a mixture was used which was obtained by preparing OPTOOL DAC HP (made by Daikin Industries, Ltd.), trimethylol propane triacrylate (made by TOAGOSEI CO. LTD. M350), Irgacure 184 and Irgacure 369 in a ratio of X:100:5.5:2.0 in parts by weight. In the order of the resin molds B (1) to (8), the above-mentioned X was set at 0.5, 2, 5, 10, 15, 17.5, 20 and 30. The resin molds B were prepared using the resin mold A as a mold. At this point, by adjusting the fluorine element concentration in the resin mold B raw materials, Es/Eb of the prepared resin mold B was adjusted.

In the resin mold (9), the resin mold B was prepared in the same manner as in the resin molds (1) to (8) except that CHEMINOX FAMAC-6 (made by UNIMATEC Co., LTD.) was substituted for OPTOOL DAC HP (made by Daikin Industries, Ltd.), and that used as a transfer material resin was a solution obtained by mixing FAMAC-6, trimethylol propane triacrylate (made by TOAGOSEI CO. LTD. M350), and Irgacure 184 in a ratio of 2:100:5 in parts by weight.

In the resin molds B (10) and (11), as a transfer material resin in preparing the resin mold A, a mixture was used which was obtained by preparing OPTOOL DAC HP (made by Daikin Industries, Ltd.), trimethylol propane triacrylate (made by TOAGOSEI CO. LTD. M350), Irgacure 184 and Irgacure 369 in a ratio of Y:100:5.5:2.0 in parts by weight. Next, UV-$O_3$ treatment was applied to the fine concavo-convex structure surface side of the resin mold A. Using the resin mold A subjected to UV-$O_3$ treatment as a mold, the resin molds B were prepared. In the order of the resin molds B (10) and (11), the above-mentioned Y was set at 17.5 and 10. At this point, by adjusting the fluorine element concentration in the resin mold B raw materials, Es/Eb of the prepared resin mold was adjusted.

In the resin mold B, mixed were 45 parts by weight of trifluoroethyl methacrylate, 45 parts by weight of perfluorooctyl ethyl acrylate, 10 parts by weight of glycidyl methacrylate, 0.5 part by weight of dodecyl mercaptan, 1.5 part by weight of 2,2'-azobis(2-methyl-butyli-nitrile), and 200 parts by weight of methyl ethyl ketone, the mixture was stirred at 80 degree for 7 hours under a nitrogen atmosphere, and prepolymer diluted with the methyl ethyl ketone solution was obtained. Next, a resin solution was prepared by mixing 26 parts by weight of the methyl ethyl ketone solution of prepolymer, 4 parts by weight of Fluorite FE-16 and 0.2 part by weight of San-Aid SI-100L (Trade name of SANSHIN CHEMICAL INDUSTRIES CO., LTD.) and diluting with methyl ethyl ketone so that the solid content was 10%. The resin mold B was prepared in the same manner as in the resin molds (1) to (8) except that the resin solution was used as a transfer material resin.

(2-2) Transfer Test

Transfer tests were performed using each of the resin molds B (1) to (12) and glass-made mold on three conditions described below.

Transfer test 1 . . . . The transfer test was performed as in Comparative Example 1.

Transfer test 2 . . . . The transfer test was performed as in Comparative Example 2.

Transfer test 3 . . . . The transfer test was performed as in Comparative Example 3.

The transfer test results are shown in following Table 8. In addition, in following Table 8, evaluation was made by visual inspection in peeling the resin mold B, and observation of the fine structure with the scanning electron microscope. ⊚ represents the case that the fine concavo-convex structure was transferred and formed over the area of 80% or more of the substrate, ○ represents the case that the fine concavo-convex structure was transferred and formed over the area of 60% or more less than 80% of the substrate, Δ represents the case that the fine concavo-convex structure was transferred and formed over the area of 40% or more less than 60% of the substrate, and X represents the case that the fine concavo-convex structure was transferred and formed over the area of less than 40% of the substrate, the case that all sol-gel materials adhered to the resin mold B side, or the case that the sol-gel material was unhardened.

TABLE 8

| MOLD | Es/Eb | TRANSFER TEST 1 | TRANSFER TEST 2 | TRANSFER TEST 3 |
|---|---|---|---|---|
| GLASS-MADE MOLD | →∞ | X | X | X |
| RESIN MOLD B (1) | 684 | X | X | X |
| RESIN MOLD B (2) | 235 | Δ | Δ | Δ |
| RESIN MOLD B (3) | 120 | ○ | ○ | ○ |
| RESIN MOLD B (4) | 68 | ○ | ○ | ○ |
| RESIN MOLD B (5) | 49 | ⊚ | ⊚ | ⊚ |
| RESIN MOLD B (6) | 43 | ⊚ | ⊚ | ⊚ |
| RESIN MOLD B (7) | 39 | ⊚ | ⊚ | ⊚ |
| RESIN MOLD B (8) | 29 | ⊚ | ⊚ | ⊚ |
| RESIN MOLD B (9) | 26 | ○ | ○ | ○ |
| RESIN MOLD B (10) | 9 | Δ | Δ | Δ |
| RESIN MOLD B (11) | 2 | X | X | X |
| RESIN MOLD B (12) | 1 | X | X | X |

As can be seen from Table 8, it is understood that it is possible to transfer with high transfer accuracy by adjusting Es/Eb of the resin mold (resin layer) to the range of 9 to 235.

Example 18

Using the fine-structure layered products according to above-mentioned Embodiments 1 to 4, polarizers, diffraction grating substrates and non-reflecting substrates were prepared, and performance thereof was evaluated.

<Polarizer>

A cylindrical master mold was prepared which was provided on its surface with a line-and-space structure with a pitch of 145 nm, height of 150 nm and width of 65 nm. Next, the resin mold A was prepared as in Example 13. Es/Eb of the prepared resin mold A was 48.

A glass substrate of 300 mm×500 mm was treated with DURASURF 2101Z, and then, was cleaned with DURASURF HD-ZV. Next, TGA-MPA (made by APOLLORINK Inc.) was dropped onto the surface of the glass substrate, was nipped with the resin mold A, while being drawn using a rubber roller from above the resin mold A, and was dried at room temperature moisture of 50% for 24 hours. Then, by peeling off the resin mold A, the fine-structure layered product was prepared.

Next, the fine concavo-convex structure surface side of the fine-structure layered product was laminated onto a film of TGA-MAP formed by the spin coating method so that the film thickness was 700 nm on the glass substrate surface with a diameter of 4 inches subjected to UV-$O_3$ treatment, and was cured in an atmosphere of room temperature and moisture 50% for 24 hours. Subsequently, the resin mold A was peeled off, and the line-and-space structure formed of the hardened material of TGA-MPA was obtained on the glass substrate with the diameter of 4 inches.

Next, a dielectric layer (silicon dioxide layer) was formed on the line-and-space structure side of the glass substrate with the diameter of 4 inches using a sputtering method. As sputtering conditions, Ar gas pressure was 0.2 Pa, sputtering power was 770 W/cm$^2$, the coating velocity was 0.1 nm/s, and the film was formed so that the dielectric average thickness on the line-and-space structure was 3 nm. Herein, a glass substrate with a smooth surface was inserted in the apparatus together with the glass substrate with the diameter of 4 inches provided with line-and-space structure to measure the thickness of the dielectric, and the dielectric thickness on the smooth glass substrate was defined as the dielectric average thickness.

Next, a film of aluminum (Al) was formed on the line-and-space structure surface with the dielectric layer formed by vacuum deposition. As deposition conditions of Al, at room temperature, the degree of vacuum was 2.0×10' Pa, and the deposition velocity was 40 nm/s. A glass substrate with a smooth surface was also inserted in the apparatus to measure the thickness of Al, the Al thickness on the smooth glass substrate was defined as the Al average thickness, and a deposition angle θ was defined by an angle between the vertical direction to the glass substrate surface and the deposition source in the plane perpendicularly intersecting the extending direction of the convex portion of the line-and-space structure. The deposition angle θ was 20° C., and the Al average thickness was 133 nm.

Next, unnecessary Al was removed by immersing in an alkali aqueous solution. For removal of unnecessary Al, the glass substrate with the diameter of 4 inches with Al deposited was immersed in 0.1 percent by weight aqueous sodium hydroxide at room temperature for 80 seconds, and a non-reflecting wire grid polarizer was obtained.

A polarization evaluation apparatus (made by JASCO Corporation, V7000) was used for measurement of the degree of polarization and light transmittance. Measurement was performed on conditions of 23° C. and 65% RH. As a result, the degree of polarization was 99.90%, and the light transmittance was 42.5%. In addition, the degree of polarization and the light transmittance were calculated by following Eq. (1). Imax represents the intensity of transmission light in parallel Nicol relative to linear polarization, and Imin represents the intensity of transmission light in a crossed Nicol state. In addition, the light transmittance T(θ) represents the light transmittance of the incident light angle θ.

The degree of polarization=[($I$max−$I$min)/($I$max+$I$min)]×100%   Eq. (1)

<Non-Reflecting Substrate>

A cylindrical master mold was prepared which was provided with the shape of holes with a pitch of 200 nm, opening diameter of 185 nm and height of 210 nm. The resin mold B was prepared as in Example 13. The resin mold B with Es/Eb of 49 was used.

The sol-gel material (C) was formed on the fine structure side of the resin mold B as in Example 13, and the fine-structure layered product was obtained. The fine-structure layered product was covered with a cover film of polyethylene, and 200 m of the resin mold was reeled. Next, the reeled fine-structure layered product was wound out and cut into a width of 300 mm and length of 1.5 m. Next, the sol-gel material (C) was coated on the glass substrate of 300 mm×1 m so that the film thickness was 700 nm, and was left in an atmosphere of room temperature·moisture 50% for 3 minutes, and the inorganic layer was formed. Next, the sol-gel material (C) was coated on the glass substrate, and the inorganic layer was formed. The inorganic layer of the glass substrate was laminated to the inorganic layer of the fine-structure layered product, and then, cured in an atmosphere of room temperature moisture 50% for 12 hours. Finally, the resin mold B was peeled off. After peeling off the resin mold B, the obtained glass substrate was heated at 180° C. for 30 minutes.

The obtained glass substrate was torn, and when the surface fine concavo-convex structure was checked with SEM, the pitch was 200 nm, while the height was 200 nm. When the reflectance of the torn piece was measured, the average reflectance was 1% or less at wavelengths of 350 nm to 800 nm, while being 0.1% at a wavelength of 350 nm, and it is understood that the non-reflecting surface was prepared.

Described next are Examples and Comparative Examples of the manufacturing method of a fine-structure product according to the second aspect of the invention.

Example 19

(a) Mold Preparation Process

A quartz glass roll was used as a substrate of the cylindrical master mold. A fine concavo-convex structure was formed on the outer surface of the quartz glass roll, by the direct-drawing lithography method using a semiconductor laser. Next, the surface of the quartz glass roll with the fine concavo-convex structure formed was coated with DURASURF HD-1101Z (made by Daikin Industries, Ltd.), heated at 60° C. for 1 hour, then left at room temperature for 24 hours, and fixed. Subsequently, the surface was cleaned three times using DURASURF HD-ZV (made by Daikin Industries, Ltd.), mold release treatment was applied, and the cylindrical master mold was prepared.

A PET film: A-4100 (made by Toyobo Co., Ltd.: width 300 mm, thickness 100 μm) was used as a substrate (transparent sheet), and NIAC 702 (made by Daicel Corporation) was used as a light curable resin. The light curable resin was coated on an easy adhesion surface of the PET film that is the substrate by Micro Gravure coating (made by Yasui Seiki Co., Ltd.) so that the coating film thickness was 6 μm.

Next, the PET film coated with the above-mentioned light curable resin was pressed against the outer surface of the cylindrical master mold with a nip roll (0.1 MPa), was irradiated with ultraviolet rays, and was light cross-linked continuously. The conditions of light cross-linking were a temperature of 25° C. and moisture of 60% under atmospheric pressure, and the integral amount of exposure below the center of the lamp of 600 mJ/cm$^2$. Further, as a light source of ultraviolet rays, the UV exposure apparatus (Fusion UV Systems Japan Co., Ltd., H bulb) was used, and light cross-linking was performed continuously.

After light cross-linking, a protective film (polyethylene film: thickness 20 μm) was laminated, and by reeling continuously after protecting the fine concavo-convex structure, the reel-shaped resin mold was prepared.

(b) Inorganic Layer Formation Process

The protective film of the reel-shaped resin mold was reeled off, and the sol-gel material (TGA-FPA, made by APOLLORINK Inc.) was coated on the fine concavo-convex structure on the surface of the reel-shaped resin mold by Gravure coating so that the film thickness was 3 μm. Subsequently, drying was performed on conditions of 80° C. and 10 minutes, and then, cuts of 300 mm square were made.

(d) Layering Process

Soda sheet glass of the same dimensions was layered on the cut PET film.

(c) Preliminary Hardening Process

The laminate was partially hardened again in an oven under a nitrogen atmosphere on conditions of 100° C. and 1 hour.

(e) Transfer Process

Next, the laminate was immersed in toluene at room temperature for 5 minutes, and the PET film and the light curable resin were peeled off from the soda sheet glass.

(f) Hardening Process

The soda sheet glass from which the reel-shaped resin mold was peeled off was completely hardened in an oven under a nitrogen atmosphere on conditions of 300° C. and 1 hour, and the fine-structure product was prepared. As a result of checking the shape of the fine concavo-convex structure of the fine-structure product by scanning electron microscope observation, the distance between adjacent convex portions was 250 nm, and the convex height was 250 nm.

The fine-structure product was cut into 30 mm squares arbitrarily to be evaluation samples. For the evaluation samples, using a spectrophotometer (made by Shimadzu Corporation, UV-2450 (large sample chamber: MPC-2200 installation model)), measured were transmittance in an arbitrary wavelength region, regular reflectance at an incident angle of 5°, and diffuse reflectance (including regular reflectance) at an incident angle of 8°.

Example 20

(a) Mold Preparation Process

A quartz glass roll was used as a substrate of the cylindrical master mold. A fine concavo-convex structure was formed on the outer surface of the quartz glass roll, by the direct-drawing lithography method using a semiconductor laser. The surface of the quartz glass roll with the fine concavo-convex structure formed was coated with DURASURF HD-1101Z (made by Daikin Industries, Ltd.), heated at 60° C. for 1 hour, then left at room temperature for 24 hours, and fixed. Subsequently, the surface was cleaned three times using DURASURF HD-ZV (made by Daikin Industries, Ltd.), mold release treatment was applied, and the cylindrical master mold was prepared.

A PET film: A-4100 (made by Toyobo Co., Ltd.: width 300 mm, thickness 100 μm) was used as a substrate (transparent sheet), and NIAC 702 (made by Daicel Corporation) was used as a light curable resin. The light curable resin was coated on the substrate surface (an easy adhesion surface of the PET film) by Micro Gravure coating (made by Yasui Seiki Co., Ltd.) so that the coating film thickness was 6 μm.

Next, the substrate (PET film) coated with the light curable resin was pressed against the cylindrical master mold with a nip roll (0.1 MPa), and was irradiated with ultraviolet rays at a temperature of 25° C. and moisture of 60% under atmospheric pressure, using the UV exposure apparatus (Fusion UV Systems Japan Co., Ltd., H bulb) so that the integral amount of exposure below the center of the lamp was 600 mJ/cm$^2$, and light cross-linking was performed continuously.

After light cross-linking, a protective film (polyethylene film: thickness 20 μm) was laminated, the fine concavo-convex structure was protected, and was reeled off continuously, and the reel-shaped resin mold was prepared.

(b) Inorganic Layer Formation Process

The protective film of the reel-shaped resin mold was reeled off, and the sol-gel material (TGA-FPA, made by APOLLORINK Inc.) was coated on the surface with the fine concavo-convex structure formed by Gravure coating so that the film thickness was 3 μm.

(g) Cover Film Layering Process

Subsequently, drying was performed on conditions of 80° C. and 10 minutes, and then, a cover film (polyethylene film: thickness 20 μm) was layered on the inorganic layer by the laminate method.

(c) Preliminary Hardening Process

The laminate was partially hardened again in an oven under a nitrogen atmosphere on conditions of 80° C. and 12 hours.

(d) Layering Process

After cutting into a 300 mm square, soda sheet glass of the same dimensions was layered on the substrate (PET film) from which the cover film was peeled off.

(c) Preliminary Hardening Process

The laminate was partially hardened again in an oven under a nitrogen atmosphere on conditions of 100° C. and 1 hour.

(e) Transfer Process

Next, the laminate was immersed in toluene at room temperature for 5 minutes, and the substrate (PET film) and the light curable resin were peeled off from the soda sheet glass.

(f) Hardening Process

The soda sheet glass from which the reel-shaped resin mold was peeled off was completely hardened in an oven under a nitrogen atmosphere on conditions of 300° C. and 1 hour, and the fine-structure product was prepared. As a result of checking the shape of the obtained fine concavo-convex structure by scanning electron microscope observation, the distance between adjacent convex portions was 250 nm, and the convex height was 250 nm.

The obtained fine-structure product was cut into 30 mm squares arbitrarily to be evaluation samples. For the evaluation samples, using the spectrophotometer (made by Shimadzu Corporation, UV-2450 large sample chamber (MPC-2200 installation model)), measured were transmittance in an arbitrary wavelength region, regular reflectance at an incident angle of 5°, and diffuse reflectance (including regular reflectance) at an incident angle of 8°.

Example 21

(a) Mold Preparation Process

A quartz glass roll was used as a substrate of the cylindrical master mold. A fine concavo-convex structure was formed on the outer surface of the quartz glass roll, by the direct-drawing lithography method using a semiconductor laser. The surface of the quartz glass roll with the fine concavo-convex structure formed was coated with DURASURF HD-1101Z (made by Daikin Industries, Ltd.), heated at 60° C. for 1 hour, then left at room temperature for 24 hours, and fixed. Subsequently, the surface was cleaned three times using DURASURF HD-ZV (made by Daikin Industries, Ltd.), and mold release treatment was applied.

A PET film: A-4100 (made by Toyobo Co., Ltd.: width 300 mm, thickness 100 m) was used as a substrate (transparent sheet), and as a light curable resin, used was a light curable resin prepared by mixing OPTOOL DAC HP (made by Daikin Industries, Ltd.), trimethylol propane triacrylate (made by TOAGOSEI CO. LTD. M350) and Irgacure 184 (made by Ciba) in a ratio of 10:100:5 in parts by weight. The light curable resin was coated on the substrate surface (an easy adhesion surface of the PET film) by Micro Gravure coating (made by Yasui Seiki Co., Ltd.) so that the coating film thickness was 6 μm.

Next, the substrate (PET film) coated with the light curable resin was pressed against the cylindrical master mold with a nip roll (0.1 MPa), was irradiated with ultraviolet rays under conditions of a temperature of 25° C. and moisture of 60% under atmospheric pressure, using the UV exposure apparatus (Fusion UV Systems Japan Co., Ltd., H bulb) so that the integral amount of exposure below the center of the lamp was 600 mJ/cm², and light cross-linking was performed continuously.

After light cross-linking, a protective film (polyethylene film: thickness 20 μm) was laminated, the fine concavo-convex structure was protected, and was reeled off continuously, and the reel-shaped resin mold was prepared.

(b) Inorganic Layer Formation Process

The protective film of the reel-shaped resin mold was reeled off, and TGA-FPA, made by APOLLORINK Inc. was coated on the surface with the fine concavo-convex structure formed by Gravure coating so that the film thickness was 3 μm.

(g) Cover Film Layering Process

Subsequently, drying was performed on conditions of 80° C. and 10 minutes, and then, a cover film ((polyethylene film: thickness 20 μm) was layered on the TGA-FPA by the laminate method.

(c) Preliminary Hardening Process

The laminate was partially hardened again in an oven under a nitrogen atmosphere at 80° C. for 12 hours.

(d) Layering Process

After cutting into a 300 mm square, the cover film was peeled off, and soda sheet glass of the same dimensions coated with a two-part epoxy adhesive (epoxy-thiol system) was layered.

(e) Transfer Process

Next, the laminate was immersed in toluene at room temperature for 5 minutes, and the PET film and the light curable resin were peeled off from the soda sheet glass.

(f) Hardening Process

The soda sheet glass from which the reel-shaped resin mold was peeled off was completely hardened in an oven under a nitrogen atmosphere on conditions of 300° C. and 1 hour. As a result of checking the shape of the obtained fine concavo-convex structure by scanning electron microscope observation, the adjacent distance between convex portions was 250 nm, and the convex height was 250 nm.

The obtained soda sheet glass with the fine concavo-convex structure formed was cut into 30 mm squares arbitrarily to be evaluation samples, and using the spectrophotometer (made by Shimadzu Corporation, UV-2450 large sample chamber (MPC-2200 installation model)), measured were transmittance in an arbitrary wavelength region, regular reflectance at an incident angle of 5°, and diffuse reflectance (including regular reflectance) at an incident angle of 8°.

Example 22

(a) Mold Preparation Process

Quartz glass was used as a substrate of the cylindrical master mold, and a fine concavo-convex structure was formed on the surface of the quartz glass, by the direct-drawing lithography method using a semiconductor laser. The surface of the quartz glass roll with the fine concavo-convex structure formed was coated with DURASURF HD-1101Z (made by Daikin Industries, Ltd.), heated at 60° C. for 1 hour, then left at room temperature for 24 hours, and fixed. Subsequently, the surface was cleaned three times using DURASURF HD-ZV (made by Daikin Industries, Ltd.), and mold release treatment was applied.

A PET film: A-4100 (made by Toyobo Co., Ltd.: width 300 mm, thickness 100 μm) was used as a substrate (transparent sheet), and NIAC 702 (made by Deicel Corporation) was used as a light curable resin. The light curable resin was coated on the substrate surface (an easy adhesion surface of the PET film) by Micro Gravure coating (made by Yasui Seiki Co., Ltd.) so that the coating film thickness was 6 μm.

Next, the substrate (PET film) coated with the light curable resin was pressed against the cylindrical master mold with a nip roll (0.1 MPa), was irradiated with ultraviolet rays at a temperature of 25° C. and moisture of 60% under atmospheric pressure, using the UV exposure apparatus (Fusion UV Systems Japan Co., Ltd., H bulb) so that the integral amount of exposure below the center of the lamp was 600 mJ/cm$^2$, and light cross-linking was performed continuously.

After light cross-linking, a protective film (polyethylene film: thickness 20 μm) was laminated, the fine concavo-convex structure was protected, and was reeled off continuously, and the reel-shaped resin mold was prepared.

(b) Inorganic Layer Formation Process

The sol-gel material (TGA-FPA, made by APOLLORINK Inc.) was coated on a cover film (polyethylene film: thickness 20 μm) by Gravure coating so that the film thickness was 3 μm.

(g) Cover Film Layering Process

Subsequently, drying was performed on conditions of 80° C. and 10 minutes, and then, the cover film and the reel-shaped resin mold were laminated by the laminate method.

(c) Preliminary Hardening Process

The laminated film was partially hardened again in an oven under a nitrogen atmosphere on conditions of 80° C. and 12 hours.

(d) Layering Process

The laminated sol-gel material and reel-shaped resin mold were cut into a 300 mm square, then the cover film was peeled off, and the resultant was layered on both surfaces of soda sheet glass of the same dimensions coated with a two-part epoxy adhesive (epoxy-thiol system).

(e) Transfer Process

Next, the laminate was immersed in toluene at room temperature for 5 minutes, and the substrate (PET film) and the light curable resin were peeled off from the soda sheet glass.

(f) Hardening Process

The soda sheet glass from which the reel-shaped resin mold was peeled off was completely hardened in an oven under a nitrogen atmosphere on conditions of 300° C. and 1 hour, and the fine-structure product was prepared. As a result of checking the shape of the fine concavo-convex structure on the surface of the fine-structure product by scanning electron microscope observation, the distance between adjacent convex portions was 250 nm, and the convex height was 250 nm.

The obtained soda sheet glass with the fine concavo-convex structure formed was cut into 30 mm squares arbitrarily to be evaluation samples, and using the spectrophotometer (UV-2450 large sample chamber (MPC-2200 installation model), made by Shimadzu Corporation), measured were transmittance in an arbitrary wavelength region, regular reflectance at an incident angle of 5°, and diffuse reflectance (including regular reflectance) at an incident angle of 8°. Results are shown in following Table 9.

TABLE 9

|  | EXAMPLE 19 | EXAMPLE 20 | EXAMPLE 21 | EXAMPLE 22 |
|---|---|---|---|---|
| TRANSMITTANCE (%: @550 nm) | 96 | 96 | 96 | 99 |
| REGULAR REFLECTANCE (%: @550 nm) | 3 | 3 | 3 | 1 |
| DIFFUSE REFLECTANCE (%: @550 nm) | 3 | 3 | 3 | 1 |
| AREA OF THE OBTAINED FINE-STRUCTURE PRODUCT (m$^2$) | 0.09 | 0.09 | 0.09 | 0.09 |

As can be seen from Table 9, in Examples 19 to 22, it is possible to achieve fine-structure products excellent in transmittance, regular reflectance and diffuse reflectance. Further, in the conventional manufacturing method, the area of the fine-structure product is about $9\times10^{-4}$ m$^2$, but it is understood that it is possible to actualize significant increases in the area of the fine-structure product in Examples 19 to 22.

INDUSTRIAL APPLICABILITY

The present invention has the effects capable of achieving the fine-structure layered products that enable the fine concavo-convex structure excellent in environmental resistance, weather resistance and long-term stability to be formed with a large area and high productivity, and particularly, enables the fine-structure layered products of a large area excellent in environmental resistance, weather resistance, long-term stability and productivity to be actualized.

The present invention has the effects that productivity is high and that the large area is made possible in the manufacturing method of the fine-structure product having the fine concavo-convex structure on the surface excellent in environmental resistance, weather resistance and long-term stability, and is particularly useful in manufacturing of fine-structure products used for members of solar batteries, lighting members such as organic EL and LED, and optical members of display devices such as organic EL displays and liquid crystal displays.

The present application is based on Japanese Patent Application No. 2010-274605 filed on Dec. 9, 2010, Japanese Patent Application No. 2010-274606 filed on Dec. 9, 2010, Japanese Patent Application No. 2010-274935 filed on Dec. 9, 2010, Japanese Patent Application No. 2010-282061 filed on Dec. 17, 2010, and Japanese Patent Application No. 2011-004869 filed on Jan. 13, 2011, entire contents of which are expressly incorporated by reference herein.

The invention claimed is:
1. A fine-structure layered product comprising:
a substrate;
a resin layer that is formed on one main surface of the substrate and that has a fine concavo-convex structure on a surface thereof; and
an inorganic layer that is provided on the fine concavo-convex structure of the resin layer, that contains a sol-gel material and that has a fine concavo-convex structure in a shape associated with the fine concavo-convex structure of the resin layer, wherein a fluorine element concentration (Es) in a region on the inorganic layer side of the resin layer is higher than an average fluorine concentration (Eb) in the resin layer.

2. The fine-structure layered product according to claim 1, wherein the inorganic layer contains a hardened material of a sol-gel material.

3. The fine-structure layered product according to claim 1, wherein the inorganic layer contains a semi-hardened sol-gel material.

4. The fine-structure layered product according to claim 1, wherein the inorganic layer contains a hardened material of a sol-gel material and an unhardened sol-gel material.

5. The fine-structure layered product according to claim 2, wherein the inorganic layer contains functional fine particles.

6. The fine-structure layered product according to claim 4, wherein the unhardened so-gel material contains a partially hardened material of a sol-gel material.

7. The fine-structure layered product according to claim 1, wherein the inorganic layer contains a mixture of inorganic fine particles, binder polymer and a sol-gel material.

8. The fine-structure layered product according to claim 7, wherein the binder polymer is a hardened material of a photo-curable mixture.

9. The fine-structure layered product according to claim 7, wherein as the sol-gel material, a partially hardened material of a sol-gel material is included.

10. The fine-structure layered product according to claim 1, wherein a ratio between the fluorine element concentration (Es) in the region on the inorganic layer side of the resin layer and the average fluorine concentration (Eb) in the resin layer meets following equation (1)

$$1 < Es/Eb \leq 30{,}000 \qquad \text{Eq. (1).}$$

11. The fine-structure layered product according to claim 1, wherein a ratio between the fluorine element concentration (Es) in the region on the inorganic layer side of the resin layer and the average fluorine concentration (Eb) in the resin layer meets following equation (2)

$$20 \leq Es/Eb \leq 240 \qquad \text{Eq. (2).}$$

12. The fine-structure layered product according to claim 1, wherein the resin layer contains a hardened material of a photo-curable mixture formed by UV nanoimprint.

13. The fine-structure layered product according to claim 1, wherein the resin layer contains (meth)acrylate, fluorine-containing (meth)acrylate and a photoinitiator.

14. The fine-structure layered product according to claim 13, wherein the fluorine-containing (meth)acrylate is expressed by following general formula (1)

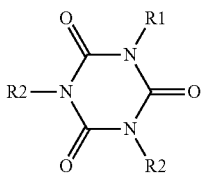

Formula (1)

wherein R1 represents following chemical formula (2) and R2 represents following general formula (3):

wherein n is an integer of from 1 to 6;

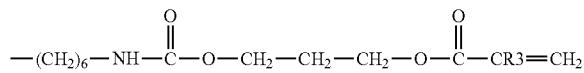

Formula (3)

wherein R3 is H or $CH_3$.

15. The fine-structure layered product according to claim 13, wherein the resin layer contains 0.01 part by weight to 50 parts by weight of the fluorine-containing (meth)acrylate and 0.01 part by weight to 10 parts by weight of the photoinitiator relative to 100 parts by weight of the (meth)acrylate.

16. The fine-structure layered product according to claim 1, wherein the inorganic layer contains at least one kind of metal alkoxide, a hardened material of metal alkoxide, and a semi-hardened material of metal alkoxide.

17. The fine-structure layered product according to claim 1, wherein the fine concavo-convex structure is in the shape of pillars including a plurality of convex portions in the shape of a cone, the shape of a pyramid or the shape of an elliptic cone, or in the shape of holes including a plurality of concave portions in the shape of a cone, the shape of a pyramid or the shape of an elliptic cone, a distance between convex portions ranges from 1 nm to 2,000 nm, and a height of the convex portion ranges from 1 nm to 5,000 nm.

18. The fine-structure layered product according to claim 1, wherein the product is in the shape of a reel.

19. The fine-structure layered product according to claim 1, further comprising:

a resin film on a surface on the side opposite to a surface having the fine concavo-convex structure of the inorganic layer.

20. The fine-structure layered product according to claim 1, further comprising:

an inorganic substrate on a surface on the side opposite to a surface having the fine concavo-convex structure of the inorganic layer.

21. The fine-structure layered product according to claim 1, wherein two long films or more having a thickness thicker than a thickness of the inorganic layer are spaced and disposed on a main surface on the side opposite to the one main surface of the substrate so that longitudinal directions of the films are substantially parallel with one another.

22. The fine-structure layered product according to claim 1, wherein two long films or more having a thickness thicker than a thickness of the inorganic layer are spaced and disposed on the fine concavo-convex structure of the resin layer so that longitudinal directions of the films are substantially parallel with one another.

Formula (2)

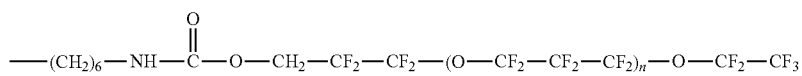

23. The fine-structure layered product according to claim 1, wherein two long films or more having a thickness thicker than a thickness of the inorganic layer are spaced and disposed on a surface of the inorganic layer so that longitudinal directions of the films are substantially parallel with one another.

* * * * *